United States Patent
Nishihara et al.

(10) Patent No.: US 7,573,354 B2
(45) Date of Patent: Aug. 11, 2009

(54) DUPLEXER AND LADDER TYPE FILTER

(75) Inventors: Tokihiro Nishihara, Kawasaki (JP); Shogo Inoue, Kawasaki (JP); Takashi Matsuda, Kawasaki (JP); Masanori Ueda, Kawasaki (JP); Masafumi Iwaki, Kawasaki (JP); Shinji Taniguchi, Kawasaki (JP); Go Endo, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 255 days.

(21) Appl. No.: 11/500,486

(22) Filed: Aug. 8, 2006

(65) Prior Publication Data
US 2007/0030096 A1 Feb. 8, 2007

(30) Foreign Application Priority Data
Aug. 8, 2005 (JP) .............................. 2005-229165
May 9, 2006 (JP) .............................. 2006-130662

(51) Int. Cl.
H03H 9/70 (2006.01)
H03H 9/72 (2006.01)
H03H 9/54 (2006.01)
H03H 9/64 (2006.01)

(52) U.S. Cl. .................. 333/133; 333/193; 333/195; 333/189

(58) Field of Classification Search ................. 333/133, 333/193, 195, 189
See application file for complete search history.

(56) References Cited

U.S. PATENT DOCUMENTS

| 5,682,126 | A | * | 10/1997 | Plesski et al. ............... 333/193 |
| 5,726,610 | A | * | 3/1998 | Allen et al. ................. 333/133 |
| 5,933,062 | A | * | 8/1999 | Kommrusch ................ 333/193 |
| 6,201,457 | B1 | * | 3/2001 | Hickernell ................... 333/193 |
| RE37,639 | E | * | 4/2002 | Ehara et al. ................. 333/193 |
| 6,747,530 | B1 | * | 6/2004 | Selmeier ..................... 333/193 |
| 6,995,631 | B2 | * | 2/2006 | Taniguchi ................... 333/133 |
| 7,034,638 | B2 | * | 4/2006 | Yamamoto et al. .......... 333/193 |
| 2003/0214369 | A1 | * | 11/2003 | Kearns ........................ 333/133 |
| 2004/0061572 | A1 | * | 4/2004 | Nakamura ................... 333/133 |

(Continued)

FOREIGN PATENT DOCUMENTS

JP 9-167937 A 6/1997

(Continued)

OTHER PUBLICATIONS

Machine translation of Noguchi et al. JP 2002-223147, Aug. 9, 2002.*

(Continued)

Primary Examiner—Barbara Summons
(74) Attorney, Agent, or Firm—Arent Fox LLP

(57) ABSTRACT

A duplexer includes an antenna terminal, a first filter connected to the antenna terminal, and a second filter connected to the antenna terminal. At least one of the first filter and the second filter is a ladder type filter in which a parallel resonator and multiple series resonators are included, one or more first inductors are respectively connected in parallel with one or more series resonators out of the multiple series resonators, and one of the one or more first inductors is connected in parallel with one of the multiple series resonators that is arranged closest to the antenna terminal.

34 Claims, 41 Drawing Sheets

U.S. PATENT DOCUMENTS

| | | | |
|---|---|---|---|
| 2004/0119561 A1* | 6/2004 | Omote | 333/133 |
| 2004/0130410 A1* | 7/2004 | Nishimura et al. | 333/133 |
| 2004/0155730 A1* | 8/2004 | Iwamoto et al. | 333/193 |
| 2004/0212451 A1* | 10/2004 | Iwamoto et al. | 333/133 |
| 2006/0028298 A1* | 2/2006 | Nakamura et al. | 333/133 |

FOREIGN PATENT DOCUMENTS

| | | | |
|---|---|---|---|
| JP | 10-313229 A | | 11/1998 |
| JP | 2002-223147 A | | 8/2002 |
| JP | 2003-069382 | * | 3/2003 |
| JP | 2003-332885 A | | 11/2003 |
| JP | 2003-347896 | * | 12/2003 |
| JP | 2004-13532 A | | 4/2004 |
| JP | 2004-140738 | * | 5/2004 |
| JP | 2004-173245 A | | 6/2004 |
| JP | 2004-242281 | | 8/2004 |

OTHER PUBLICATIONS

C.W. Seabury et al.; "Thin Film ZnO Based Bulk Acoustic Mode Filters"; 1997 IEEE Microwave Symposium Digest; vol. 1, pp. 181-184, Jun. 8-13, 1997.*

* cited by examiner

-- PRIOR ART --

FIG. 10A    S11    Ant SIDE
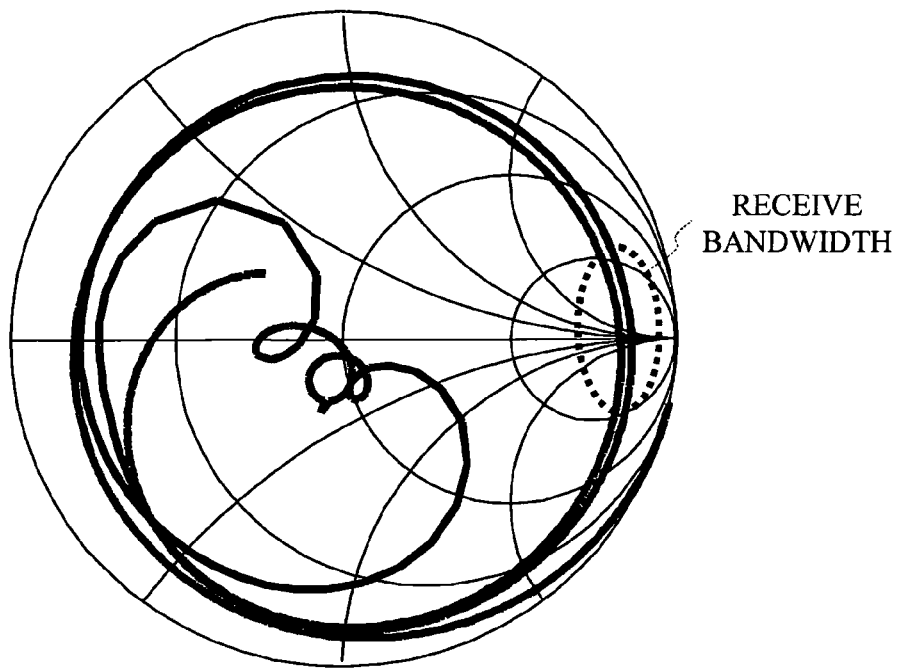
RECEIVE BANDWIDTH
FIG. 10B    S22    Tx SIDE
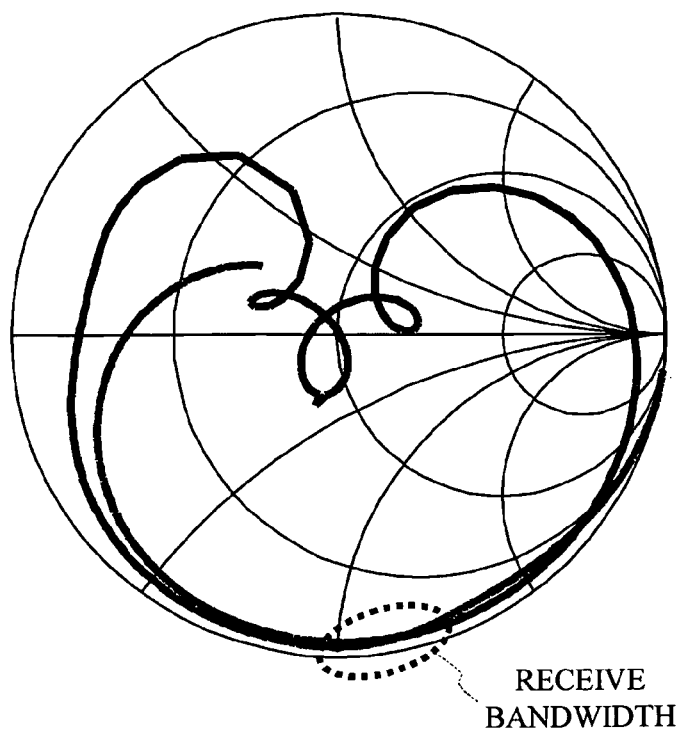
RECEIVE BANDWIDTH FREQUENCY (MHz)
TRANSMIT FILTER FREQUENCY (MHz)
RECEIVE FILTER

- - - - - SINGULAR FILTER
———— FIRST EMBODIMNET
■ ■ ■ ■ ■ COMPARATIVE EXAMPLE 1

CIRCUIT A

CIRCUIT B

FREQUENCY (MHz)

FILTER A

FILTER B

FILTER C

CIRCUIT C

CIRCUIT D

FILTER D

FILTER E

FILTER F

FILTER G

FILTER H

FILTER I

DUPLEXER a
FIG. 42A
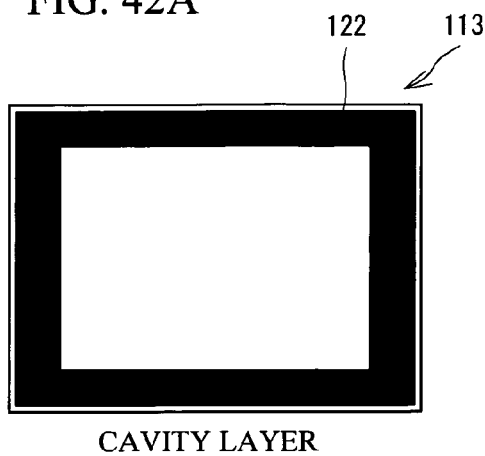
CAVITY LAYER
FIG. 42B
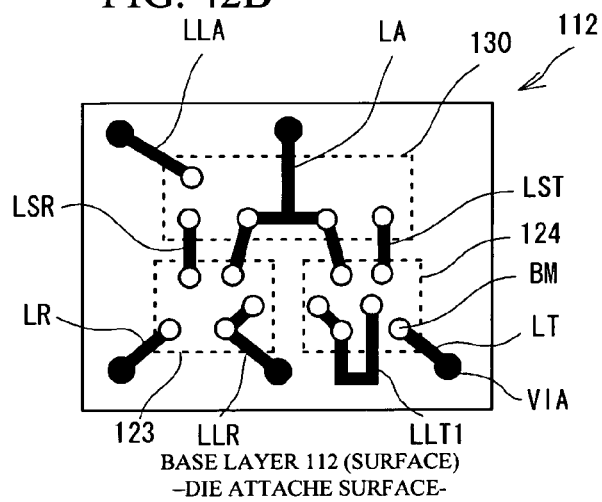
BASE LAYER 112 (SURFACE)
–DIE ATTACHE SURFACE–
FIG. 42C
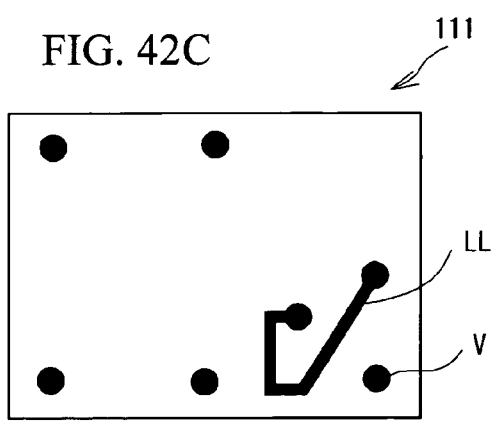
BASE LAYER 112 (SURFACE)
FIG. 42D
BASE LAYER 111 (SURFACE)

DUPLEXER b

BASE LAYER 112 (SURFACE)

BASE LAYER 111 (SURFACE)

DUPLEXER AND LADDER TYPE FILTER

BACKGROUND OF THE INVENTION

1. Field of the Invention

This invention generally relates to duplexers and ladder type filters, and more particularly, to a duplexer and a ladder type filter in which an inductor is connected in series with a parallel resonator or an inductor is connected in parallel with a series resonator.

2. Description of the Related Art

In recent years, mobile telephones and mobile information terminals have become widespread rapidly, with the advancements of mobile communications systems. For example, the mobile telephone terminals communicate at high-frequency bands such as 800 MHz to 1.0 GHz and 1.5 GHz to 2.0 GHz. A device for the mobile communication system often employs a high-frequency filter having a resonator or antenna duplexer having the high-frequency filter.

As a resonator for use in the afore-mentioned filter, there are Surface Acoustic Wave (SAW) Resonator and Film Bulk Acoustic Resonator (FBAR). The configuration of the above-described resonators will be described. FIG. 1A is a cross-sectional view of an FBAR. On a cavity 58 in a substrate 50 (an example is a silicon substrate), there are deposited: a lower electrode film 52; a piezoelectric film 54; and an upper electrode film 56. Aluminum nitride, for example is used for the piezoelectric film 54. FIG. 1B is another cross-sectional view of the FBAR. On the substrate 50, there is formed an acoustic multilayer film in which high acoustic impedance layers 62 and low impedance layers 60 are alternately deposited. There are also deposited thereon: the lower electrode film 52; the piezoelectric film 54; and the upper electrode film 56.

FIG. 2 is a top view of a SAW resonator. On a piezoelectric substrate 70, there are provided: comb-like electrodes (also known as Interdigital Transducer: IDT) connected between an input terminal In and an output terminal Out; and reflectors R0 arranged at both sides of the IDT. The IDT and the reflectors R0 are made of a metal, for example, such as aluminum (Al) or the like. Here, in the drawing, the number of the electrode fingers of the reflectors R0 and those of the IDT are shown smaller than the actual one.

A ladder type filter, in which one-port resonators are connected in series and in parallel, is used for a high-frequency filter. FIG. 3 shows a configuration of the ladder type filer. Between the input terminal In and the output terminal Out, series resonators S1, S2, and S3 are connected in series and parallel resonators P1 and P2 are connected in parallel. Referring to FIG. 4A through FIG. 5B, the operation principle of the ladder type filter will be described. The ladder type filter can be separated into series resonators and parallel resonators. Referring to FIG. 4A, in a series resonator, assuming that a resonator S21 is a one-port resonator, one of two signal terminals is set to the input terminal In and the other terminal is set to the output terminal Out. Referring to FIG. 4B, in a parallel resonator, assuming that a resonator P21 is a one-port resonator, one of the two signal terminals is connected to a ground terminal and the other terminal is connected to a short-circuit line.

FIG. 4C shows passband characteristic from the input terminal In to the output terminal Out of the series resonator and parallel resonator. The horizontal axis represents frequency, and the vertical axis represents band-pass amount. The passband characteristic of the series resonator is indicated by a solid line, and that of the parallel resonator is indicated by a dashed line. The passband characteristic of the series resonator has one resonance point (resonance frequency) $f_{rs}$ and one antiresonance point (antiresonance frequency) $f_{as}$. The band-pass amount is the highest at the one resonance point $f_{rs}$, and is the lowest at the one antiresonance point $f_{as}$. On the other hand, the passband characteristic of the parallel resonator includes one resonance point $f_{rp}$ and one antiresonance point $f_{ap}$. The band-pass amount becomes the lowest at the one resonance point $f_{rp}$, and becomes the highest at the one antiresonance point $f_{ap}$.

FIG. 5A shows a structure of a one-stage ladder type filter. Referring to FIG. 5A, a series resonator S22 is connected in series between the input terminal In and the output terminal Out, and a parallel resonator P22 is connected between the output terminal Out and ground. At this point, it is designed that the resonance point $f_{rs}$ of the series resonator is substantially identical to the antiresonance point $f_{ap}$ of the parallel resonator. FIG. 5B shows passband characteristic from the input terminal In to the output terminal Out of the one-stage ladder type filter. The horizontal axis represents frequency, and the vertical axis represents band-pass amount. With the structure shown in FIG. 5A, the passband characteristic of the series resonator S22 and that of the parallel resonator P22 are combined, and the passband characteristic of FIG. 5B is obtainable. The band-pass amount is the highest around the resonance point $f_{rs}$ of the series resonator and the antiresonance point $f_{ap}$ of the parallel resonator, and is the lowest at the antiresonance point $f_{as}$ of the series resonator and the resonance point $f_{rp}$ of the parallel resonator. The passband is a frequency range that ranges from the resonance point $f_{rp}$ of the parallel resonator to the antiresonance point $f_{as}$ of the series resonator, and the attenuation range is the frequency range equal to or lower than the resonance point $f_{rp}$ of the parallel resonator and equal to or higher than the antiresonance point $f_{as}$ of the series resonator. In this manner, the ladder type filer functions as a band-pass filter.

There has been proposed a duplexer with the use of a filter having the above-described resonators. The duplexer employs two band-pass filters to arrange a transmit filter between the transmitting terminal and the antenna terminal and arrange a receive filter between the receiving terminal and the antenna terminal. A matching circuit (an example is a phase shifter) is also arranged between the antenna terminal and the transmit filter or between the antenna terminal and the receive filter. The duplexer has functions of outputting a transmitting signal supplied from the transmitting terminal, from the antenna terminal, and outputting a received signal supplied from the antenna terminal, from the receiving terminal.

A description is given of the functions of the matching circuit in a case, for example, where the matching circuit is arranged between the antenna terminal and the receive filter. The matching circuit is used for increasing the impedance of the receive filter as much as possible in the frequency range of the transmitting signal, when viewed from the antenna terminal. This can prevent the power of the transmitting signal supplied from the transmit terminal from entering the receive filter.

In the duplexer for use in the transmit filter, for example, it is necessary to reduce the insertion loss while the transmitting signal is passing from the transmitting terminal to the antenna terminal, and it is also necessary to ensure the attenuation in the passband of the receive filter. It is similar in the duplexer for use in the receive filter. In order to realize a high-performance duplexer, the ladder type filter is employed. The ladder type filter is capable of widening the passband at a relatively low insertion loss, easily obtaining a high attenuation around the passband, and having high power durability. However, higher performance is increasingly demanded for the duplexer. Accordingly, there have been disclosed the following techniques to fulfill the demands for the lower insertion loss and higher attenuation.

FIG. 6A shows a configuration of the filter of conventional technique 1 disclosed in FIG. 12 of Japanese Patent Application Publication No. 09-167939 (hereinafter, referred to as Document 1). In the ladder type filter that includes the series resonators S1 through S3 and the parallel resonators P1 and P2, an inductor L3 is connected in parallel with the series resonator S3 arranged on the side of the output terminal Out. This can increase the out-of-band attenuation on the high-frequency side.

FIG. 6B shows a configuration of the filter of conventional technique 2 disclosed in FIG. 3 of Japanese Patent Application Publication No. 2004-135322 (hereinafter, referred to as Document 2). In the ladder type filter that includes the series resonators S1 and S2 and the parallel resonator P1, the inductors L1 and L2 are respectively connected in parallel with the series resonators S1 and S2, and an inductor LP1 is connected between the parallel resonator P1 and ground. The resonance point and antiresonance point can be adjusted according to the inductances of the inductors L1 and L2.

FIG. 7 shows a configuration of the filter of conventional technique 3 disclosed in FIG. 1 of Japanese Patent Application Publication No. 2003-332885 (hereinafter, referred to as Document 3). The duplexer includes a transmit filter 10b (ladder type filter) having the series resonators S1 through S3 and the parallel resonators P1 and P2 between an antenna terminal Ant and a transmitting terminal Tx. The duplexer also includes a receive filter 20b (ladder type filter) having the series resonators S1' through S3' and the parallel resonators P1' and P2' between the antenna terminal Ant and a receiving terminal Rx. The duplexer further includes a matching circuit 30 having a capacitor C01 and an inductor L01 arranged among the transmit filter 10b, the receive filter 20b, and the antenna terminal Ant. In addition, an inductor L3 is connected in parallel with the series resonator S3 on the side of the transmitting terminal Tx of the transmit filter 10b, and an inductor L2' is connected in parallel with the series resonator S2' arranged in the middle of the receive filter 20b. As stated, in the conventional technique 3, inductors are respectively connected in parallel with the resonators, which are different from those arranged on the side of the transmit filter 10b or the receive filter 20b. In this manner, the excellent loss and out-of-band attenuation are retained.

A description is given of the ladder type filter of conventional technique 4 disclosed in FIG. 2 of Japanese Patent Application Publication No. 2004-173245 (hereinafter, referred to as Document 4). According to FIG. 2 of Document 4, a first inductor L1 is connected in series with a parallel resonator 5, and a second inductor L2 is connected in parallel with a series resonator 7. The resonance point of the parallel resonator 5 is shifted to a lower side since the first inductor L1 is connected in series with the parallel resonator 5, and the antiresonance point is produced at a lower side of the resonance point of the series resonator 7 since the second inductor L2 is connected in parallel with the series resonator 7. The afore-described resonance point and the afore-described antiresonance point are designed to be substantially matched. This increases, in particular, the attenuation in the stopband at a lower side, which is the opposite side of the passband.

A description is given of the ladder type filter of conventional technique 5 disclosed in FIG. 6 of Japanese Patent Application Publication No. 2002-223147 (hereinafter, referred to as Document 5). According to FIG. 6 of Document 5, an inductor is connected in series with the series resonator, and another inductor is connected in parallel with the series resonator. Two parallel resonators are commonly connected on the side of ground, and then the inductor (for attenuation pole L) is connected in series with ground. In this manner, the frequency of the attenuation pole around the passband is adjusted.

A description is given of the ladder type filter of conventional technique 6 disclosed in FIG. 2 of Japanese Patent Application Publication No. 10-313229 (hereinafter, referred to as Document 6). According to FIG. 2 of Document 6, there is disclosed the duplexer where an inductor Lp for matching is connected between the common terminal Ant and ground.

It is to be noted that in conventional technique 1, however, there is no consideration of the characteristic of a duplexer that includes a filter, and there are no specific measures to improve the characteristic of the duplexer. In conventional technique 2, the inductors are connected in parallel with all the series resonators, and the inductors are connected between all the parallel resonators and ground. When the duplexer is composed with such configuration, the attenuation can be increased in the opposite bandwidth (for example, the receive bandwidth of the transmit filter). However, the attenuation will be degraded drastically in a wide bandwidth. In the conventional technique 3, the inductor connected in parallel with the series resonator is capable of increasing the attenuation of the opposite bandwidths of the filters 10b and 20b. However, the matching circuit 30 is necessary on the side of the antenna terminal Ant of a transmit filter 10b or a receive filter 20b. In such technique, two elements of the inductor L01 and the capacitor C01 are used, thereby making it difficult to reduce the mounting area, in other words, difficult to downsize the duplexer.

In Wideband Code Division Multiple Access (W-CDMA)/Universal Mobile Telecommunications System (UMTS), the market is rapidly expanding and there is a demand for a duplexer of a lower loss, higher isolation, and higher attenuation in a wide band in both transmit and receive bandwidths than those of the conventional duplexers. In such system, there are characteristics that the transmit bandwidth ranges from 1920 MHz to 1980 MHz, the receive bandwidth ranges from 2110 MHz to 2170 MHz, and there is a wide gap between the transmit bandwidth and the receive bandwidth, whereas there is a narrow gap, only 20 MHz, between the transmit bandwidth and the receive bandwidth, for example, in PCS system (the transmit bandwidth ranges from 1850 MHz to 1910 MHz and the receive bandwidth ranges from 1930 MHz to 1990 MHz) or in Cellular system (the transmit bandwidth ranges from 824 MHz to 849 MHz and the receive bandwidth ranges from 869 MHz to 894 MHz).

In the conventional ladder type filters, however, the attenuation around the passband is easily obtainable with the use of the attenuation pole of resonance in the parallel resonator or that of the antiresonance in the series resonator, as described above. Meanwhile, in W-CDMA/UMTS system, it is difficult to obtain the attenuation in the frequency range (the receive bandwidth of the transmit filter and the transmit bandwidth of the receive filter) widely apart from the passband.

The problems of the conventional techniques will be discussed in the following. In the conventional techniques 1 and 3, the inductor is connected in parallel with the series resonator. However, no inductor is connected to the parallel resonator and the attenuation pole of the resonance in the parallel resonator exists around the passband, thereby making it impossible to ensure the attenuation sufficiently in the frequency range widely apart from the passband.

In the conventional techniques 2 and 4, the circuit is configured such that the inductor is connected in parallel with the series resonator, and the inductor is connected in series with the parallel resonator. However, as shown in FIG. 3 of Document 2 or FIGS. 22 and 23 of Document 4, an inductor having a relatively large value is needed in order to produce the attenuation pole of the resonance to the frequency range widely apart from the passband in the circuit where the inductor is connected in series with one parallel resonator. For this reason, it is difficult to form the inductor with the use of a line pattern in a package in order to reduce the size of the package. Also, as shown in FIG. 23 of Document 4, in a case where there are two circuits, each of which includes the inductor connected in series with the parallel resonator, there are problems: downsizing is more difficult; and the characteristic is degraded due to the electromagnetic coupling between the two inductors.

In the conventional technique 5, as shown in FIG. 1 of Document 5, the ground sides of the two parallel resonators become common, and then the inductor for the attenuation pole is connected in series therewith. This produces an advantage of making the value of the inductor relatively small. Nevertheless, in the conventional technique 5, as described in paragraphs 0081 through 0091 of document 4, the attenuation pole generated by the connection of the inductor for the attenuation pole is widely deviated from the attenuation pole of the antiresonance generated by the inductor and the capacitor connected in parallel with the series resonator. Therefore, no improvement can be seen greatly in the attenuation in both the lower frequency side and the higher frequency side of the passband as shown in FIG. 10 or 11 of the conventional technique 5, when the characteristic of a case 1 where only the inductor for the attenuation pole is connected is compared with cases 2 and 3 where the inductor and capacitor are connected in parallel with the series resonator.

In the conventional techniques 1, 2, and 5, there is no consideration to the characteristic of the duplexer that includes two filters. Besides, there are no specific measures that improve the characteristic of the duplexer. In addition, in the circuits shown in the FIG. 3 of Document 2, FIGS. 22 and 23 of Document 4, and FIGS. 1 and 6 of Document 5, the inductors are connected in parallel with all the series resonators, and the inductors are connected between all the parallel resonators and ground. With such configuration, it is possible to increase the attenuation in the stopband. However, the attenuation in a wide band is degraded drastically.

SUMMARY OF THE INVENTION

The present invention has been made in view of the above circumstances and provides a duplexer and a ladder type filter that enables a low loss, a high attenuation, and downsizing.

According to one aspect of the present invention, there is provided a duplexer including: an antenna terminal; a first filter connected to the antenna terminal; and a second filter connected to the antenna terminal. At least one of the first filter and the second filter is a ladder type filter in which a parallel resonator and multiple series resonators are included, one or more first inductors are respectively connected in parallel with one or more series resonators out of the multiple series resonators, and one of the one or more first inductors is connected in parallel with one of the multiple series resonators that is arranged closest to the antenna terminal.

According to another aspect of the present invention, there is provided a ladder type filter including: a parallel resonator; and multiple series resonators. One or more first inductors are respectively connected in parallel with one or more series resonators out of the multiple series resonators; one of the one or more first inductors is connected in parallel with one of the multiple series resonators that is arranged closest to the antenna terminal; and a second inductor is connected in series with the parallel resonator and ground.

According to another aspect of the present invention, there is provided a ladder type filter including: multiple parallel resonators; multiple series resonators; one or more first inductors respectively connected in parallel with one or more series resonators out of the multiple series resonators; and a second inductor connected in series between ground and ground sides of two or more parallel resonators commonly connected, out of the multiple parallel resonators. By providing the first inductors and the second inductor, the attenuation can be increased in the stopband with a low insertion loss. In addition, the second inductor is commonly connected to the two or more parallel resonators, thereby decreasing a desired value of the inductor for forming an attenuation pole in the stopband. This easily realizes downsizing and cost reduction. Further, the first inductors are connected one or more series resonators, thereby suppressing the degradation of attenuation in a wide passband.

According to another aspect of the present invention, there is provided a duplexer including two filters connected to a common terminal, and at least one of the two filters is a ladder type filter that includes: multiple parallel resonators; multiple series resonators; one or more first inductors respectively connected in parallel with one or more series resonators out of the multiple series resonators; and a second inductor connected in series between ground and ground sides of two or more parallel resonators commonly connected, out of the multiple parallel resonators.

According to another aspect of the present invention, there is provided a duplexer including: a transmit filter and a receive filter connected to a common terminal, and at least one of the transmit filter and the receive filter is a ladder type filter having a series resonator and a parallel resonator; an inductor connected between the parallel resonators and ground in the ladder type filer; a mounting portion mounting a chip where the series resonator and the parallel resonator of the ladder type filter are formed; a receive line provided in the mounting portion to connect the receive filter and a receiving terminal; a transmit line provided in the mounting portion to connect the transmit filter and a transmitting terminal; a common line provided in the mounting portion to connect the common terminal and the receive filter and the transmit filter; and an inductor line provided in the mounting portion to compose the inductor. The inductor line is provided between either the receive line or the transmit line and the common line. The electrostatic coupling and the bridging capacitance between the receive line and the transmit line can be reduced, thereby increasing the attenuation in the stopband.

BRIEF DESCRIPTION OF THE DRAWINGS

Preferred exemplary embodiments of the present invention will be described in detail with reference to the following drawings, wherein:

FIG. 10A shows a reflection coefficient S11 on the side of an antenna terminal of the transmit filter in the duplexer in accordance with the first exemplary embodiment of the present invention;

FIG. 10B is a Smith Chart showing a reflection coefficient S22 on the side of a transmitting terminal;

FIG. 42A through FIG. 42D show respective layers in a stacked package of a duplexer a employed in the twelfth exemplary embodiment;

DESCRIPTION OF THE PREFERRED EMBODIMENTS

A description will now be given, with reference to the accompanying drawings, of exemplary embodiments of the present invention.

First Exemplary Embodiment

Figure 8A:
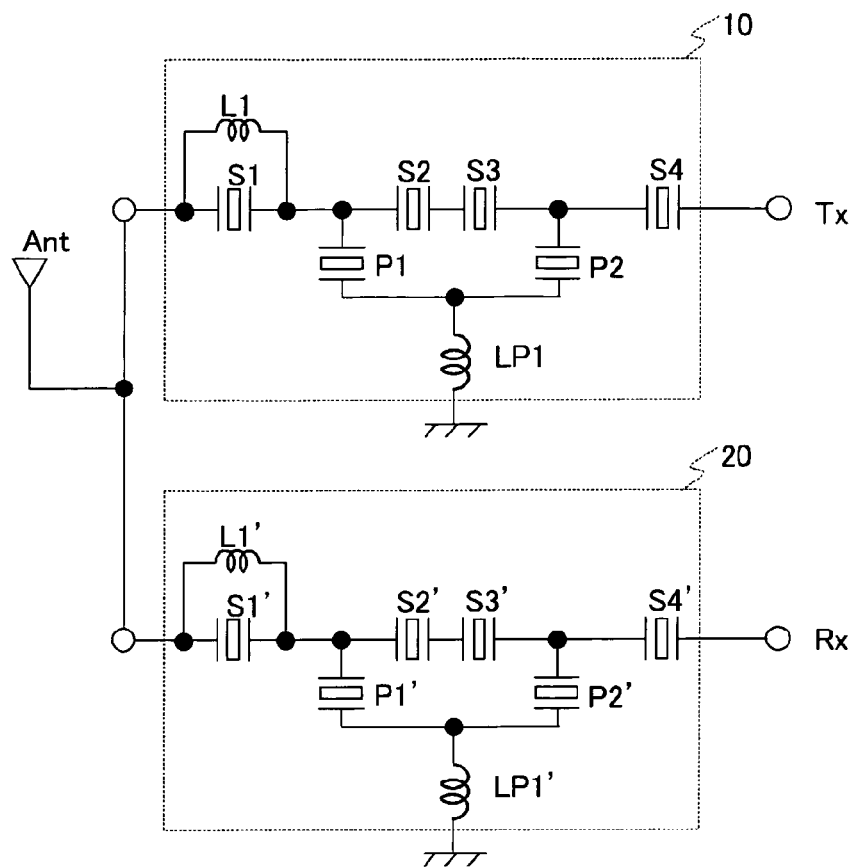
FIG. 8A shows a circuit configuration of the duplexer in accordance with a first exemplary embodiment of the present invention.

A first exemplary embodiment of the present invention is an example of a duplexer having the transmit bandwidth of 1920 MHz to 1980 MHz and the receive bandwidth of 2110 MHz to 2170 MHz. FIG. 8A shows a circuit configuration of the duplexer in accordance with the first exemplary embodiment of the present invention. In this duplexer, a transmit filter 10 (first filter) is connected between an antenna terminal Ant and a transmitting terminal Tx. Similarly, a receive filter 20 (second filter) is connected between the antenna terminal Ant and the receiving terminal Rx.

Figure 9:
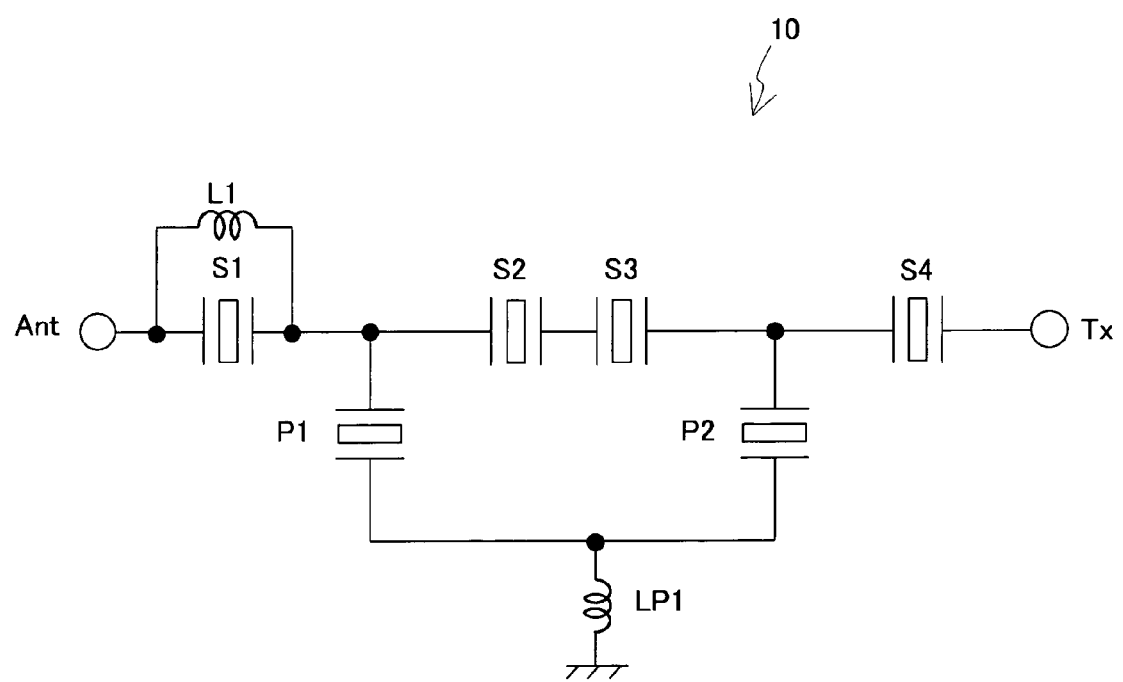
FIG. 9 shows a circuit configuration of a transmit filter in accordance with the first exemplary embodiment of the present invention.

FIG. 9 shows a circuit configuration of the transmit filter 10. Referring to FIG. 9, the transmit filter 10 is a ladder type filter that includes multiple series resonators S1 through S4 and parallel resonators P1 and P2. In addition, an inductor L1 is connected in parallel with the series resonator S1 arranged closest to the antenna terminal Ant. Further, an inductor LP1 is connected between the parallel resonators P1 and P2 and ground. Here, the capacitance values of the series resonators S1 through S4 are respectively set to 2.83 pF, the capacitance values of the parallel resonators P1 and P2 are respectively set to 1.14 pF, the inductance of the inductor L1 is set to 3.0 nH, and the inductance of the inductance LP1 is set to 1.55 nH. The inductances are determined so that the attenuation pole of the series resonator S1 and the inductor L1 and that of the parallel resonators P1 and P2 and the inductor LP1 can be obtained around the receive bandwidth (2110 MHz to 2170 MHz).

FIG. 10A is a view showing a reflection characteristic S11 when signals are supplied from the antenna terminal Ant of the filter employed in the first exemplary embodiment. FIG. 10B is a view showing a reflection characteristic S22 when the signals are supplied from the transmitting terminal Tx. Referring to FIG. 10A, the impedance viewed from the antenna terminal Ant is very high in the receive bandwidth (2110 MHz to 2170 MHz). On the other hand, the impedance viewed from the transmitting terminal Tx is low in the receive bandwidth.

Referring to FIG. 8A, the receive filter 20 is also a ladder type filter having a similar circuit configuration as that of the transmit filter 10. An inductor L1' is connected to a series resonator S1' on the side of the antenna terminal Ant, and an inductor LP1' is connected between series resonators P1' and P2' and ground. The capacitance values of the series resonators S1' through S4' are respectively set to 2.07 pF, the capacitance values of the parallel resonators P1' and P2' are respectively set to 1.87 pF, the inductance of the inductor L1' is set to 2.3 nH, and the inductance of the inductance LP1' is set to 0.55 nH. The inductances are determined so that the attenuation pole can be obtained around the transmit bandwidth (1920 MHz to 1980 MHz). The impedance viewed from the antenna terminal Ant is very high in the transmit bandwidth of the receive filter 20. On the other hand, the impedance viewed from the receiving terminal Rx is low in the transmit bandwidth.

Figure 8B:
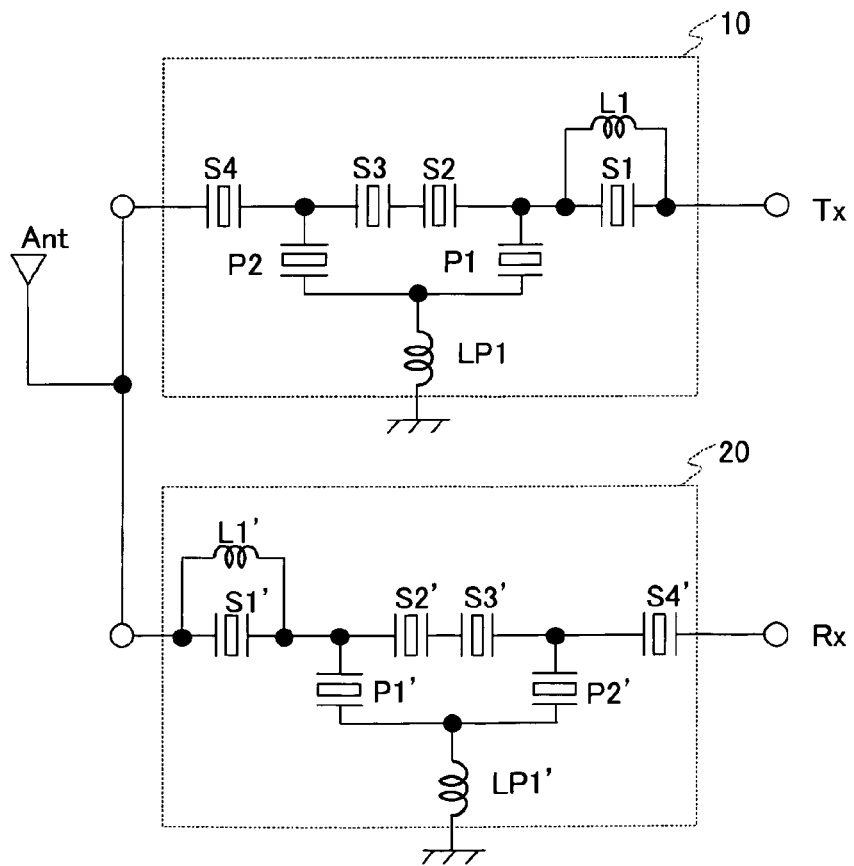
FIG. 8B shows a circuit configuration of the duplexer of comparative example 1.

FIG. 8B shows a circuit configuration of the duplexer of comparative example 1. In the duplexer of the comparative example 1, the transmit filter 10 of the duplexer employed in the first exemplary embodiment is connected in a reverse direction. That is to say, the inductor L1 connected in parallel with the series resonator S1 is connected on the side of the transmitting terminal Tx. In the comparative example 1, same components and configurations as those employed in the first embodiment have the same reference numerals and a detailed explanation will be omitted.

Figure 11A:
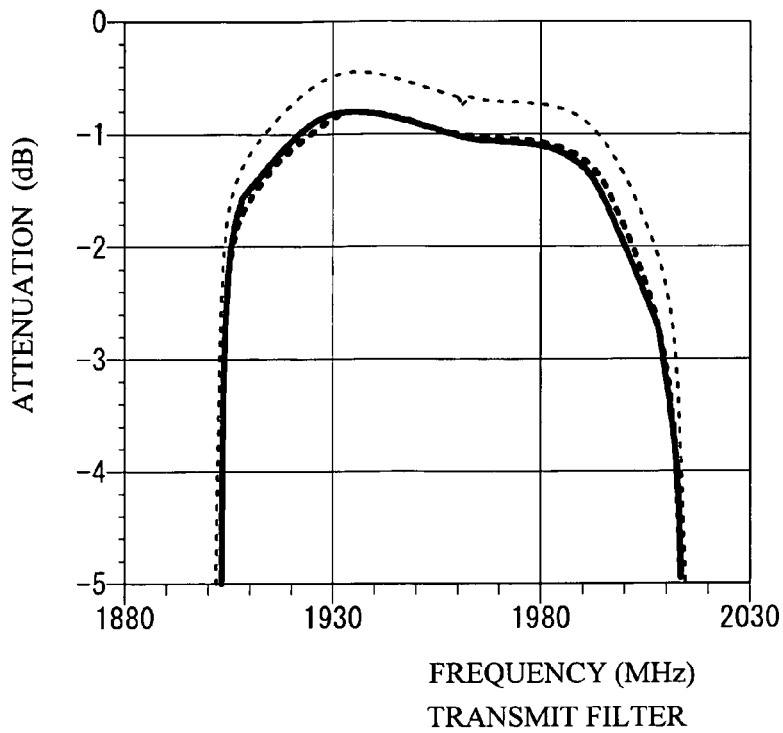
FIG. 11A is a view showing the passband characteristics of the transmit bandwidth of the transmit filter in the duplexer in accordance with the first exemplary embodiment of the present invention.
Figure 11B:
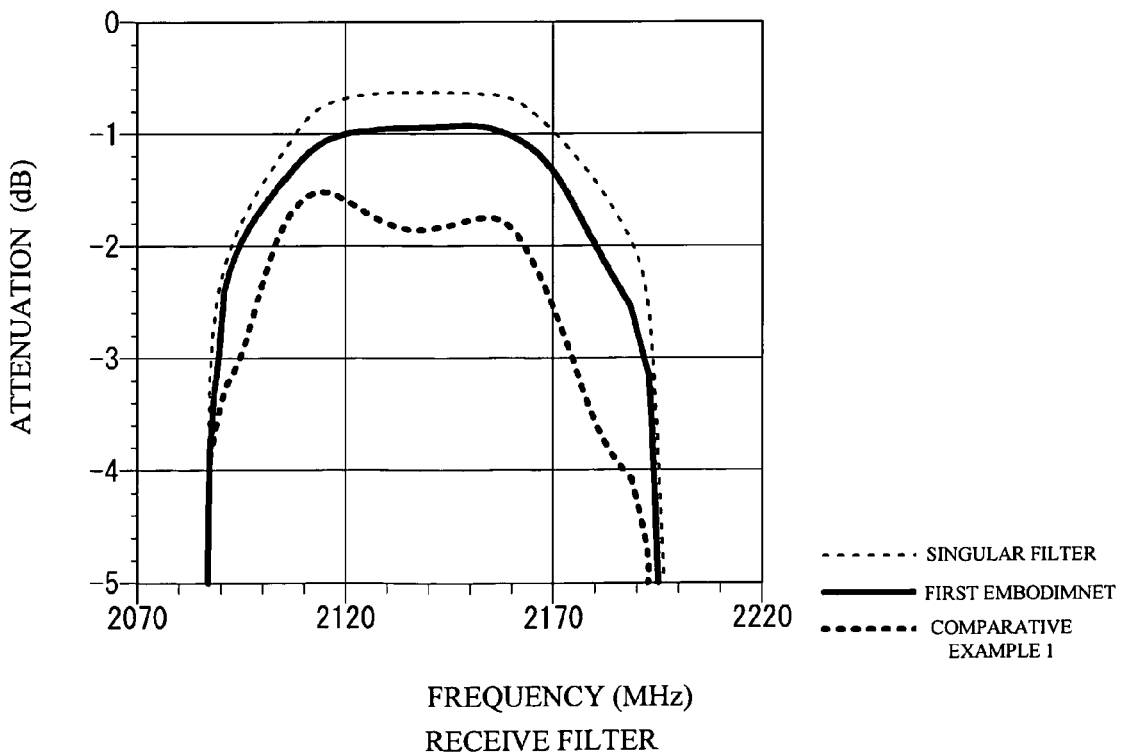
FIG. 11B is a view showing the passband characteristics of the receive bandwidth of the receive filter.

The passband characteristic of the duplexer employed in the first exemplary embodiment and that of the comparative example 1 have been examined. FIG. 11A is a view showing the passband characteristic of the transmit bandwidth of the transmit filter 10 in the duplexer in accordance with the first exemplary embodiment of the present invention. The horizontal axis represents frequency, and the vertical axis represents attenuation. In FIG. 11A, singular filter represents the passband characteristic of the singular transmit filter 10. FIG. 11B is a view showing the passband characteristic of the receive bandwidth of the receive filter 20. In FIG. 11B, the singular filter represents the passband characteristic of the singular receive filter 20.

Referring to FIG. 11A, although the transmit filter 10 of the duplexer employed in the first embodiment and that of the comparative example 1 have the insertion loss greater by approximately 0.4 dB than the singular transmit filter 10, the transmit filter 10 of the duplexer employed in the first embodiment and that the comparative example 1 have almost same insertion loss. Meanwhile, referring to FIG. 11B, the receive filter 20 of the duplexer employed in the first embodiment have the insertion loss greater by approximately 0.4 dB than the singular receive filter 20, and the receive filter 20 of the duplexer of the comparative example 1 have the insertion loss further greater by approximately 0.8 dB. The reason why the insertion loss is greater in the receive filter 20 of the comparative example 1 is that the signals input from the antenna terminal Ant are partially leaked to the transmit filter 10, since the impedance of the reflection characteristic from the antenna terminal Ant of the transmit filter 10 is low as shown in FIG. 10B. On the other hand, in the first exemplary embodiment, the impedance of the reflection characteristic from the antenna terminal Ant of the transmit filter 10 is very high as shown in FIG. 10A, thereby making it possible to prevent the signals input from the antennal terminal Ant from partially leaking into the transmit filter 10. Accordingly, the insertion loss can be reduced in the receive filter 20.

In the transmit filter 10 (first filter) and the receive filter 20 (second filter) of the duplexer employed in the first exemplary embodiment, the inductor L1 is connected in parallel with the series resonator S1, which is one of multiple series resonators S1 through S4, and the inductor L1 is connected in parallel with the series resonator S1 located closest to the antenna terminal Ant. In this manner, the insertion loss can be reduced in the receive bandwidth of the receive filter 20 (the opposite bandwidth of the opposite filter) by connecting the inductor L1 in parallel with the series resonator S1 in the transmit filter 10. This eliminates the necessity of a matching circuit, thereby reducing the mounting area and downsizing the duplexer. In the transmit filter 10, the attenuation pole (anti-resonance point) produced by the series resonator S1 and the inductor L1 is configured to be the receive bandwidth, thereby making the attenuation greater in the receive bandwidth of the transmit filter 10 (the opposite bandwidth on the own filter). In addition, in the transmit filter 10, the attenuation can be made greater on the lower frequency side than in the transmit bandwidth or in the receive bandwidth, by respectively connecting one or more inductors in parallel with one or more resonators out of the series resonators S1 through S4, as compared to the conventional technique 2 where the inductors are connected to all the series resonators. It is similar in the receive filter 20. In a case where the transmit bandwidth and the receive bandwidth are adjacent to each other as described in the first exemplary embodiment, the passband of the transmit filter and that of the receive filter are adjacent to each other and the skirts of the passbands of the respective filters partially overlap. Therefore, it is necessary to increase the attenuation in the opposite bandwidth of the own filter.

In the transmit filter 10 (first filter) and in the receive filter 20 (second filter) of the duplexer employed in the first exemplary embodiment, the inductor LP1 is connected in series between the parallel resonators P1 and P2 and ground. In addition, the attenuation pole produced by the parallel resonators P1 and P2 and the inductor LP1 is configured to be the receive bandwidth. This can further increase the attenuation in opposite bandwidth of the own filter.

The inductor LP1 connected in series with the parallel resonators P1 and P2. By providing one inductor between the parallel resonators and ground, the inductance value can be reduced to provide the attenuation pole in the receive (transmit) bandwidth. This can reduce the mounting area and further reduce the duplexer.

Second Exemplary Embodiment

A second exemplary embodiment is an example in which the capacitance value of the series resonator arranged closest to the antenna terminal Ant is set smaller than those of other series resonators in the transmit filter 10 and in the receive filter 20, in order to improve the insertion loss more than that obtained in the first exemplary embodiment. In the duplexer having the same configuration as that of the duplexer employed in the first exemplary embodiment, desirable relationship of the series resonators has been studied.

Figure 12:
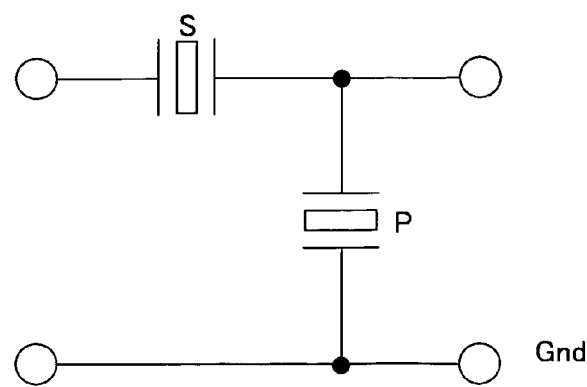
FIG. 12 shows a basic segment of the ladder type filter in which one series resonator and one parallel resonator are provided.
Figure 13A:
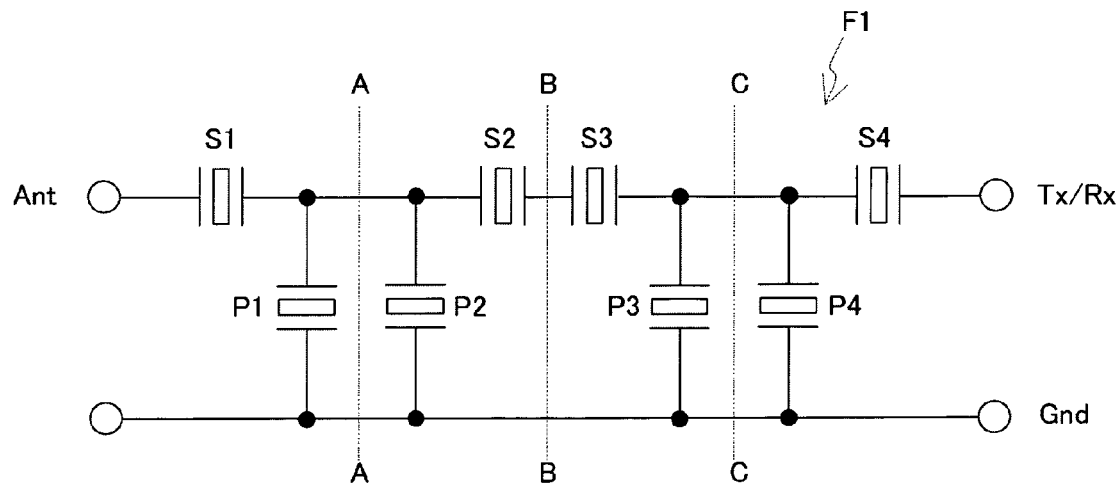
FIG. 13A shows a ladder type filter F1 in a mirror configuration.

Firstly, a description will now be given of the definition of the capacitance value of the series resonator in the ladder type filter. FIG. 12 shows a basic segment of the ladder type filter in which one series resonator S and one parallel resonator P are provided. FIG. 13A shows a ladder type filter F1, in which four basic segments of FIG. 12 are arranged between the antenna terminal Ant and the terminal Tx/Rx and connected in a mirror configuration such that image impedances of the segments are matched. The segments are indicated by dotted lines in FIG. 13A. The series resonators. S2 and S3, namely, two series resonators make a pair and are symmetrical with respect to a line B-B, unlike the series resonator S1 arranged closest to the antenna terminal Ant and the series resonator S4 closest to the terminal Tx/Rx. Two parallel resonators P1 and P2 make a pair and are symmetrical with respect to a line A-A. Similarly, parallel resonators P3 and P4 are symmetrical with respect to a line C-C.

Figure 13B:
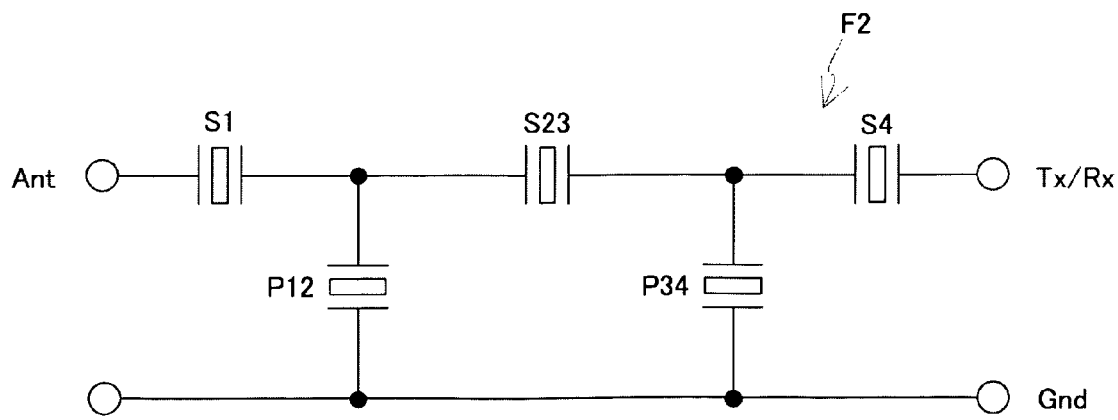
FIG. 13B shows a circuit configuration of a ladder type filter F2 in which resonators in the filter F1 are combined.

Meanwhile, one series resonator S1, one series resonator S23, one series resonator S4, one parallel resonator P12, and one parallel resonator P34 are connected in a ladder type filter F2 shown in FIG. 13B. The series resonator S23 of the filter F2 is a combination of the series resonators S2 and S3 of the filter F1, and the capacitance value of the series resonator S23 is a half of those of the series resonators S2 and S3. In a similar manner, the parallel resonator P12 is a combination of the parallel resonators P1 and P2, and the capacitance value of the parallel resonator P12 is a double of each of the parallel resonators P1 and p2. The parallel resonator P34 has a similar configuration of that of the parallel resonator P12. As stated, the filter F2 and the filter F1 are capable of obtaining the same characteristic.

In this manner, the circuit configuration of the ladder type filter can be represented by a mirror circuit configuration such as the filter F1. The capacitance value of the series resonator is represented by the capacitance value of the resonators connected in a mirror configuration. Referring to FIG. 13A, C1 denotes the capacitance value of the series resonator S1 arranged closest to the antenna terminal Ant, and C2 denotes the average value of the capacitance values of the remaining series resonators S2 through S4. Even if the number of the series resonators is different, C1 and C2 denote as described above. In the description hereafter, Ct1 denotes C1 of the transmit filter 10, Ct2 denotes C2 of the transmit filter 10, Cr1 denotes C1 of the receive filter 20, and Cr2 denotes C2 of the receive filter 20.

Figure 14A:
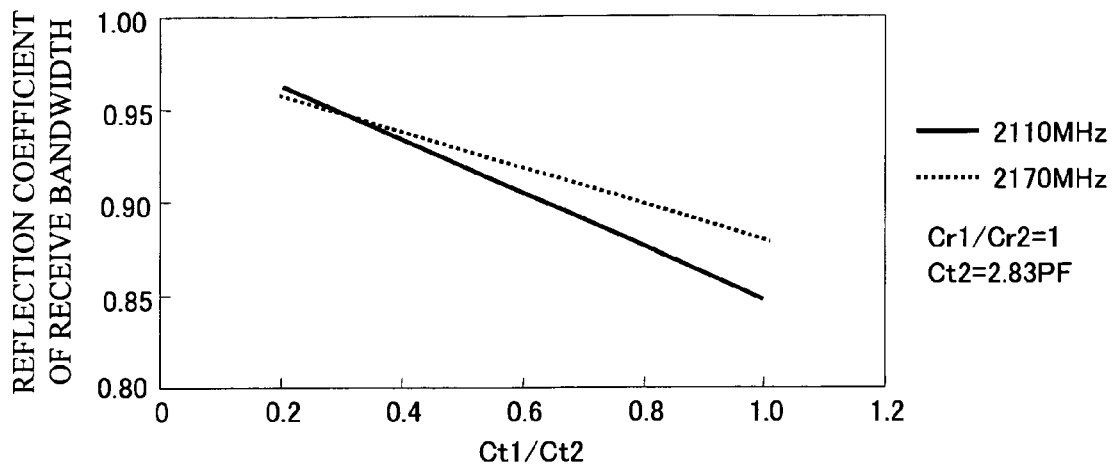
FIG. 14A is a view showing the reflection coefficient in the edges of the receive bandwidth of the transmit filter with respect to Ct1/Ct2.

FIG. 14A through FIG. 15B are views showing characteristics of the transmit filter 10 and the receive filter 20 in the duplexer having the same circuit configuration as that of the duplexer employed in the first exemplary embodiment, in a case where Cr1/Cr2 is set to 1 in the receive filter 20, Ct2 is set to 2.83 pF in the transmit filter 10, and the Ct 1 is varied. FIG. 14A is a view showing reflection coefficient in the edges of the receive bandwidth (2110 MHz and 2170 MHz) of the transmit filter 10 with respect to Ct1/Ct2. As Ct1/Ct2 becomes smaller, the reflection coefficient of the receive bandwidth (the opposite bandwidth of the own filter) in the transmit filter 10 is closer to 1. FIG. 14B is a view showing insertion loss in the edges of the receive bandwidth (2110 MHz and 2170 MHz) of the receive filter 20 with respect to Ct1/Ct2. As Ct1/Ct2 becomes smaller, the insertion loss is smaller in the receive bandwidth (the opposite bandwidth of the opposite filter) in the receive filter 20. This is because the reflection coefficient of the transmit filter 10 becomes greater as shown in FIG. 14A. FIG. 14C is a view showing the attenuation in the edges of the receive bandwidth (2110 MHz and 2170 MHz) of the transmit filter 10 with respect to Ct1/Ct2. As Ct1/Ct2 becomes smaller, the attenuation is greater in the receive bandwidth (the opposite bandwidth of the own filter) in the transmit filter 10. As described above, according to FIG. 14A through FIG. 14C, as Ct1/Ct2 becomes smaller, the characteristics of the duplexer are improved.

Figure 15A:
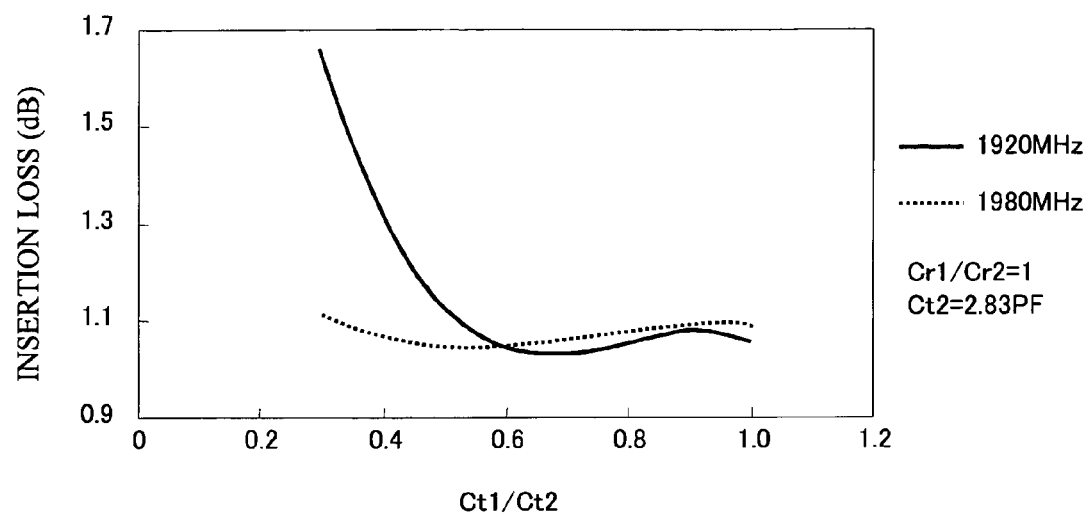
FIG. 15A is a view showing the attenuation in the edges of the transmit bandwidth of the transmit filter with respect to Ct1/Ct2.
Figure 15B:
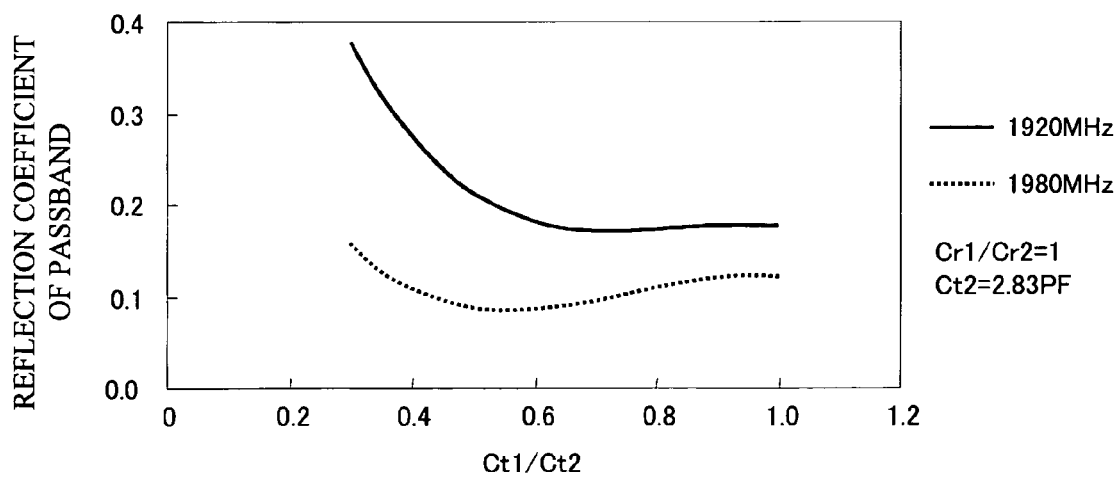
FIG. 15B is a view showing the reflection coefficient in the edges of the transmit bandwidth of the transmit filter with respect to Ct1/Ct2.

FIG. 15A is a view showing the insertion loss in the edges of the transmit bandwidth (1920 MHz and 1980 MHz) of the transmit filter 10 with respect to Ct1/Ct2. When Ct1/Ct2 becomes smaller than 0.5, the insertion loss is greater in the lower edge of the transmit bandwidth (the own bandwidth of the own filter) in the transmit filter 10. When Ct1/Ct2 becomes equal to or smaller than 0.3, the insertion loss is greatly increased. FIG. 15B is a view showing the reflection coefficient in the edges of the transmit bandwidth (1920 MHz and 1980 MHz) of the transmit filter 10 with respect to Ct1/Ct2. When Ct1/Ct2 becomes smaller than 0.5, the reflection coefficient is greater in the lower edge of the transmit bandwidth (the own bandwidth of the own filter) in the transmit filter 10. When Ct1/Ct2 becomes equal to or smaller than 0.3, the reflection coefficient is greatly increased. The reflection coefficient is greatly increased when Ct1/Ct2 is equal to or smaller than 0.3, because the matching is drastically degraded in the transmit filter 10.

Figure 14B:
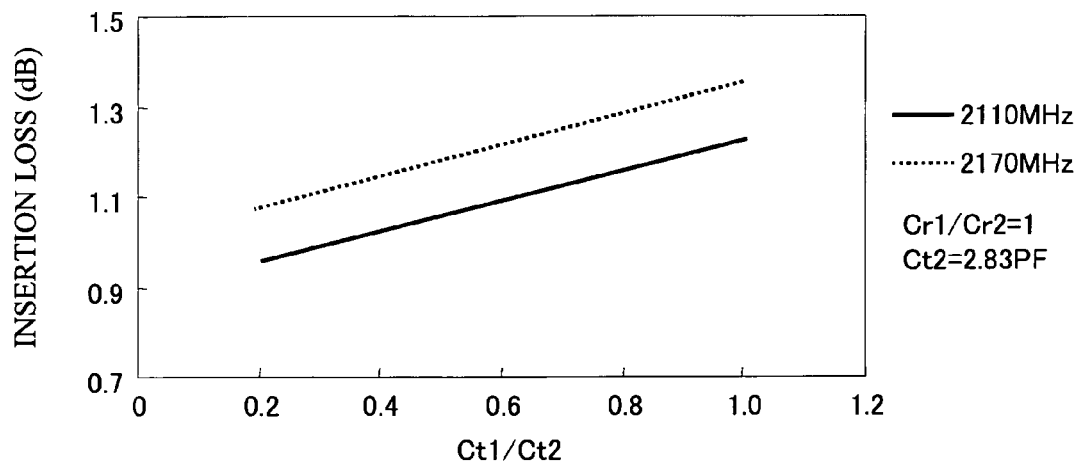
FIG. 14B is a view showing insertion loss in the edges of the receive bandwidth of the receive filter with respect to Ct1/Ct2.
Figure 14C:
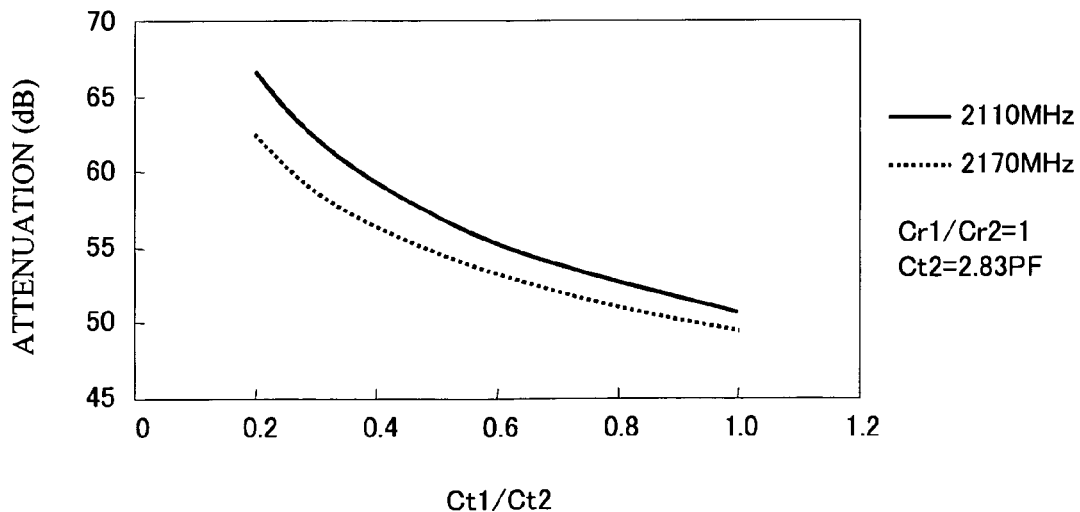
FIG. 14C is a view showing attenuation in the edges of the receive bandwidth of the transmit filter with respect to Ct1/Ct2.
Figure 16A:
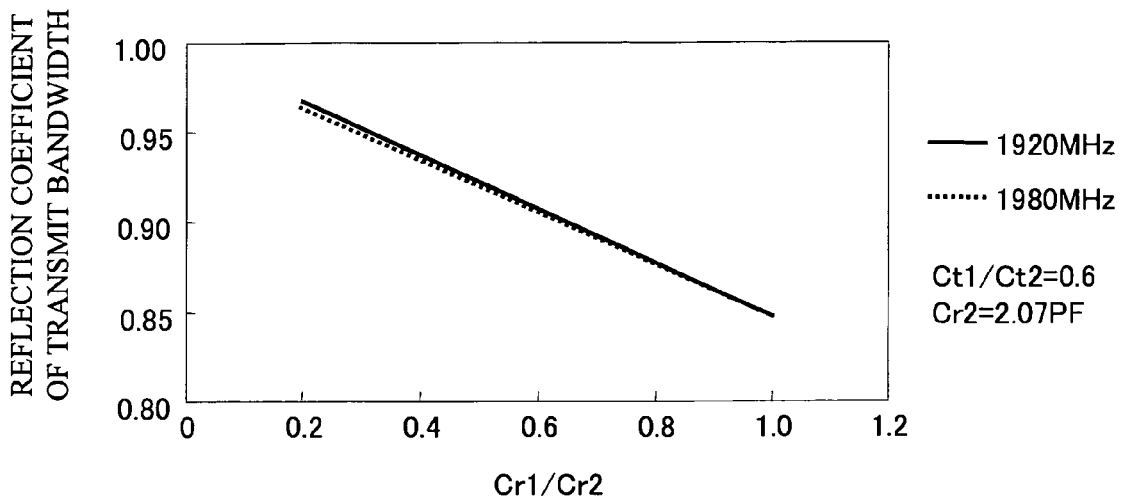
FIG. 16A is a view showing the reflection coefficient in the edges of the transmit bandwidth of the receive filter with respect to Cr1/Cr2.
Figure 16B:
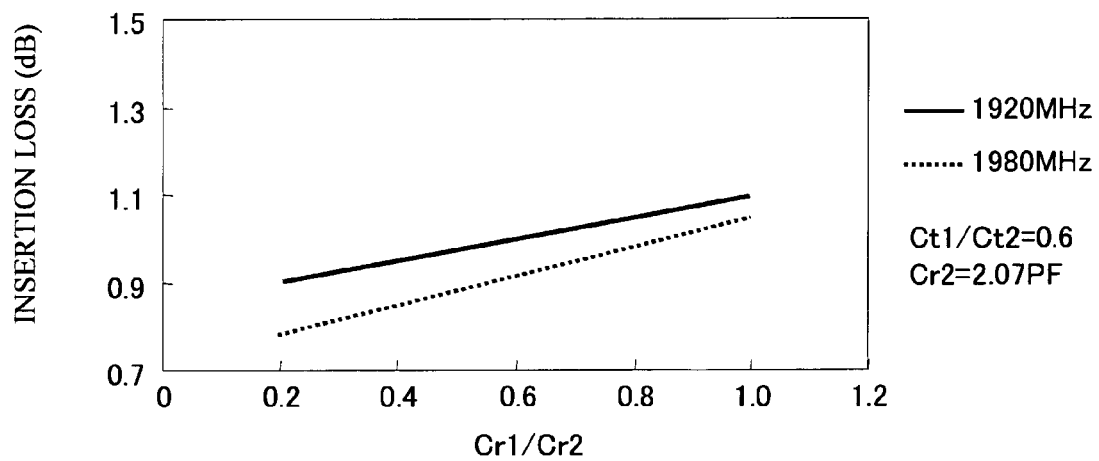
FIG. 16B is a view showing the reflection coefficient in the edges of the transmit bandwidth of the transmit filter with respect to Cr1/Cr2.
Figure 16C:
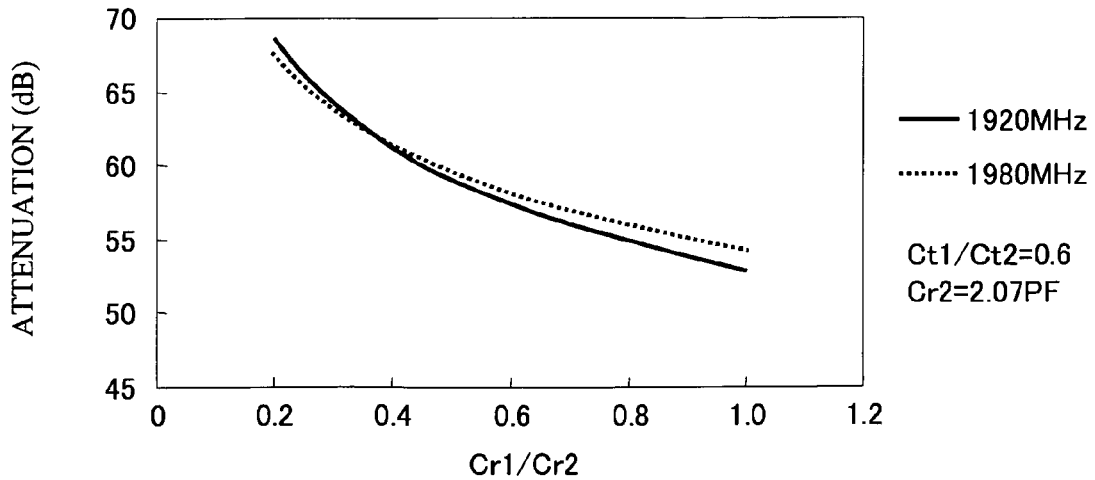
FIG. 16C is a view showing the attenuation in the edges of the transmit bandwidth of the receive filter with respect to Cr1/Cr2.

FIG. 16A through FIG. 17B are views showing characteristics of the transmit filter 10 and the receive filter 20 in the duplexer having the same circuit configuration as that of the duplexer employed in the first exemplary embodiment, in a case where Ct1/Ct2 of the transmit filter 10 is set to 0.6, Cr2 is set to 2.07 pF in the receive filter 20, and then Cr1 is varied. FIG. 16A is a view showing the reflection coefficient in the edges of the transmit bandwidth (1920 MHz and 1980 MHz) of the receive filter 20 with respect to Cr1/Cr2. FIG. 16B is a view showing the insertion loss in the edges of the transmit bandwidth (1920 MHz and 1980 MHz) of the transmit filter 10 with respect to Cr1/Cr2. FIG. 16C is a view showing the attenuation in the edges of the transmit bandwidth (1920 MHz and 1980 MHz) of the receive filter 20 with respect to Cr1/Cr2. Similarly as shown in FIG. 14A through FIG. 14C, as Cr1/Cr2 becomes smaller in the receive filter 20, the reflection coefficient of the transmit bandwidth (the opposite bandwidth of the own filter) is closer to 1 in the receive filter 20. Accordingly, the insertion loss is smaller in the transmit bandwidth (the opposite bandwidth of the opposite filter) in the transmit filter 10. In addition, the attenuation is greater in the transmit bandwidth (the opposite bandwidth of the own filter) in the receive filter 20.

Figure 17A:
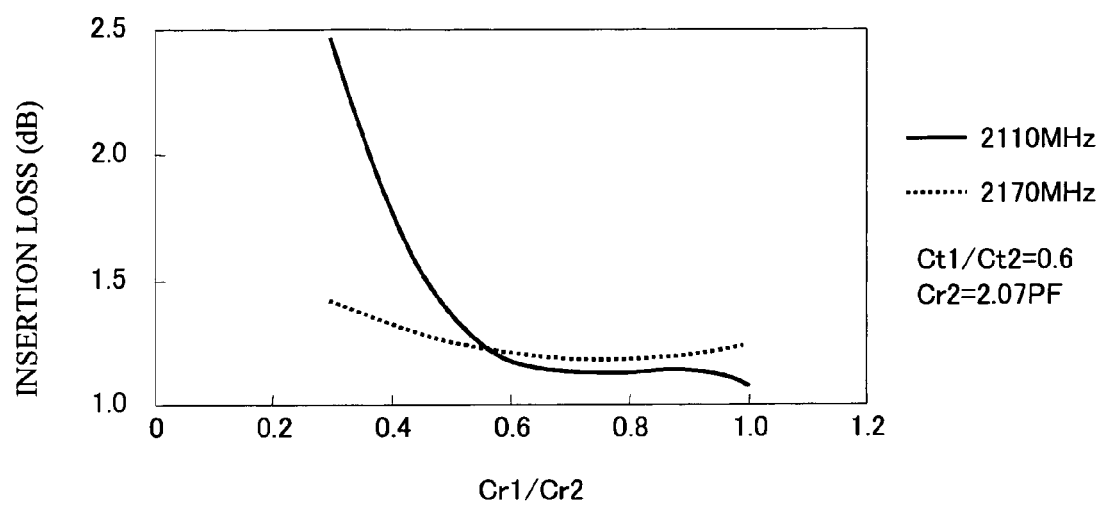
FIG. 17A is a view showing the insertion loss in the edges of the receive bandwidth of the receive filter 20 with respect to Cr1/Cr2.
Figure 17B:
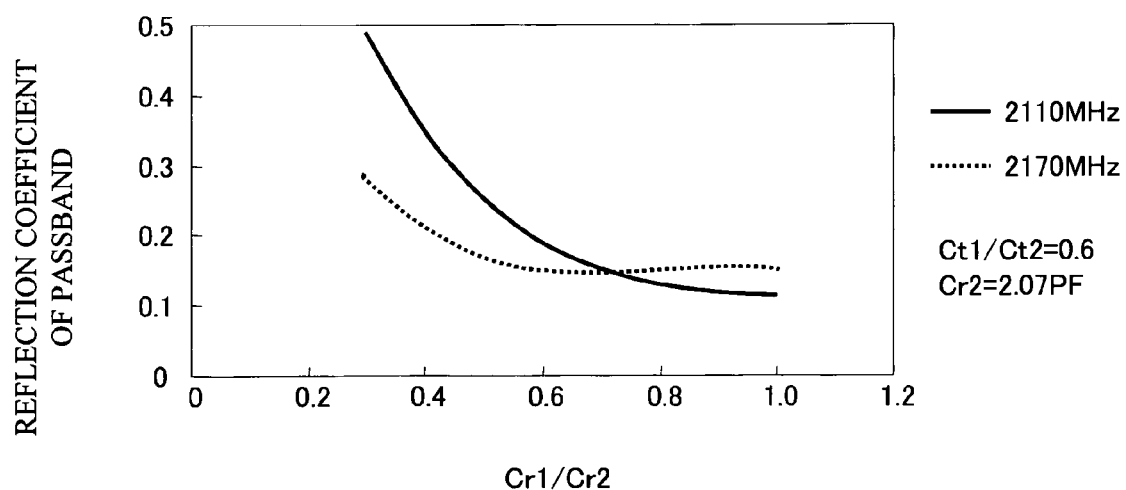
FIG. 17B is a view showing the reflection coefficient in the edges of the receive bandwidth of the receive filter with respect to Cr1/Cr2.

FIG. 17A is a view showing the insertion loss in the edges of the receive bandwidth (2110 MHz and 2170 MHz) of the receive filter 20 with respect to Cr1/Cr2. FIG. 17B is a view showing the reflection coefficient in the edges of the receive bandwidth (2110 MHz and 2170 MHz) of the receive filter 20 with respect to Cr1/Cr2. In a similar manner as shown in FIG. 15A and FIG. 15B, when Cr1/Cr2 of the receive filter 20 becomes equal to or smaller than 0.5, the reflection coefficient is greatly increased in the receive bandwidth (the own bandwidth of the own filter) of the receive filter 20, and the insertion loss in the lower edge of the receive bandwidth (the own bandwidth of the own filter) of the receive filter 20. When Cr1/Cr2 becomes equal to or smaller than 0.3, the insertion loss is greatly increased, because the matching is drastically degraded in the receive filter 20.

In the second exemplary embodiment, the ladder type filter serving as the transmit filter 10 and the receive filter 20 is represented by an equivalent circuit of the ladder type filter connected in a mirror configuration. C1/C2 is made smaller than 1, where C1 represents the capacitance value of the series resonator arranged closest to the antenna terminal and C2 represents the average value of the capacitance values of the remaining series resonators in the ladder type filter. In the duplexer employed in the first exemplary embodiment, the matching circuit is not necessary, thereby reducing the size of the duplexer. In addition, the loss can be reduced in the passband of the filter and the attenuation of the opposite bandwidth can be increased. However, there are still some cases in which the loss in the passband or the attenuation in the opposite bandwidth is not sufficient. Accordingly, as described in the second exemplary embodiment, it is possible to improve the insertion loss of the opposite bandwidth in the opposite filter and make the insertion loss closer to that of the singular filter. Further, it is possible to further increase the attenuation of the opposite bandwidth of the own filter.

Further, in the second exemplary embodiment, C1/C2 is made greater than 0.3. This can suppress the degradation of the matching in the passband and ensure the low loss in the own filter. Therefore, preferably, 0.3<C1/C2<1.0. More preferably, 0.5<C1/C2<1.0, in order to further suppress the degradation of the matching in the passband of the own filter.

Third Exemplary Embodiment

Figure 18A:
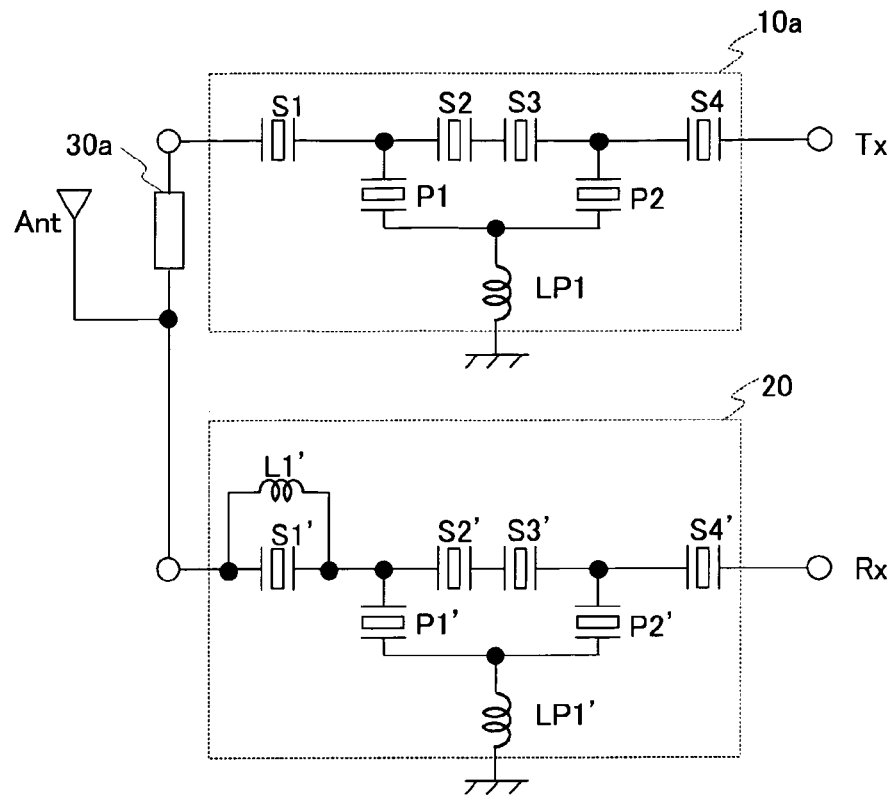
FIG. 18A shows a circuit configuration of the duplexer in accordance with a third exemplary embodiment of the present invention.

FIG. 18A shows a circuit configuration of the duplexer in accordance with a third exemplary embodiment of the present invention. The inductors are not connected to the series resonators S1 through S4 in a transmit filter 10a with respect to the duplexer employed in first exemplary embodiment of FIG. 8A. In addition, a matching circuit 30a is connected between the transmit filter 10a and the antenna terminal Ant. In the third exemplary embodiment, the same components and configurations as those of FIG. 8A have the same reference numerals and a detailed explanation will be omitted.

Figure 18B:
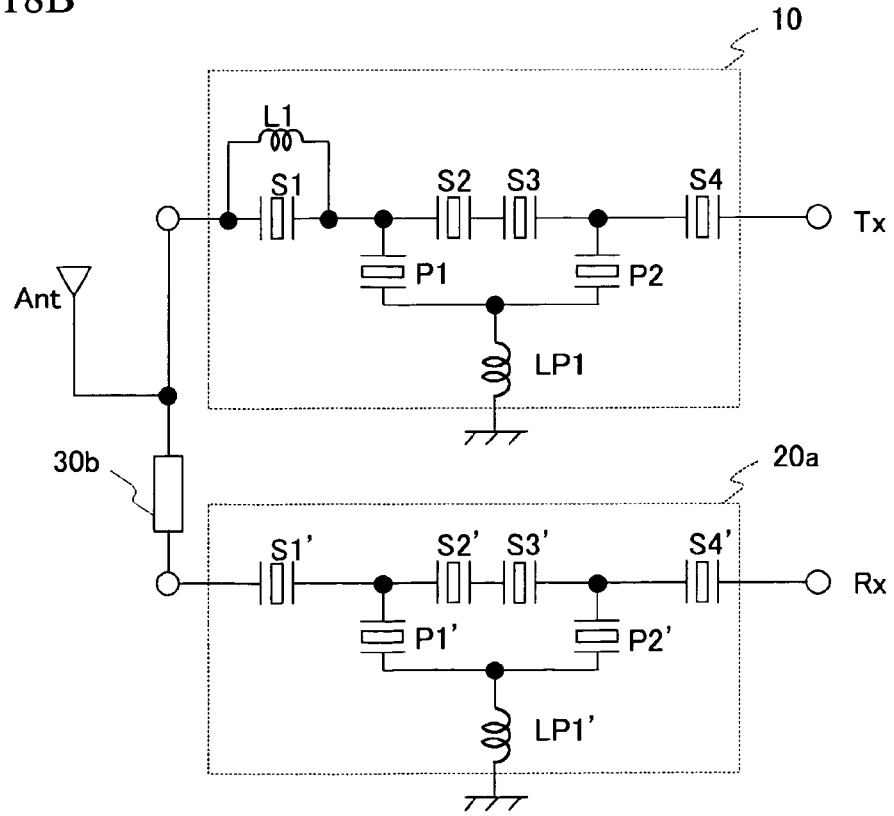
FIG. 18B shows a circuit configuration of a variation of the duplexer in accordance with the third exemplary embodiment of the present invention.

FIG. 18B shows a circuit configuration of a variation of the duplexer in accordance with the third exemplary embodiment of the present invention. The inductors are not connected to the series resonators S1' through S4' in a receive filter 20a with respect to the duplexer of FIG. 8A employed in first exemplary embodiment. In addition, a matching circuit 30b is connected between the receive filter 20a and the antenna terminal Ant. In the third exemplary embodiment and the variation thereof, other components and configurations same as those of FIG. 8A have the same reference numerals and a detailed explanation will be omitted. The matching circuits 30a and 30b are respectively composed of a lumped parameter circuit with the use of the inductor or capacitor or a distributed constant circuit with the use of a strip line or micro strip line.

In the third exemplary embodiment and the variation thereof, the loss in the passband of the filter can be more reduced and the attenuation of the opposite bandwidth can be more increased than those of the ladder type filter in which the inductor is connected in parallel with the series resonator arranged closest to the antenna terminal Ant. Any function other than the matching circuit may be employed to increase the impedance of the opposite bandwidth, instead of the matching circuits 30a and 30b. Accordingly, the ladder type filter may be employed in such a manner that at least one of the transmit filter (first filter) and the receive filter (second filter) includes the parallel resonator and multiple series resonators, one or more inductors are connected in parallel with one or more series resonators out of multiple series resonators, and the inductor is connected in parallel with the series resonator arranged closest to the antenna terminal.

Fourth Exemplary Embodiment

Figure 19:
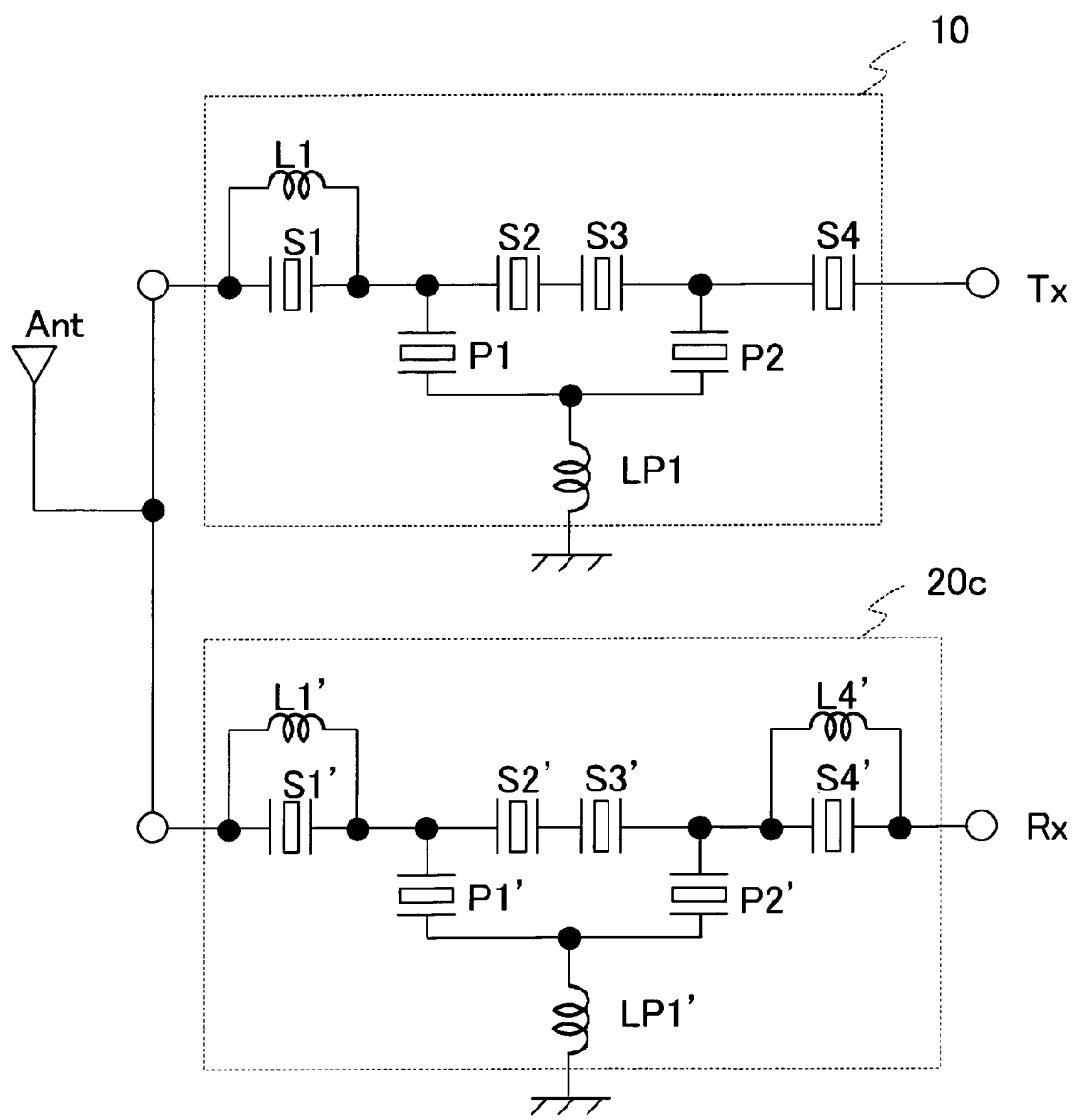
FIG. 19 shows a circuit configuration of the duplexer in accordance with a fourth exemplary embodiment of the present invention.

FIG. 19 shows a circuit configuration of the duplexer in accordance with a fourth exemplary embodiment of the present invention. The duplexer employed in the fourth exemplary embodiment includes an inductor L4' having the inductance of 2.3 nH connected in parallel with a series resonator S4' arranged on the side of the receive terminal Rx of a receive filter 20c, in addition to the circuit configuration employed in the first exemplary embodiment shown in FIG. 8A. The attenuation pole (antiresonance point) due to the resonator S4' and the inductor L4' is produced around the transmit bandwidth. In the transmit filter 10 and in the receive filter 20, Cr1/Cr2 is set to 1.0, and Ct1/Ct2 is set to 0.6. In the fourth exemplary embodiment, the same components and configurations as those of the first exemplary embodiment have the same reference numerals and a detailed explanation will be omitted, if not otherwise specified. Here, comparative example 4 is also a duplexer in which the inductor L4' is not provided in the duplexer employed in the fourth exemplary embodiment.

Figure 20:
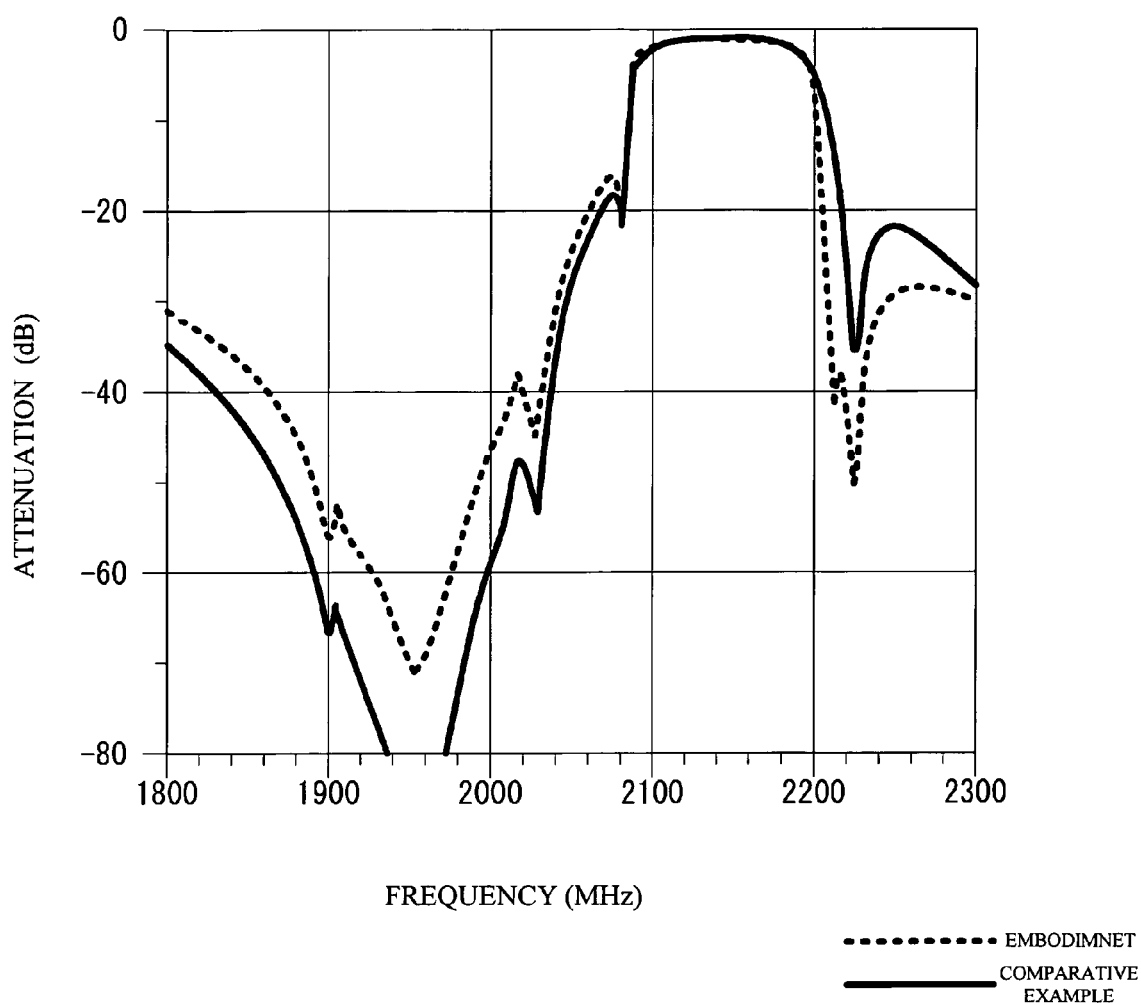
FIG. 20 is a view showing the attenuation with respect to the frequencies of the receive filter in the duplexers used in the fourth exemplary embodiment and the comparative example 4.

FIG. 20 is a view showing the attenuation with respect to the frequencies of the receive filter 20c and the receive filter 20 in the duplexers respectively used in the fourth exemplary embodiment and the comparative example 4. In the fourth exemplary embodiment, the attenuation is greatly improved particularly in the transmit bandwidth (1920 MHz to 1980 MHz), as compared to that of the comparative example 4. As stated, in the receive filter 20c (ladder type filter), the inductor L4' is connected in parallel with one of the series resonators (namely, the series resonator S4'), in addition that the inductor is connected to the series resonator S1 arranged closest to the antenna terminal Ant. In this manner, at least one inductor may be connected to the series resonator S1 arranged closest to the antenna terminal Ant, and one or more inductors may be respectively connected to one or more series resonators. This can further increase the attenuation of the opposite bandwidth of the filter.

The series resonator, by which the inductor is connected, is not limited to the one on the side of the receiving terminal Rx, and the inductor may be connected to the series resonator S2' or S3'. There is no limitation to the receive filter 20, and the inductor may be connected to the series resonator in the transmit filter 10. In such cases, the similar effect is obtainable.

Preferably, a surface acoustic wave resonator, a piezoelectric thin-film resonator, or an elastic boundary wave resonator is employed as a resonator, in the first through fourth exemplary embodiments. A description has been given of cases where there are provided four series resonators and two parallel resonators. However, there is no limitation thereto.

In the transmit filter 10, which is a ladder type filter shown in FIG. 9, there are provided parallel resonators P1 and P2 and multiple series resonators S1 through S4, the inductor L1 is connected in parallel with the series resonator S1, which is one of multiple series resonators, and the inductor L1 is connected in parallel with the series resonator S1 arranged closest to the antenna terminal Ant. The inductor LP1 is connected in series between the parallel resonators P1 and P2 and ground. The transmit filter 10 of the above-described ladder type filter is used for the duplexer, thereby eliminating the necessity of the matching circuit and reducing the size of the duplexer. In addition, it is possible to reduce the loss in the passband of the filter and increase the attenuation of the opposite bandwidth.

Fifth Exemplary Embodiment

Figure 21A:
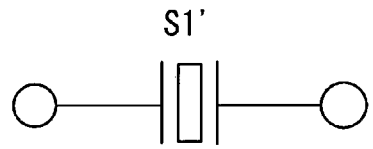
FIG. 21A is a circuit configuration of a circuit A.
Figure 21B:
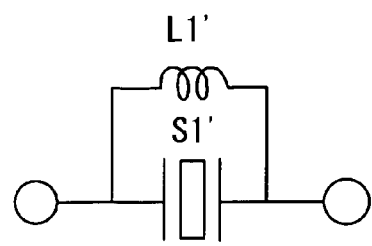
FIG. 21B is a circuit configuration of a circuit B.
Figure 21C:
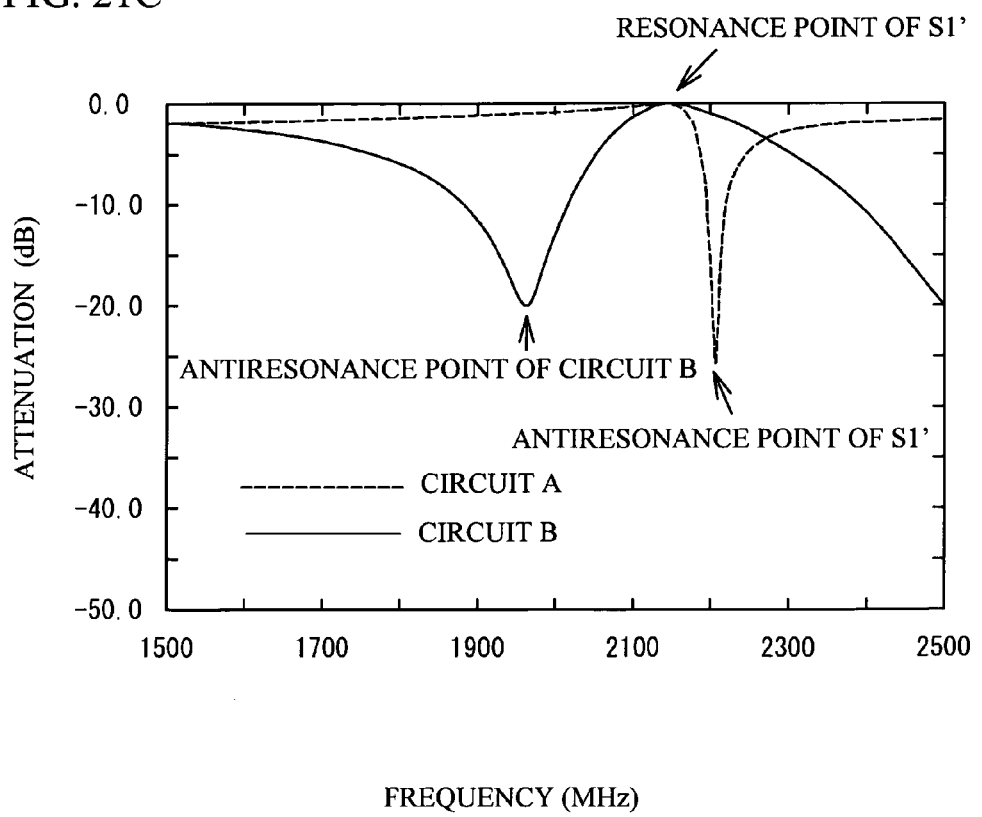
FIG. 21C shows the calculation result of the passband characteristics of the circuit A and the circuit B.

A fifth exemplary embodiment is an example of the receive filter for use in the W-CDMA/UMTS system (transmit bandwidth: 1920 MHz to 1980 MHz, receive bandwidth: 2110 MHz to 2170 MHz). Firstly, a description will be given of the passband characteristic of a case where the inductor is connected in parallel with the series resonator. FIG. 21A shows a circuit A of the series resonator S1' in which the resonance frequency is approximately 2145 MHz and the capacitance is 1.31 pF. FIG. 21B shows a circuit B in which the series resonator S1' is connected in parallel with a first inductor L1' of 3.7 nH. FIG. 21C shows the calculation result of the passband characteristics of the circuit A and the circuit B. Referring to FIG. 21C, in the circuit A, the antiresonance point is produced on the higher frequency side of the resonance point (approximately 2145 MHz) of the series resonator S1'. Meanwhile, in the circuit B, the attenuation pole is newly formed on the lower frequency side of the resonance point of the series resonator S1'. In this manner, the attenuation pole can be formed at approximately 1960 MHz, which is on the lower frequency side of the series resonator S1', by connecting the first inductor L1' in parallel with the series resonator S1'.

Figure 22A:
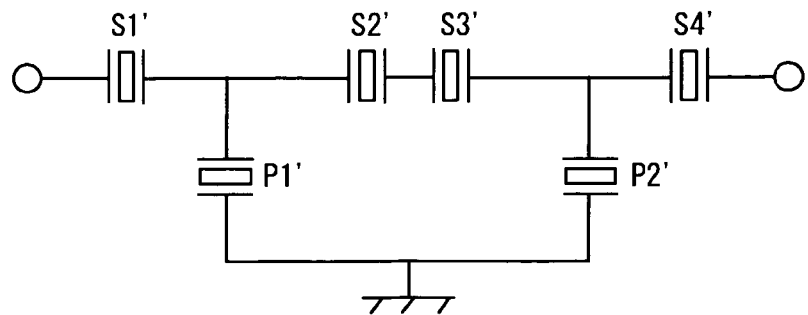
FIG. 22A through FIG. 22C are circuit configurations of filters A through C.
Figure 22B:
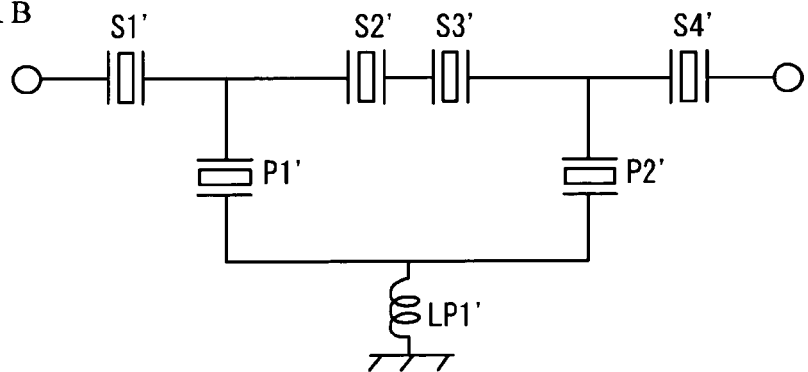
Figure 22C:
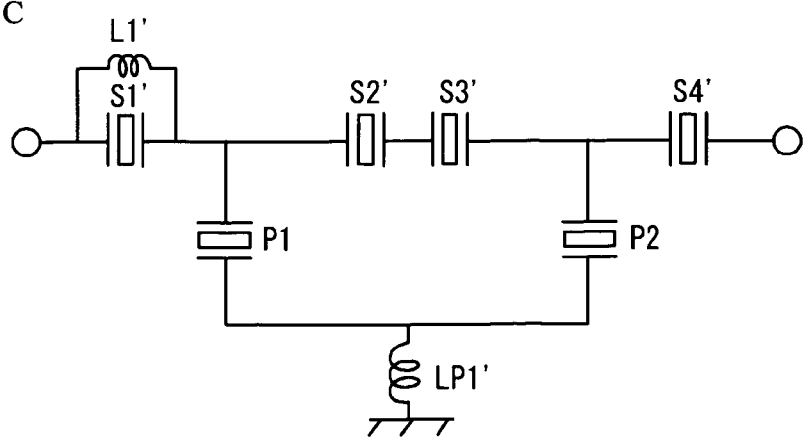

Next, the passband characteristics of filters A through C respectively shown in FIG. 22A through FIG. 22C are calculated. Referring to FIG. 22A, the filter A is a ladder type filter that includes multiple series resonators S1' through S4' and multiple parallel resonators P1' and P2'. The series resonator S1' has a capacitance of 1.31 pF, the series resonators S2' through S4' respectively have a capacitance of 1.74 pF, and the parallel resonators P1' and P2' respectively have a capacitance of 2.79 pF. Referring to FIG. 22B, in the filter B, the ground sides of the parallel resonators P1' and P2' are commonly connected and a second inductor LP1' of 0.24 nH is connected between the afore-described ground sides and ground in addition to the configuration of the filter A. Referring to FIG. 22C, in the filter C, a first inductor L1' of 3.7 nH is connected in parallel with the series resonator S1', which is one of the multiple series resonators S1 through S4, in addition to the configuration of the filter B.

Figure 23:
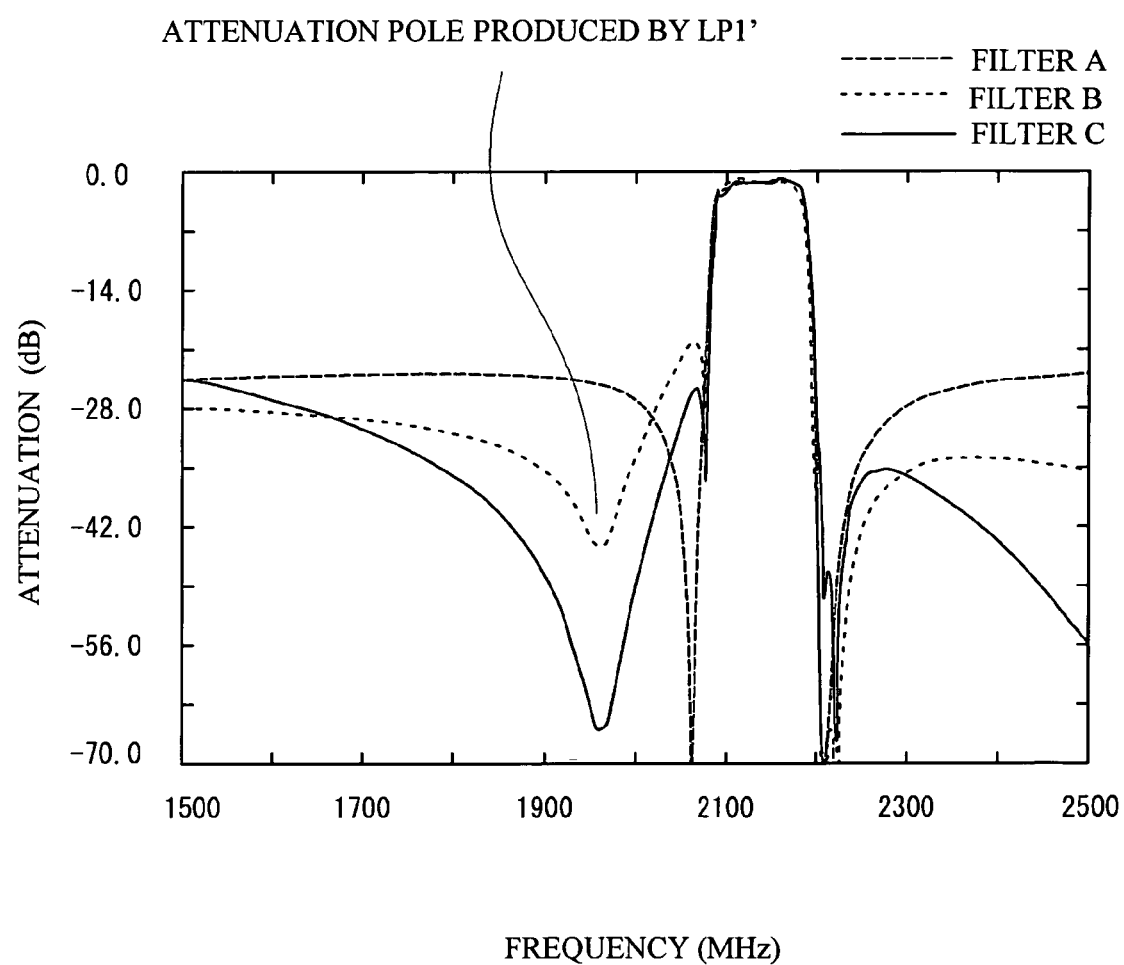
FIG. 23 is a view showing the passband characteristics of the filters A through C.

FIG. 23 is a view showing the passband characteristics of the filters A through C. Referring to FIG. 23, in the filter B, an attenuation pole is newly formed at approximately 1960 MHz on the lower frequency side of the passband, by connecting a second inductor LP1' to the configuration of the filter A. In addition, in the filter C, another attenuation pole is formed at approximately 1960 MHz by connecting the first inductor L1' to the configuration of the filter B. There is no degradation in the insertion loss in the passband when the second inductor LP1' and the first inductor L1' are connected. That is, the low loss is maintained. As described above, the first inductor L1' is connected in parallel with the series resonator S1', and the attenuation pole of the antiresonance point formed on the lower frequency side than the resonance point of the series resonator S1' is substantially matched with the attenuation pole formed on the lower frequency side than the passband by connecting the second inductor LP1' in series between ground and the common connection of the parallel resonators P1' and P2' on the ground side in the ladder type filter. This makes it possible to increase the attenuation of 1920 MHz to 1980 MHz (stopband) existent on the lower frequency side of the passband of the receive filter, while the low loss is being maintained in the passband.

The attenuation pole produced by connecting the first inductor L1' is substantially matched with the attenuation pole produced by connecting the second inductor LP1'. This means that in a given stopband (the transmit bandwidth of 1920 MHz to 1980 MHz in the fifth exemplary embodiment), the attenuation pole produced by connecting the second inductor LP1' is substantially matched with the attenuation pole produced by further connecting the first inductor L1' so that the attenuation of the attenuation pole is increased by at least approximately 5 dB. For example, in the fifth exemplary embodiment, as shown in FIG. 23, the attenuation of the attenuation pole in the stopband is 44 dB, when the second inductor LP1' is connected in the filter B. However, the attenuation of the attenuation pole in the stopband is approximately 66 dB, when the first inductor L1' is further connected in the filter C, thereby increasing the attenuation by 5 dB or more. In this manner, two attenuation poles are substantially matched with each other. Meanwhile, as compared to the characteristic (of case 1) where only the inductor for the attenuation pole is connected and those (of cases 2 and 3) where the inductor and capacitor are connected in parallel with the series resonator, as shown in FIGS. 10 and 11 of the conventional technique 5, 5 dB or less is improved in the attenuation on the lower frequency side of the passband. This is because the two attenuation poles are not designed to be matched with each other.

Sixth Exemplary Embodiment

Figure 24A:
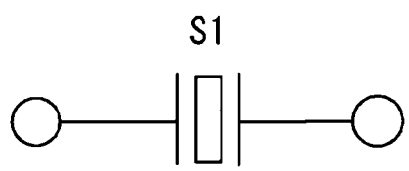
FIG. 24A and FIG. 24B are circuit configurations of circuits C and D.
Figure 24B:
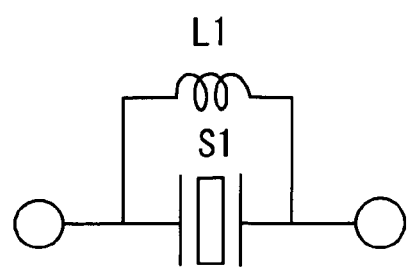
Figure 24C:
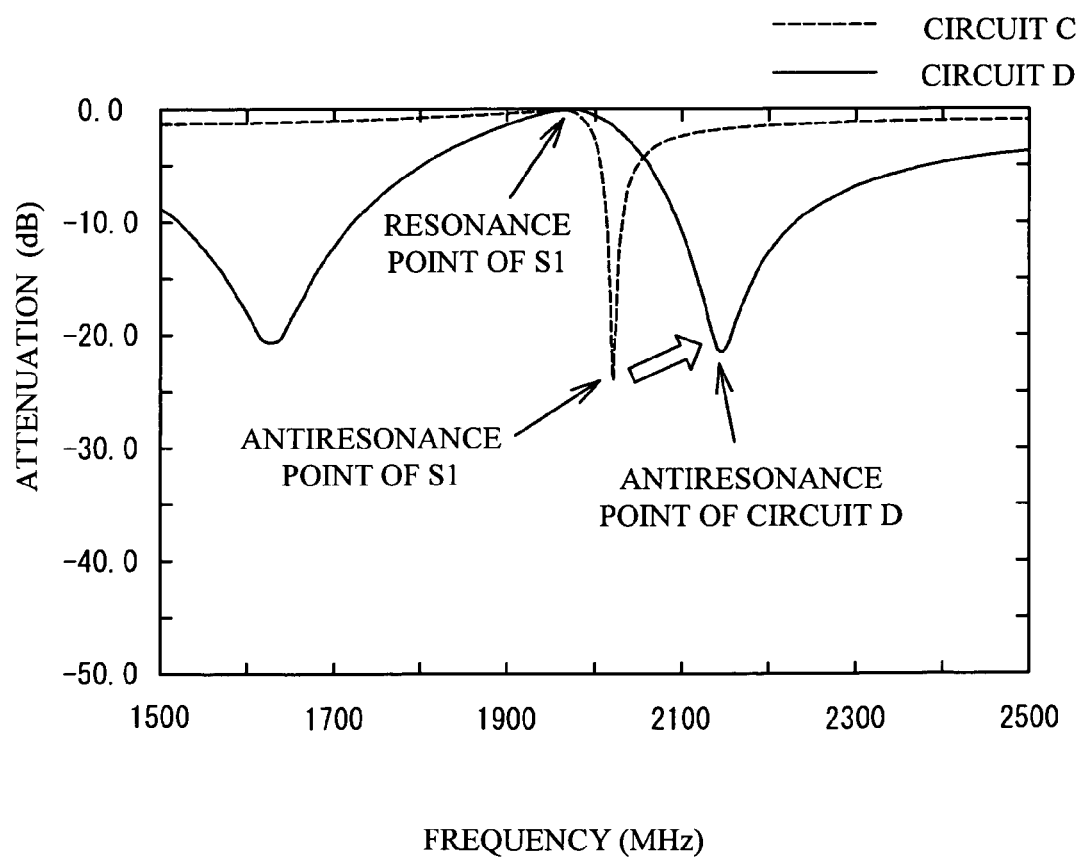
FIG. 24C is a view showing the passband characteristics of the circuits C and D.

A sixth exemplary embodiment is an example of the transmit filter for use in the W-CDMA/UMTS system. Firstly, a description will be given of the passband characteristic of a case where the inductor is connected in parallel with the series resonator. FIG. 24A shows a circuit C of the series resonator S1 in which the resonance frequency is approximately 1960 MHz and the capacitance is 1.74 pF. FIG. 24B shows a circuit D in which the series resonator S1 is connected in parallel with a first inductor L1 of 4.6 nH. FIG. 24C shows the calculation result of the passband characteristics of the circuit C and the circuit D. Referring to FIG. 24C, in the circuit C, the antiresonance point (approximately 2020 MHz) is produced on the higher frequency side of the resonance point (approximately 1960 MHz) of the series resonator S1. Meanwhile, in the circuit D, the frequency of the antiresonance point is further shifted to the higher frequency side and the antiresonance point is formed at approximately 2140 MHz. In this manner, the antiresonance point (attenuation pole) of the series resonator S1 can be formed on the further higher frequency side, by connecting the first inductor L1 in parallel with the series resonator S1.

Figure 25A:
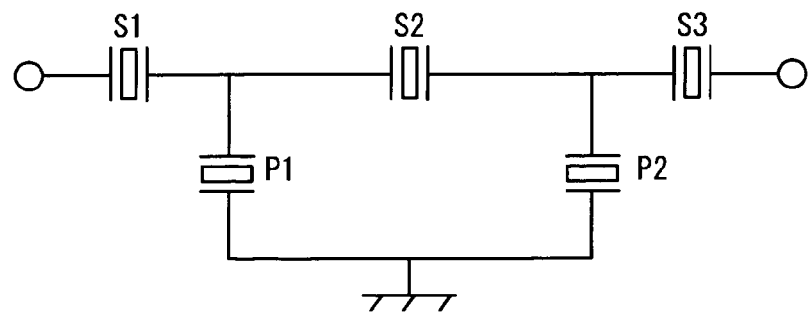
FIG. 25A through FIG. 25C are circuit configurations of filters D through F.
Figure 25B:
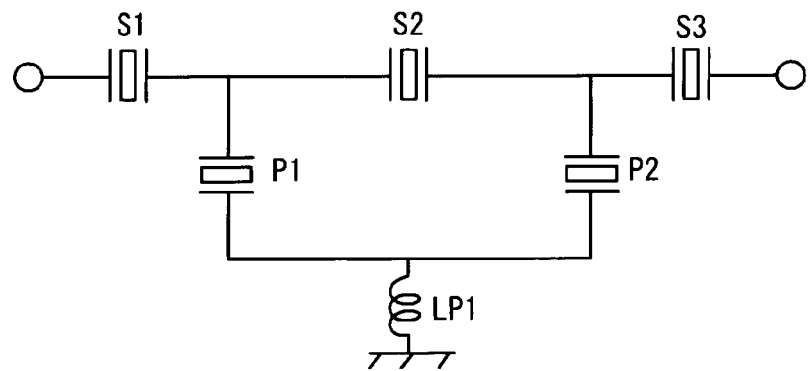
Figure 25C:
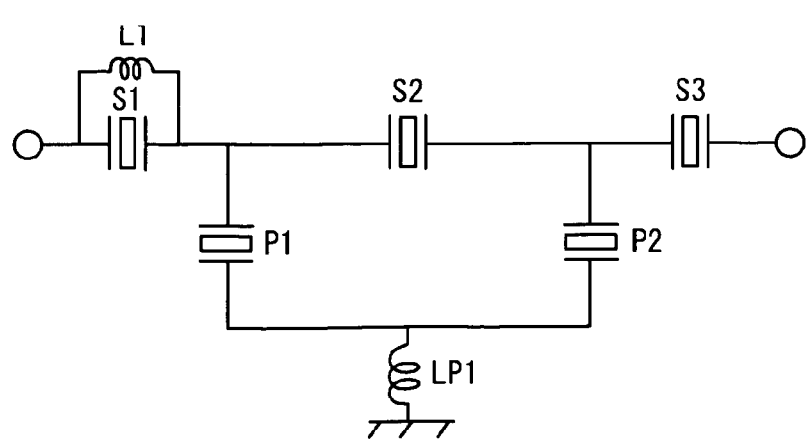

Next, the passband characteristics of filters D through F respectively shown in FIG. 25A through FIG. 25C are calculated. Referring to FIG. 25A, the filter D is a ladder type filter that includes multiple series resonators S1 through S3 and multiple parallel resonators P1 and P2. The series resonators S1, S2, and S3 respectively have a capacitance of 1.74 pF, 1.34 pF, and 2.67 pF, and the parallel resonators P1 and P2 have a capacitance of 1.6 pF. Referring to FIG. 25B, in the filter E, the ground sides of the parallel resonators P1 and P2 are commonly connected and a second inductor LP1 of 1.28 nH is connected between the ground sides and ground, in addition to the configuration of the filter D. Referring to FIG. 25C, in the filter F, a first inductor L1 of 4.6 nH is connected in parallel with the series resonator S1, which is one of the multiple series resonators S1 through S3, in addition to the configuration of the filter E.

Figure 26:
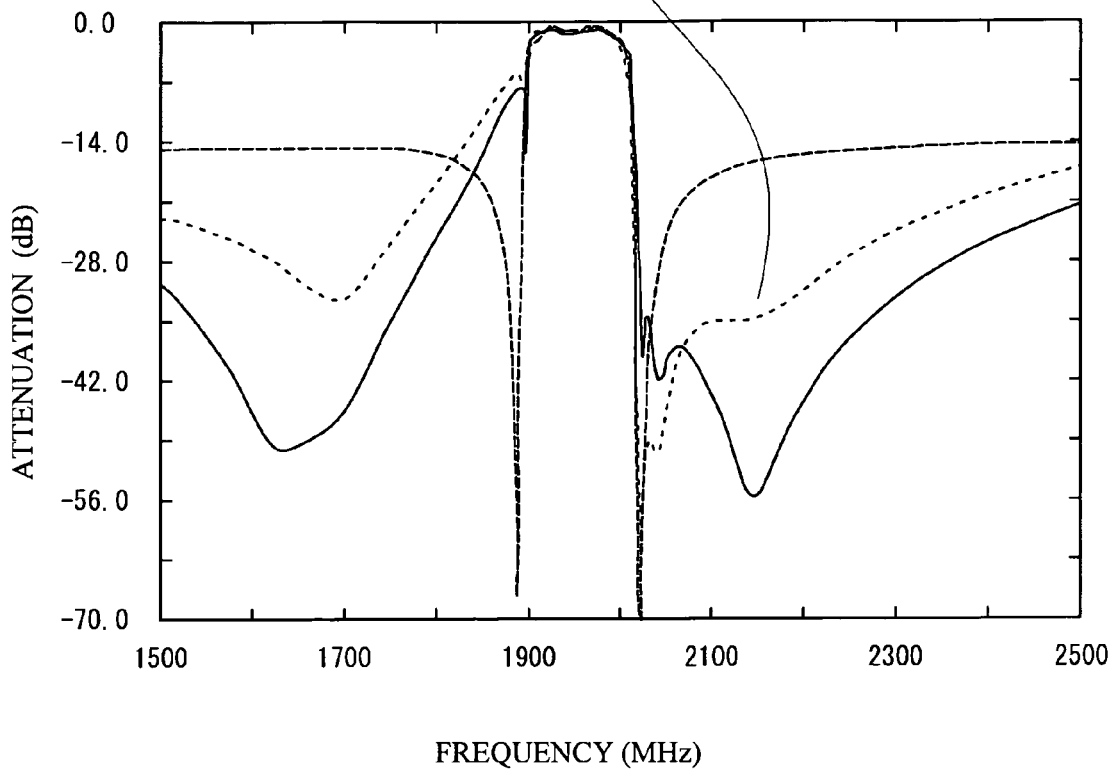
FIG. 26 is a view showing the passband characteristics of the filters D through F.

FIG. 26 is a view showing the passband characteristics of the filters D through F. Referring to FIG. 26, in the filter E, an attenuation pole is formed at approximately 2140 MHz on the higher frequency side of the passband, by connecting a second inductor LP1 to the configuration of the filter D. In addition, in the filter F, another attenuation pole is formed at approximately 2140 MHz by connecting the first inductor L1 to the configuration of the filter E. There is no degradation in the insertion loss in the passband when the second inductor LP1 and the first inductor L1 are connected. That is, the low loss is maintained. As described above, the first inductor L1 is connected in parallel with the series resonator S1, and the attenuation pole of the antiresonance point shifted to the higher frequency side is substantially matched with the attenuation pole formed on the higher frequency side than the passband by connecting the second inductor LP1 in series between ground and the common connection of the parallel resonators P1 and P2 on the ground side in the ladder type filter. This makes it possible to increase the attenuation of the range of 2110 MHz to 2170 MHz on the higher frequency side of the passband of the transmit filter, while the low loss is being maintained in the passband.

The attenuation pole shifted by connecting the first inductor L1 is substantially matched with the attenuation pole produced by connecting the second inductor LP1. This means that in a given stopband (the receive bandwidth of 2110 MHz to 2170 MHz in the sixth exemplary embodiment), the attenuation pole produced by connecting the second inductor LP1 is substantially matched with the attenuation pole produced by further connecting the first inductor L1 so that the attenuation of the attenuation pole is increased by at least approximately 5 dB. For example, in the sixth exemplary embodiment, as shown in FIG. 26, the attenuation of the attenuation pole in the stopband is 35 dB, when the second inductor LP1 is connected in the filter E. However, the attenuation of the attenuation pole in the stopband is approximately 56 dB, when the first inductor L1 is additionally connected in the filter F, thereby increasing the attenuation by 5 dB or more. In this manner, two attenuation poles are substantially matched. Meanwhile, as described in the fifth exemplary embodiment, in the conventional technique 5, 5 dB or less is improved in the attenuation on the higher frequency side of the passband, as compared to the characteristic of a case where only the inductor for attenuation pole is connected and that of a case where the inductor and capacitor are connected in parallel with the series resonator. This is because the two attenuation poles are not designed to be matched.

The duplexers employed in the fifth and sixth exemplary embodiments may be used for applications other than W-CDMA/UMTS system. In the fifth and sixth exemplary embodiments, however, the attenuation pole is produced by the first inductor L1 or L1' and the second inductor LP1 or LP1', thereby forming the attenuation pole apart from the passband. Accordingly, when the receive bandwidth and the transmit bandwidth are apart from each other in W-CDMA/UMTS system, for example, it is especially effective to employ the fifth and sixth exemplary embodiments.

Figure 27:
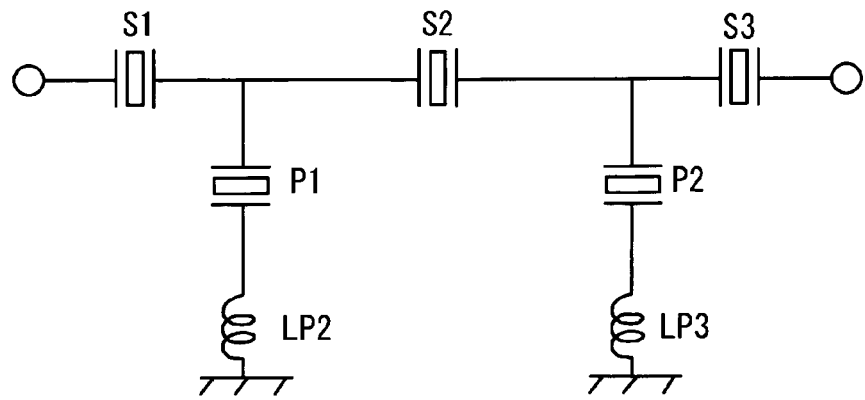
FIG. 27 is a circuit configuration of a circuit G.

Referring now to FIG. 27, in the transmit filter, inductors LP2 and LP3 are respectively connected to the parallel resonators P1 and P2 and the attenuation pole is to be formed at approximately 2140 MHz, 4.3 nH of the inductance is respectively needed for the inductors LP2 and LP3. For example, when the inductors LP2 and LP3 are formed with the line patterns in the package, this will disturb the reduction of the package size. Besides, the characteristic is easily degraded due to the electromagnetic coupling between the two inductors. Therefore, it is preferable that the second inductor is commonly connected to two or more parallel resonators.

Figure 28A:
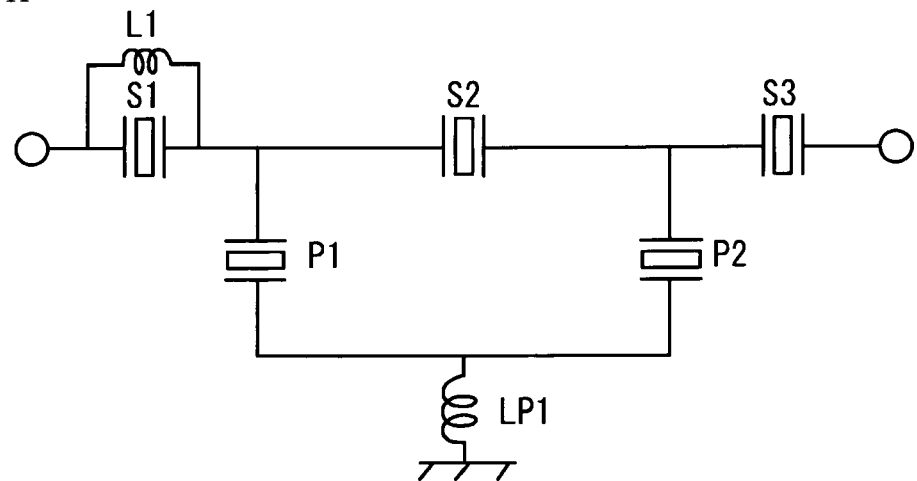
FIG. 28A and FIG. 28B are circuit configurations of filters H and I.
Figure 28B:
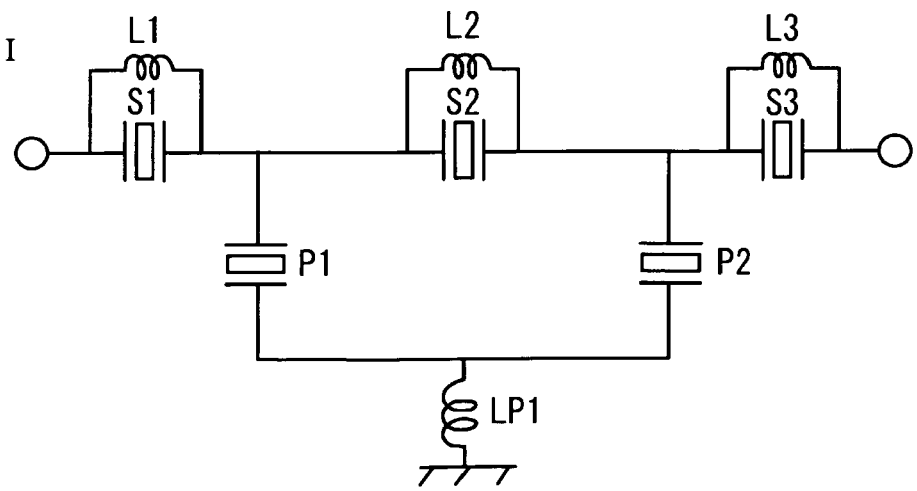

The passband characteristics of filters H and I shown in FIG. 28A and FIG. 28B are calculated. The filter H shown in FIG. 28A has the same configuration as that of the filter F shown in FIG. 25C, and the first inductor L1 is connected in parallel with the series resonator S1, which is one of the multiple series resonators S1 through S3. Referring to FIG. 28B, in the filter I, a first inductor L2 of 9.2 nH is connected in parallel with the series resonator S2 and a first inductor L3 of 4.6 nH is connected in parallel with the series resonator S3, in addition to the configuration of the filter H. In this manner, the first inductors L1 through L3 are respectively connected in parallel with all the series resonators S1 through S3.

Figure 29:
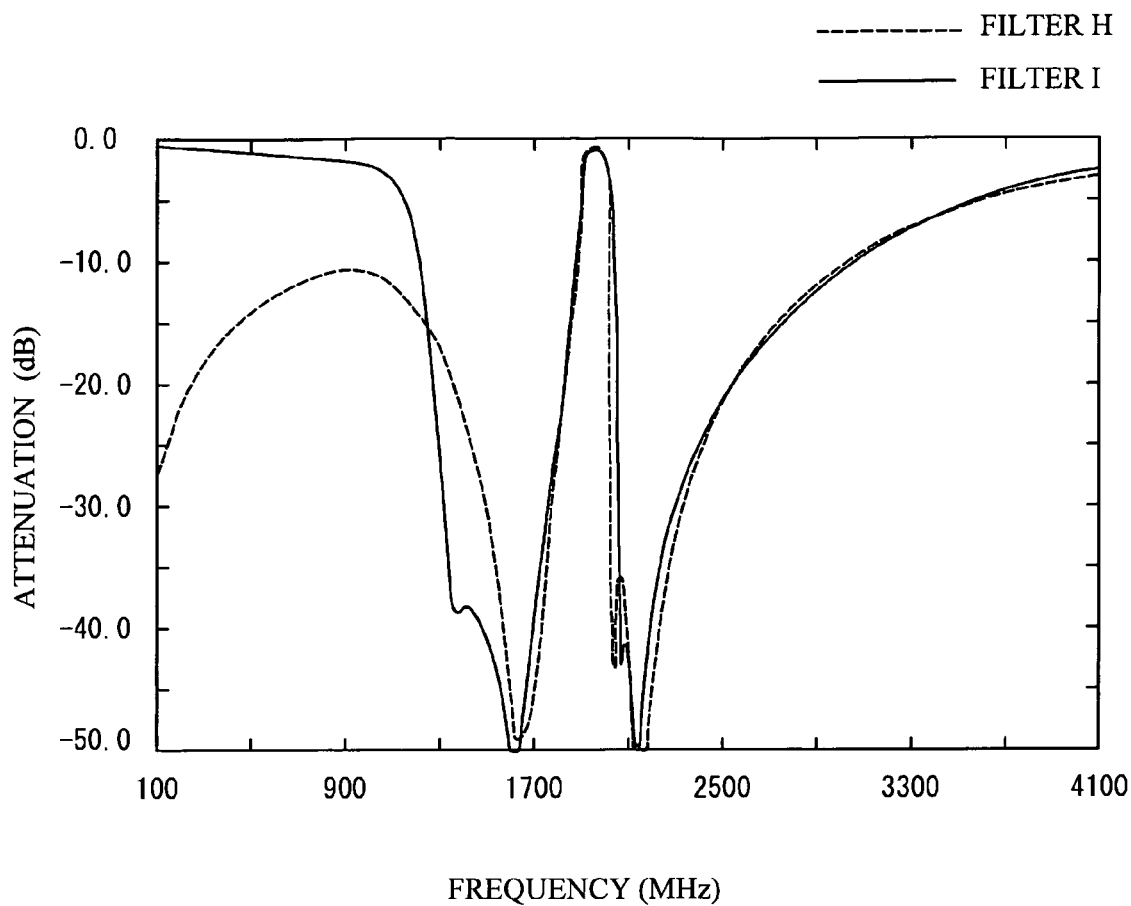
FIG. 29 is a view showing the passband characteristics of the filters H and I.

Referring now to FIG. 29, the attenuation of the filter I is degraded more on the lower frequency side (approximately 1300 MHz or less) than that of the filter H. Accordingly, the first inductors L1 through L3 are respectively connected to all the series resonators S1 through S3, thereby degrading the attenuation on the lower frequency side. Lots of inductors of large values are needed for forming the attenuation pole in the stopband. This is not adequate for reducing the costs and the size. In particular, in order to suppress the degradation of the attenuation on the lower frequency side, it is preferable that the first inductor should be connected to one or more of the series resonators out of the series resonators S1 through S3. Further, as the filter H, it is more preferable that there should be provided two series resonators S2 and S3 or more with which the first inductor L1 is not connected in parallel, out of the multiple series resonators S1 through S3.

Seventh Exemplary Embodiment

Figure 30:
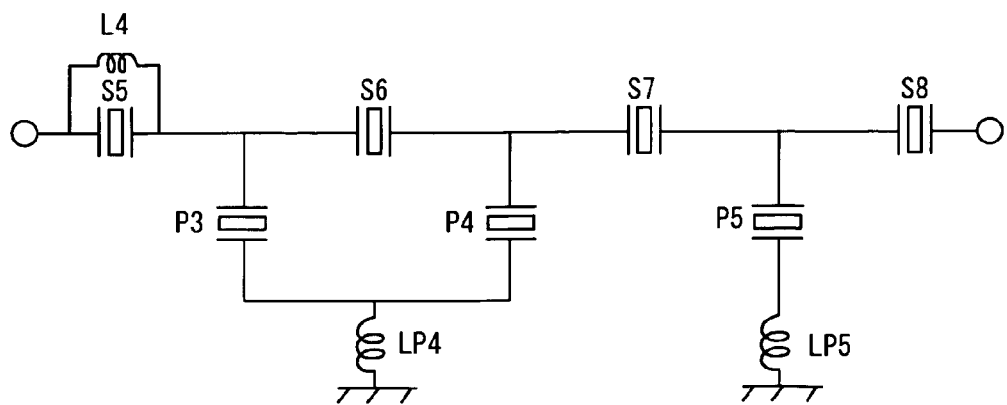
FIG. 30 shows a circuit configuration of a filter in accordance with a seventh exemplary embodiment of the present invention.

A seventh exemplary embodiment is an example in which the parallel resonators commonly connected by the second inductor are partially included in the ladder type filter. Referring now to FIG. 30, the ladder type filter employed in the seventh exemplary embodiment includes: multiple series resonators S5 through S8; and multiple parallel resonators P3 through P5. A first inductor L4 is connected in parallel with the series resonator S5, which is one of the multiple series resonators S5 through S8. The ground side of the parallel resonators P3 and P4 are commonly connected, and a second inductor LP4 is connected between the ground side of the parallel resonators P3 and P4 and ground. In addition, an inductor LP5 is connected between the ground side of the parallel resonator P5 and ground. The inductance of the first inductor L4 and that of the second inductor LP4 are configured to form one attenuation pole from the attenuation pole of the first inductor L4 and the second inductor LP4. Preferably, it is configured such the two attenuation poles are substantially matched. This can increase the attenuation at the attenuation pole formed.

In the fifth through seventh exemplary embodiments, it is possible to configure arbitrary number of the series resonators and that of the parallel resonators. The series resonators are not limited to S1, S1', or 5S to which the first inductors L1, L1', or L4 is respectively connected, and arbitrary series resonator may be connected by the inductor. It is only necessary that multiple parallel resonators are commonly connected to the second inductor LP1, LP1', or LP4. As described in the fifth and sixth exemplary embodiments, all of the multiple parallel resonators included in the ladder type filter may be commonly connected. As described in the seventh exemplary embodiment, one or more of the parallel resonators, out of multiple resonators, may be commonly connected. As to the parallel resonator to which the second inductor is connected, the number of the necessary inductors and the value thereof can be made smaller, when all of the multiple parallel resonators are commonly connected.

In the fifth through seventh exemplary embodiments, it is possible to increase the attenuation of the stopband with a low loss, by providing the first inductors L1, L1', or L4 and the second inductor LP1, LP1', or LP4, as shown in FIG. 23 and FIG. 26. It is also possible to reduce the size and costs by connecting the second inductor LP1, LP1', or LP4 commonly connected to two or more parallel resonators. In addition, it is possible to suppress the degradation of the attenuation in a wide bandwidth on the lower frequency side, as shown in FIG. 29, because the first inductor L1, L1', or L4 is connected to one or more of the multiple series resonators.

Eighth Exemplary Embodiment

Figure 31A:
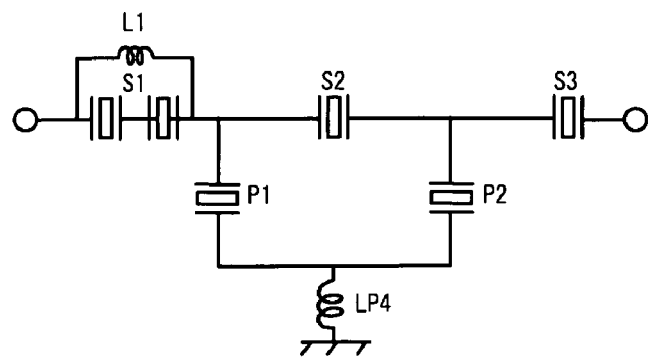
FIG. 31A through FIG. 31D show circuit configurations of a filter in accordance with an eighth exemplary embodiment of the present invention.
Figure 31B:
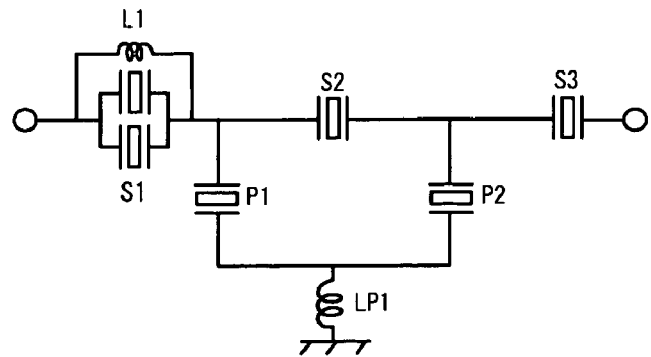
Figure 31C:
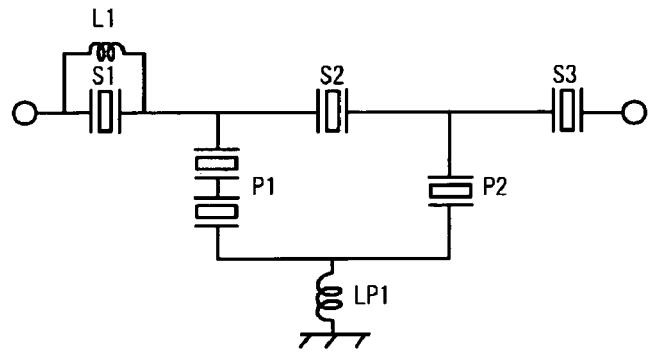
Figure 31D:
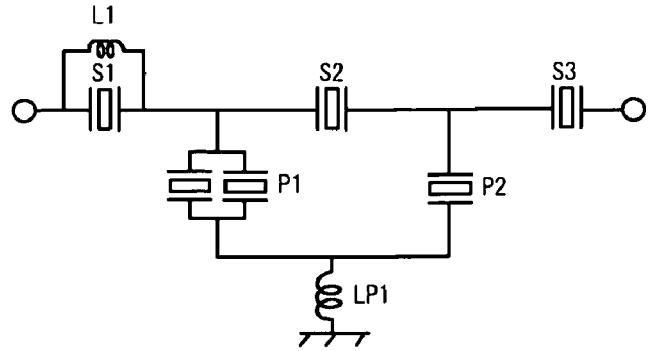

An eighth exemplary embodiment is an example in which at least one of the series resonator and the parallel resonator is divided into multiple resonators and connected in series or parallel with each other. Referring to FIG. 31A, in the filter F employed in the sixth exemplary embodiment, the series resonator S1 is divided into two resonators, and the two resonators are connected in series with each other. Referring to FIG. 31B, in the filter F employed in the sixth exemplary embodiment, the series resonator S1 is divided into two resonators, and the two resonators are connected in parallel with each other. Referring to FIG. 31C, in the filter F employed in the sixth exemplary embodiment, the parallel resonator P1 is divided into two resonators, and the two resonators are connected in series with each other. Referring to FIG. 31D, in the filter F employed in the sixth exemplary embodiment, the parallel resonator P1 is divided into two resonators, and the two resonators are connected in parallel with each other.

In the eighth exemplary embodiment, the power durability, inter modulation distortion (IMD), and the like can be improved. Preferably, such divided two resonators have the capacitance that remains unchanged from that of one resonator before the division. Also, the resonator to be divided is not limited to the series resonator S1 or the parallel resonator P1, and arbitrary series resonator or parallel resonator may be divided. In addition, multiple series resonators and parallel resonators may be divided.

Ninth Exemplary Embodiment

Figure 32:
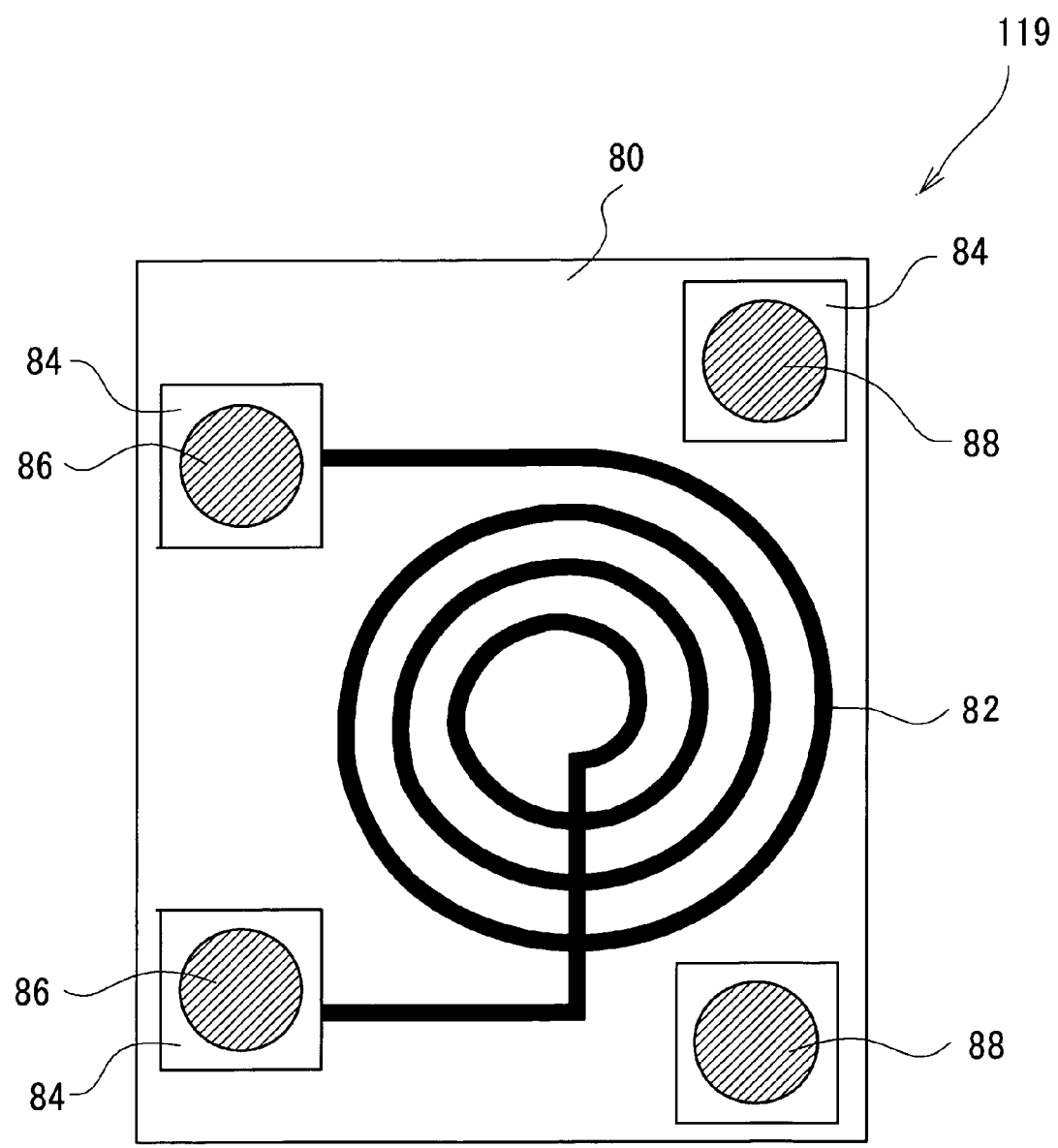
FIG. 32 is a top view of an Integrated Passive Device (IPD) chip in accordance with a ninth exemplary embodiment of the present invention.

A ninth exemplary embodiment is an example in which the filter C employed in the fifth exemplary embodiment is mounted on a stacked package. FIG. 32 is a top view of an Integrated Passive Device (IPD) chip 119 used as the first inductor L1' of 3.2 nH. On a substrate 80 of an insulator, for example, such as quartz or the like or a semiconductor, a spiral coil 82 is formed as a first inductor with the use of a low resistance metal of, for example, copper or the like. Both ends of the spiral coil 82 are connected to pads 84. Bumps 86 are provided on the pads 84 for face-down bonding. Dummy bumps 88 are provided on the pads 84 to which the spiral coil 82 is not connected. The dummy bumps 88 are not provided for the purpose of electric connection and provided for mechanical connection. The bumps 86 and the dummy bumps 88 are made of, for example, gold or the like.

Figure 33:
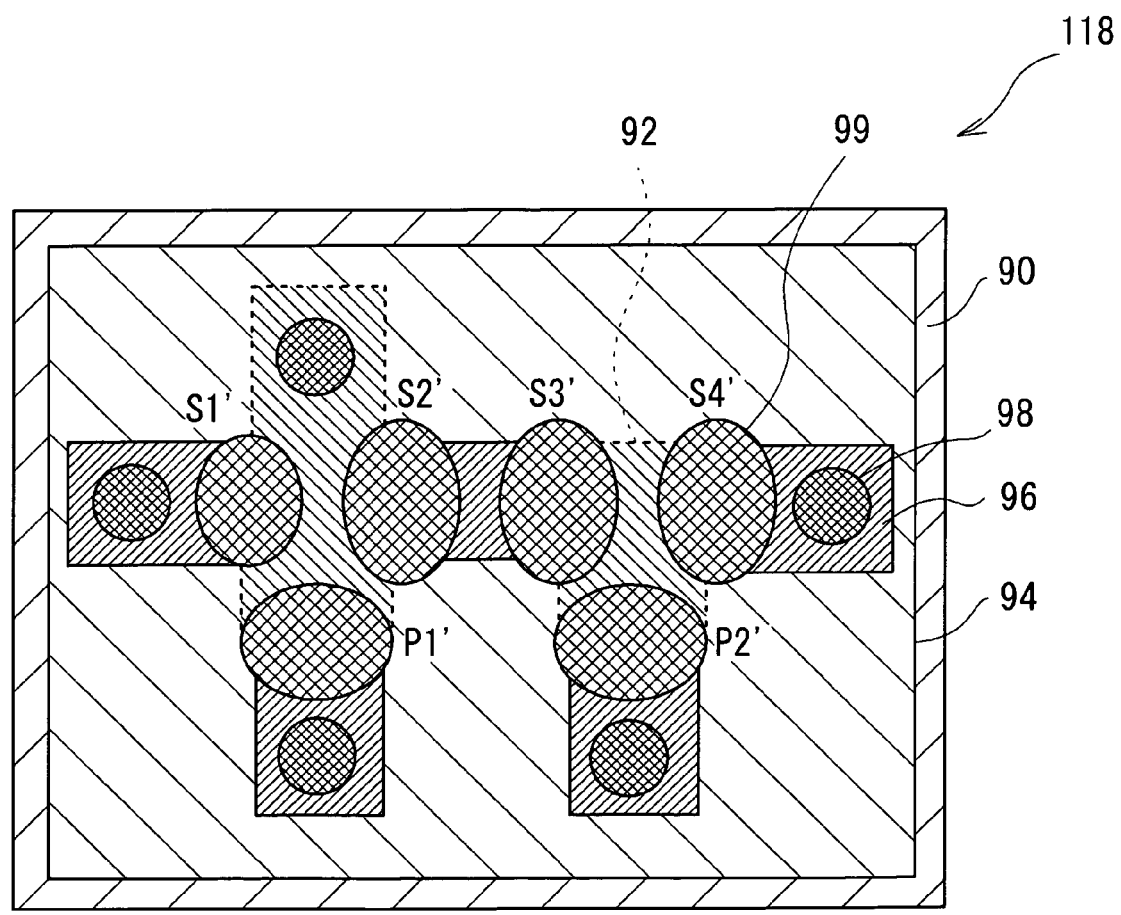
FIG. 33 is a top view of a filter chip in accordance with the ninth exemplary embodiment of the present invention.

FIG. 33 is a top view of a filter chip 118 where the series resonators S1' through S4' and the parallel resonators P1' and P2' are provided. The outer circumference of a lower electrode 92 arranged below a piezoelectric film 94 is indicated by dotted lines. Referring to FIG. 33, on a silicon substrate 90, the lower electrode 92, the piezoelectric film 94, and an upper electrode 96 are deposited. Bumps 98 are provided for the face-down mounting above the lower electrode 92 and on the upper electrode 96. Resonating portions 99 are regions where the upper electrode 96 and the lower electrode 92 sandwich the piezoelectric film 94 and oppose each other. The lower electrode 92 and the upper electrode 96 are made of a metal film, for example, Ru, Mo, W, Pt, or the like. The piezoelectric film 94 is made of a piezoelectric film, for example, AlN, ZnO, or the like. The resonance frequency of the piezoelectric thin film resonator may be determined by the thickness and propagation velocity of longitudinal vibration in the thickness direction of the lower electrode 92, the piezoelectric film 94, and the upper electrode 96.

Figure 34A:
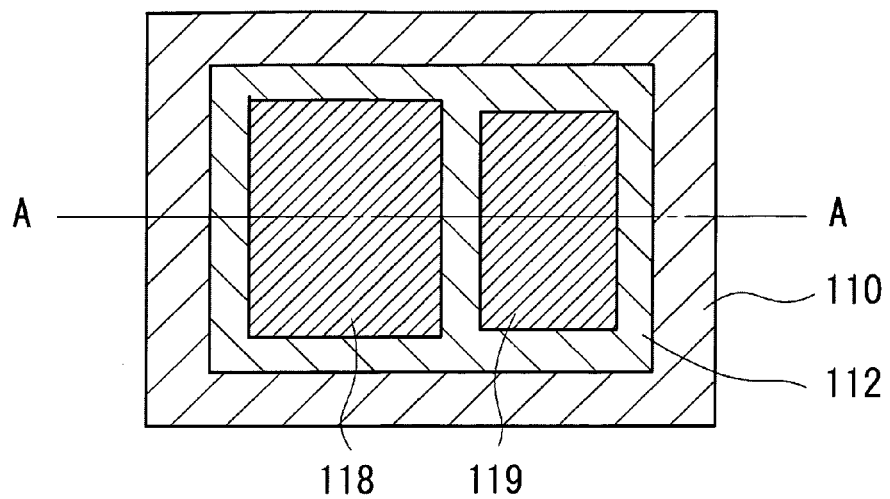
FIG. 34A is a top view of the filter employed in the ninth exemplary embodiment.
Figure 34B:
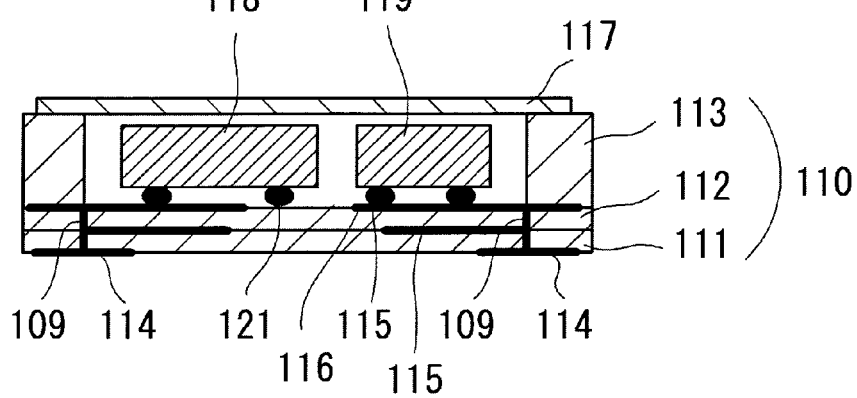
FIG. 34B is a cross-sectional view taken along a line A-A shown in FIG. 34A.

FIG. 34A and FIG. 34B are views showing the IPD chip 119 and the filter chip 118 are mounted on a stacked package 110. FIG. 34A is a top view of the filter employed in the ninth exemplary embodiment (a cap 117 is not shown). The IPD chip 119 and the filter chip 118 are face-down mounted on the surface of a base layer 112 of the stacked package 110. FIG. 34B is a cross-sectional view taken along a line A-A shown in FIG. 34A. The stacked package 110 includes: a cavity layer 113 of an insulation layer made of, for example, ceramic; and base layers 111 and 112. The cap 117 (metal lid) of a metal is sealed on the cavity layer 113 to hermetically seal the filter chip 118 and the IPD chip 119 and form a cavity. The filter chip 118 and the IPD chip 119 are face-down mounted on the surface of the base layer 112 with the use of bumps 121.

Conductive line patterns 115 are provided on the surfaces of base layers 111 and 112. Conductive footpads 114 are provided on the backside of the base layer 111. The line pattern 115 provided on the surface of the base layer 111 is electrically coupled to the line pattern 115 provided on the surface of the base layer 112 by a via 109 that extends through the base layer 112 and in which a conductive material is embedded. Similarly, the line pattern 115 provided on the surface of the base layer 111 is electrically coupled to the footpad 114 by the via 109 that extends through the base layer 111. The footpads 114 are coupled to the filter chip 118 and the IPD chip 119 by the vias 109 and the line patterns 115. The second inductor LP1' of 0.24 nH is formed by the line patterns 115 provided on the surface of the base layer 112, the vias 109 that extend through the base layer 112, the line patterns 115 provided on the surface of the base layer 111, and the vias 109 that extend through the base layer 111.

In the ninth exemplary embodiment, the first inductor L1' is formed by the IPD chip 119. The inductor formed by the IPD chip 119 realizes a high Q-value, small size, and small height. Accordingly, it is possible to provide the filter that enables high performance and downsizing, by using the IPD chip 119. The first inductor L1' may employ a chip inductor, other than the IPD chip 119. The chip inductor may be mounted on the surface of the base layer 112 of the stacked package 110, but may be provided outside of the stacked package 110. The chip inductor has a high Q-value and low costs. Therefore, it is possible to provide the high-performance and low-cost filter by using the chip inductor.

It is possible to provide the filter that enables downsizing and lower costs, since the line patterns 115 and the vias 109 formed in the stacked package 110 (mounting portion). In the ninth exemplary embodiment, a description has been given of the stacked package 110 serving as a mounting portion. However, it is only necessary that the mounting portion should have a function of mounting the filter chip 118 and the IPD chip 119, and a substrate such as a stacked one may be employed.

Figure 1A:
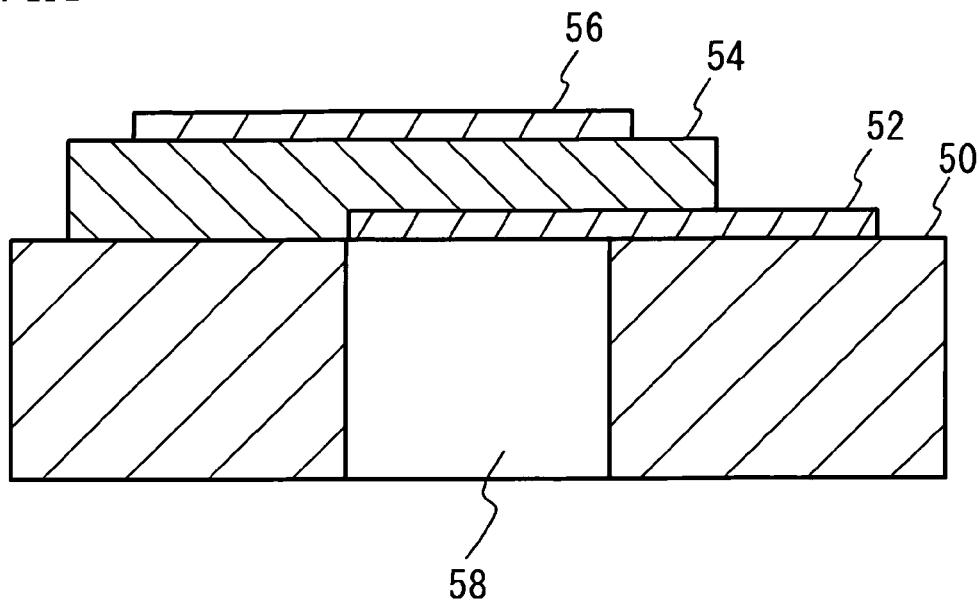
FIG. 1A is a cross-sectional view of an FBAR.
Figure 1B:
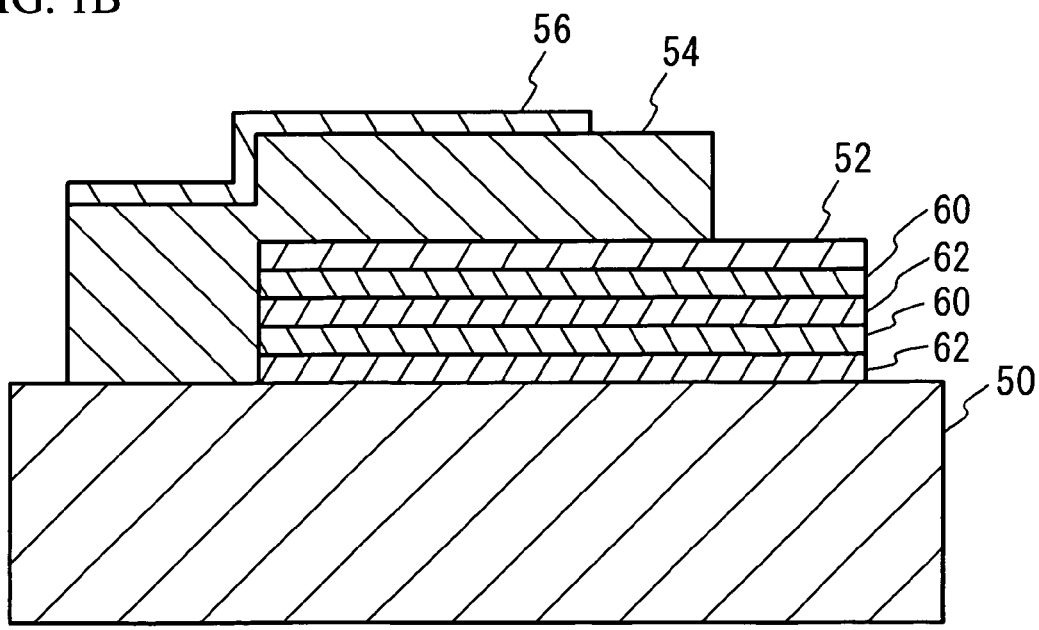
FIG. 1B is another cross-sectional view of the FBAR.
Figure 2:
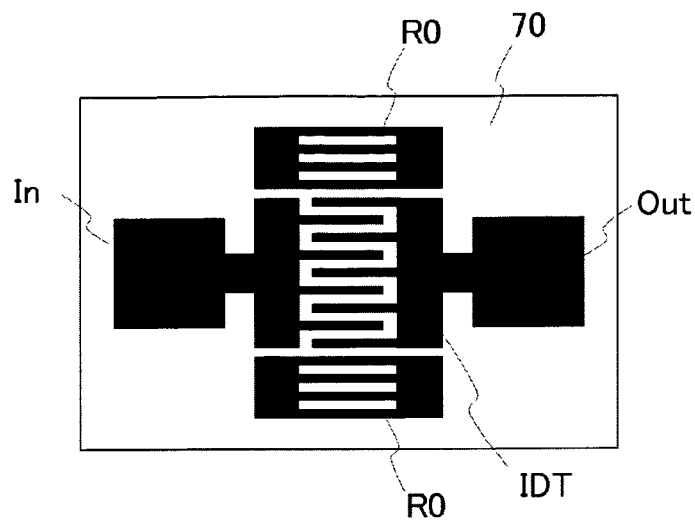
FIG. 2 is a top view of a SAW resonator.
Figure 3:
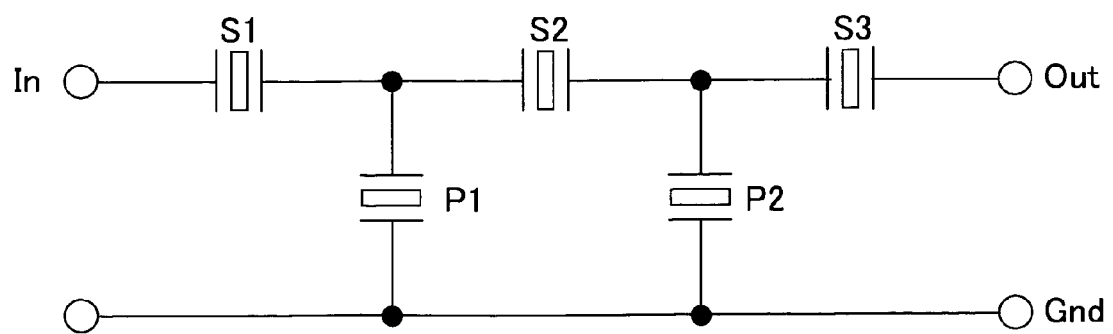
FIG. 3 shows a configuration of the ladder type filer.
Figure 4A:
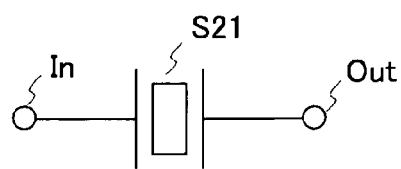
FIG. 4A is a diagram of a series resonator.
Figure 4B:
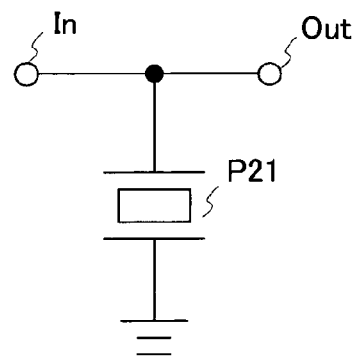
FIG. 4B is a diagram of a parallel resonator.
Figure 4C:
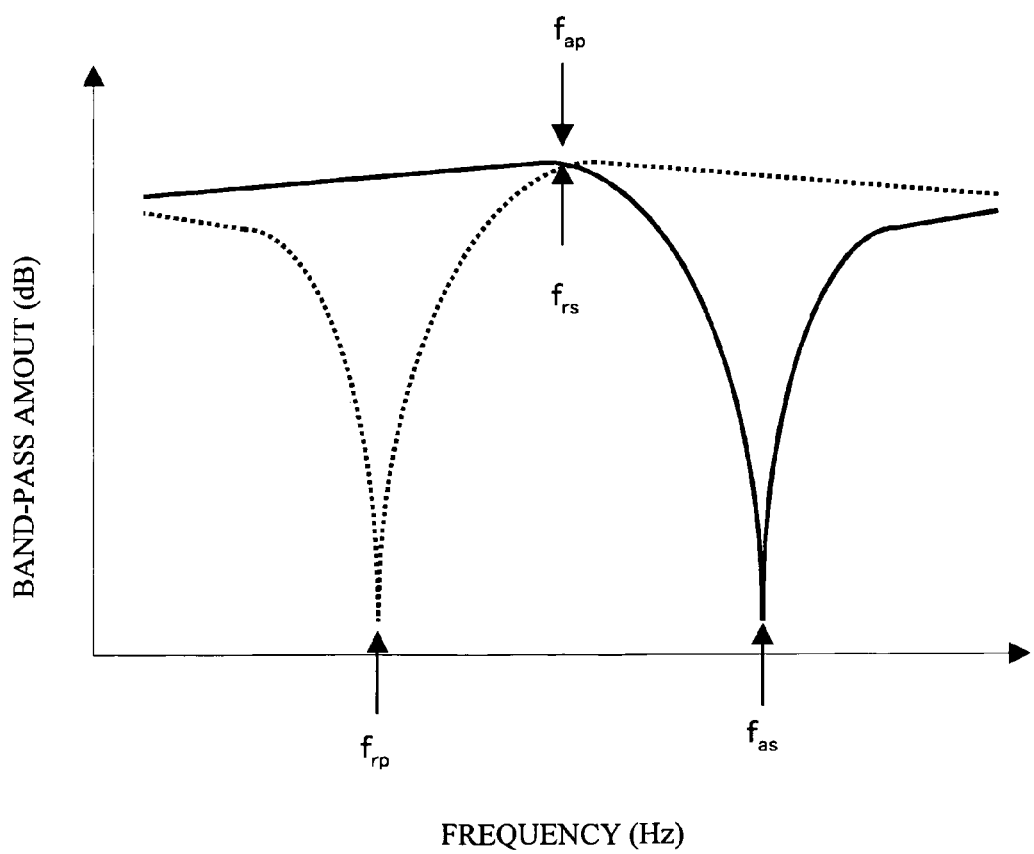
FIG. 4C shows passband characteristic of a first-stage.
Figure 5A:
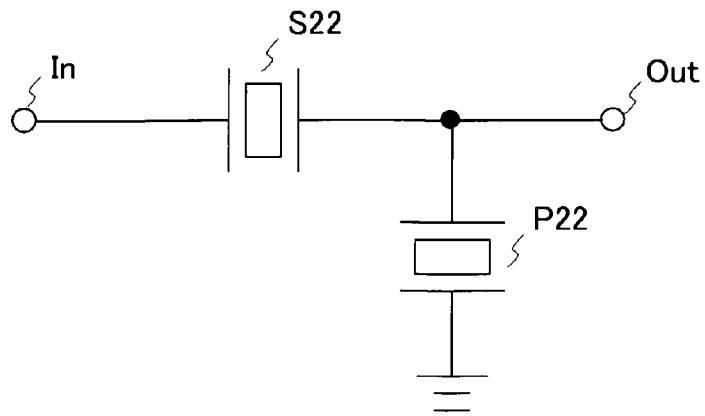
FIG. 5A shows a structure of a one-stage ladder type filter.
Figure 5B:
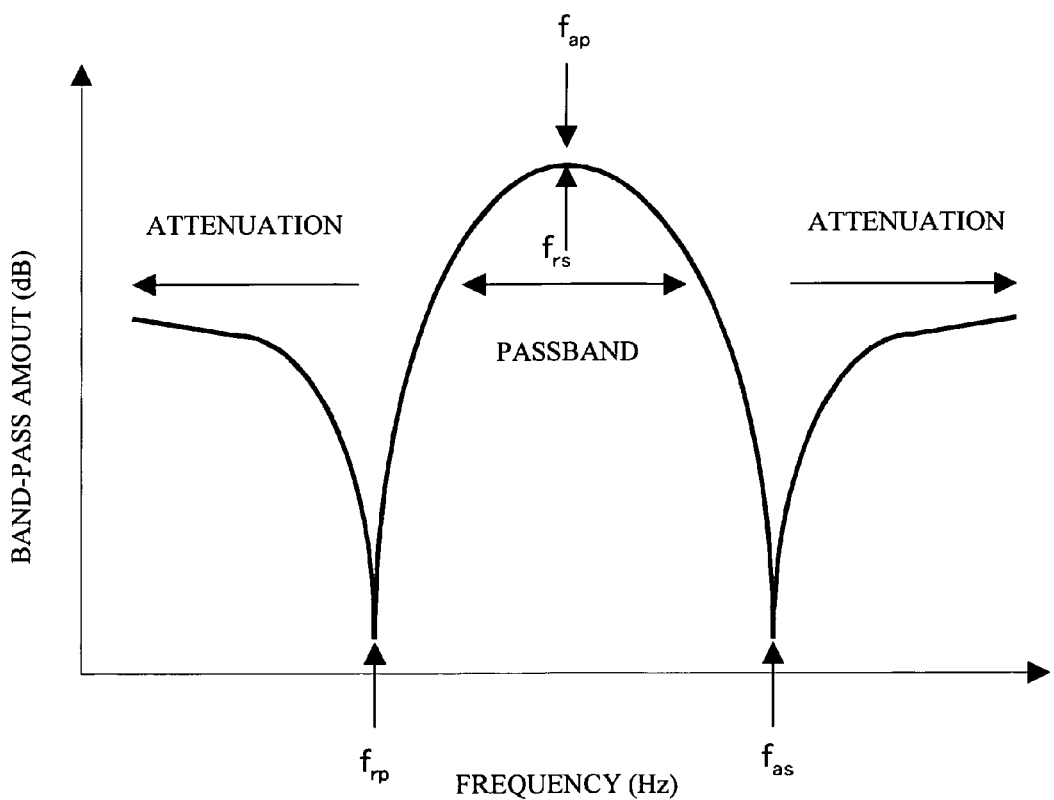
FIG. 5B shows passband characteristic of the one-stage ladder type filter.
Figure 6A:
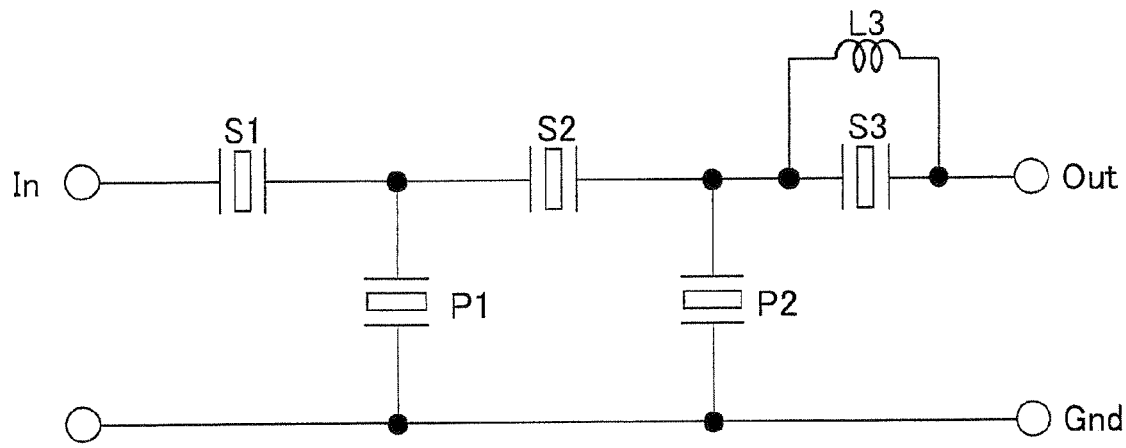
FIG. 6A shows a configuration of the filter of conventional technique 1.
Figure 6B:
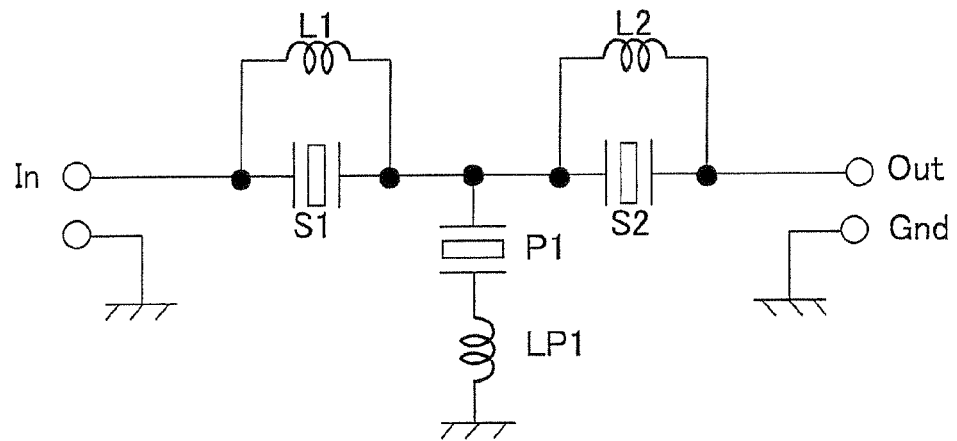
FIG. 6B shows a configuration of the filter of conventional technique 2.
Figure 7:
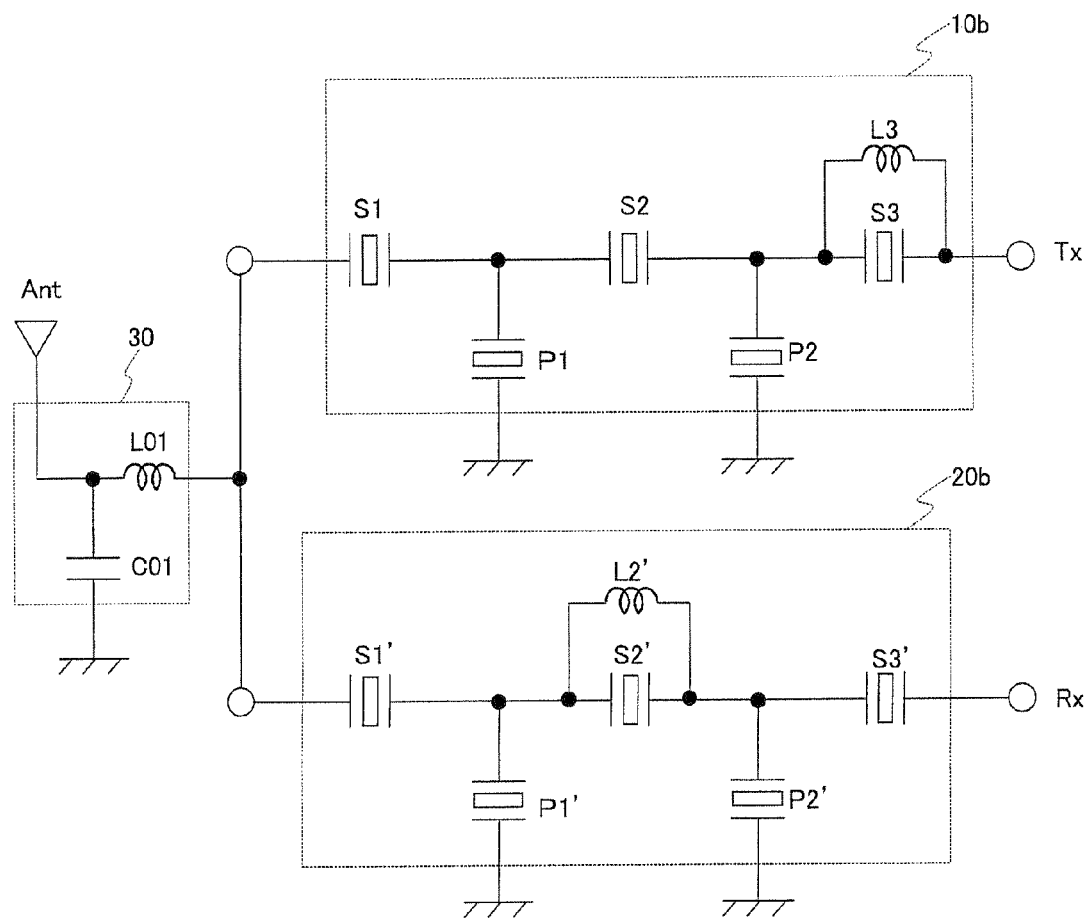
FIG. 7 shows a configuration of the filter of conventional technique 3.

A description has been given of the case where the piezoelectric thin film resonators are employed as the series resonators S1' through S4' and the parallel resonators P1' and P2'. The piezoelectric thin film resonators shown in FIG. 1A and FIG. 1B may be used. In addition, an elastic boundary wave resonator shown in FIG. 2 may be used. The afore-described resonators have a high Q-value, and enables downsizing and lower costs. Therefore, it is possible to provide a high-performance, small-sized, and low-cost filter.

Figure 35A:
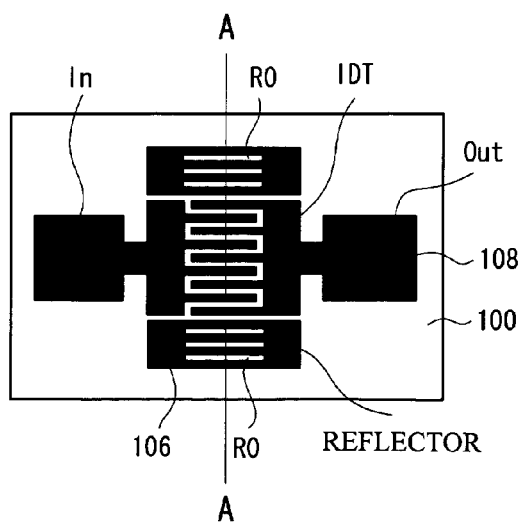
FIG. 35A is a top view of an elastic boundary wave device.
Figure 35B:
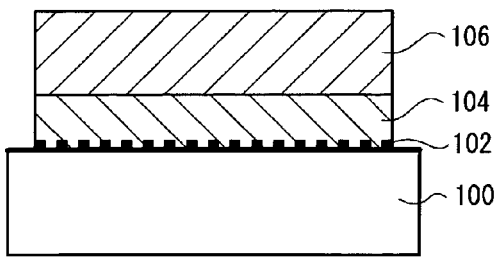
FIG. 35B is a cross-sectional view taken along a line A-A shown in FIG. 35A.

FIG. 35A and FIG. 35B are views showing an elastic boundary wave resonator. Referring to a top view of the elastic boundary wave resonator shown in FIG. 35A, an IDT and reflectors R0 at both sides thereof are provided on a piezoelectric substrate 100. Input/output pads 108 serving as an output terminal Out and an input terminal In are connected to the IDT. FIG. 35B is a cross-sectional view taken along a line A-A shown in FIG. 35A. Electrodes 102 made of, for example, copper are provided on the piezoelectric substrate 100, and, for example, a silicon oxide film 104 and an aluminum oxide 106 serving as two insulation films are provided on the electrodes 102. The resonance frequency can be determined by the propagation velocity of the elastic wave and the cycle of the electrodes 102.

Tenth Exemplary Embodiment

Figure 36:
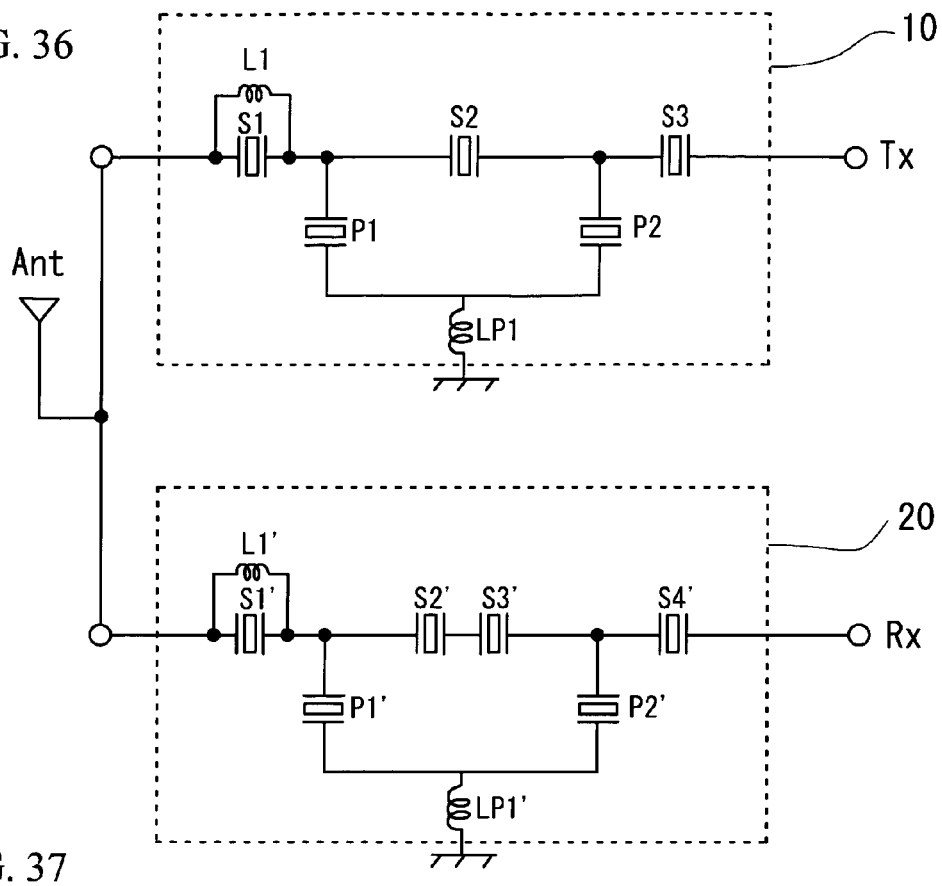
FIG. 36 is a circuit diagram of the duplexer in accordance with a tenth exemplary embodiment of the present invention.
Figure 37:
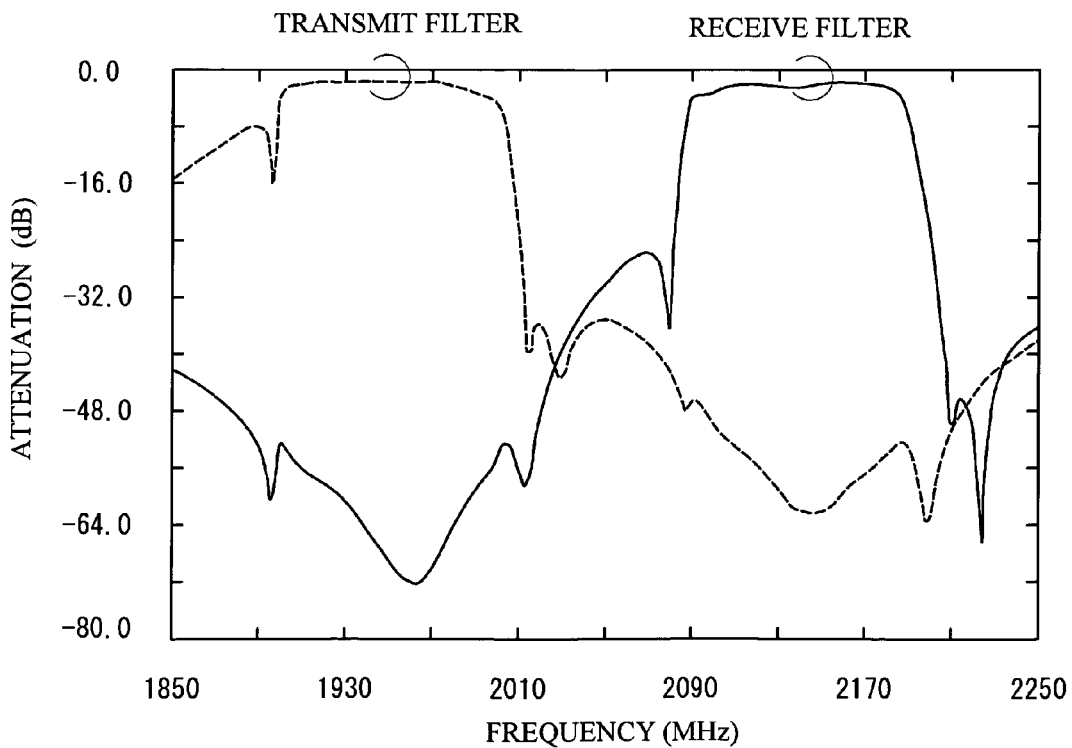
FIG. 37 is a view showing the passband characteristics of the duplexer in accordance with the tenth exemplary embodiment.

A tenth exemplary embodiment is an example of a duplexer formed by using the filters employed in the fifth through ninth exemplary embodiment. FIG. 36 is a circuit diagram of the duplexer in which the filter C employed in the fifth exemplary embodiment is used for the receive filter 20 and the filter F employed in the sixth exemplary embodiment is used for the transmit filter 10. The transmit filter 10 is connected between a common terminal Ant and the transmitting terminal Tx, and the receive filter 20 is connected between the common terminal Ant and the receiving terminal Rx. FIG. 37 is a view showing the passband characteristics of the transmit filter 10 and the receive filter 20 employed in the tenth exemplary embodiment. The duplexer employed in the tenth exemplary embodiment is not limited to the configuration of FIG. 36. Alternative configuration may be employed, and alternative example thereof includes two filters 10 and 20 connected to the common terminal Ant, in which at least one of the filters 10 and 20 is any one of the filters employed in the fifth through ninth embodiments. In this manner, it is possible to realize the same effect in the duplexer as those of the duplexers employed in the fifth through ninth exemplary embodiments.

The receive filter 20 employed in the fifth exemplary embodiment may be used for the filter C, whereas the receive filter 20 is the filter on the higher frequency side out of the filters 10 and 20. This makes it possible to increase the attenuation of the transmit filter 10 in the passband of the receive filter 20, which is the opposite filter located on a higher frequency side of the passband of the transmit filter 10. In particular, as shown in FIG. 37, in a case where the passbands are apart from each other in such a manner that the skirt of the passband in the transmit filter 10 and that of the receive filter 20 are not overlapped, it is effective that the attenuation pole can be formed on the opposite passband.

In addition, in a similar manner as the first exemplary embodiment, it may be configured such that in the ladder type filter used for any one of the two filters 10 and 20, the resonator arranged closest to the common terminal Ant is the series resonator S1 or S1', and the first inductor L1 or L1' is connected in parallel with the series resonator S1 or S1'. The two filters 10 and 20 are both ladder type filters. In each of the filters 10 and 20, the resonator arranged closest to the common terminal Ant is the series resonator S1 or S1', and the first inductor L1 or L1' is connected in parallel with the series resonator S1 or S1'. In such configuration, in a similar manner as described in the first exemplary embodiment, the matching circuit can be eliminated. It is also possible to reduce the loss in the passband of the filter and to increase the attenuation in the opposite passband.

Eleventh Exemplary Embodiment

A description will now be given of a problem of a case where the duplexer employed in the tenth exemplary embodiment is formed by the stacked package. As described with reference to FIG. 34B employed in the ninth exemplary embodiment, the second inductors LP1 and LP1' are formed of the line patterns 115 and the vias 109 in the stacked package 110. In the base layers 111 and 112 of the stacked package 110, there are provided: the line patterns 115 that connect the filter chip 118 and the IPD chip 119; the vias 109; and the footpads 114, which are also used as signal lines or ground lines. This results in an addition of the parasitic capacitance to the common terminal Ant, thereby shifting the impedance viewed from the common terminal Ant to the capacitive side. This deteriorates the matching.

Figure 38:
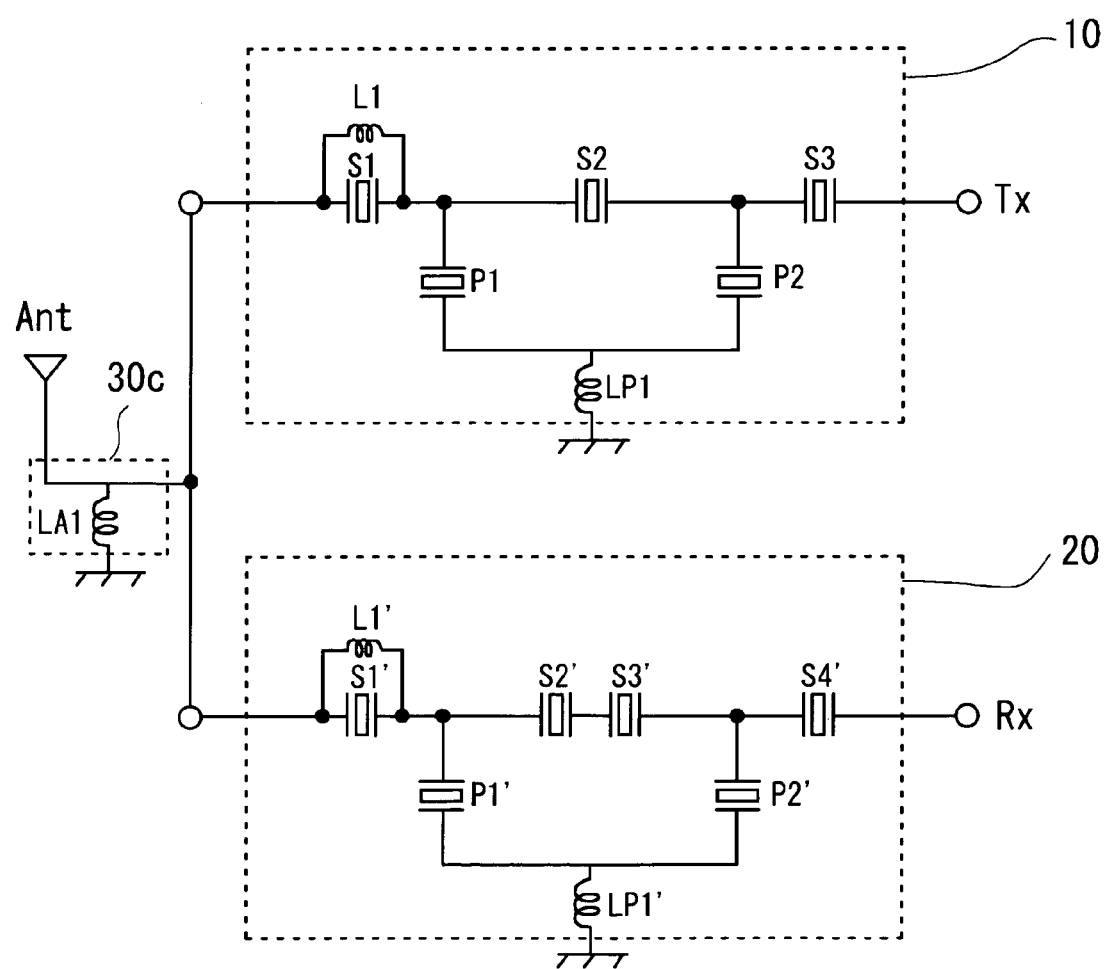
FIG. 38 is a circuit diagram of the duplexer in accordance with an eleventh exemplary embodiment of the present invention.
Figure 39A:
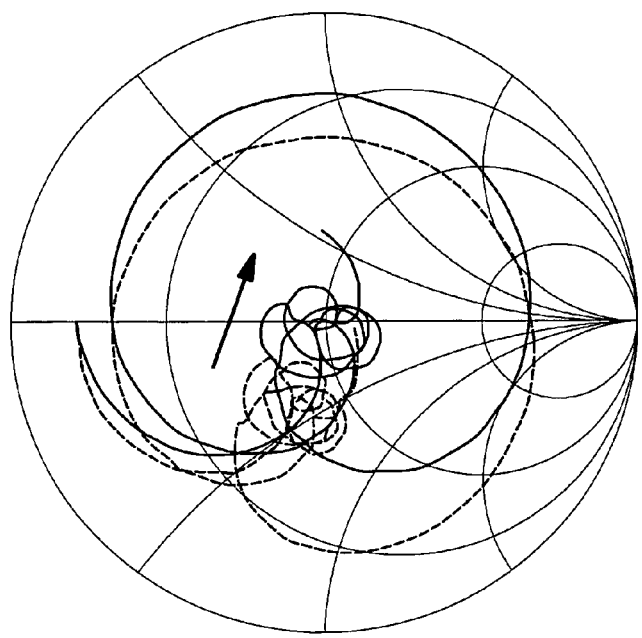
FIG. 39A is a Smith Chart showing impedances viewed from a common terminal of the duplexer used in the tenth and eleventh exemplary embodiments.
Figure 39B:
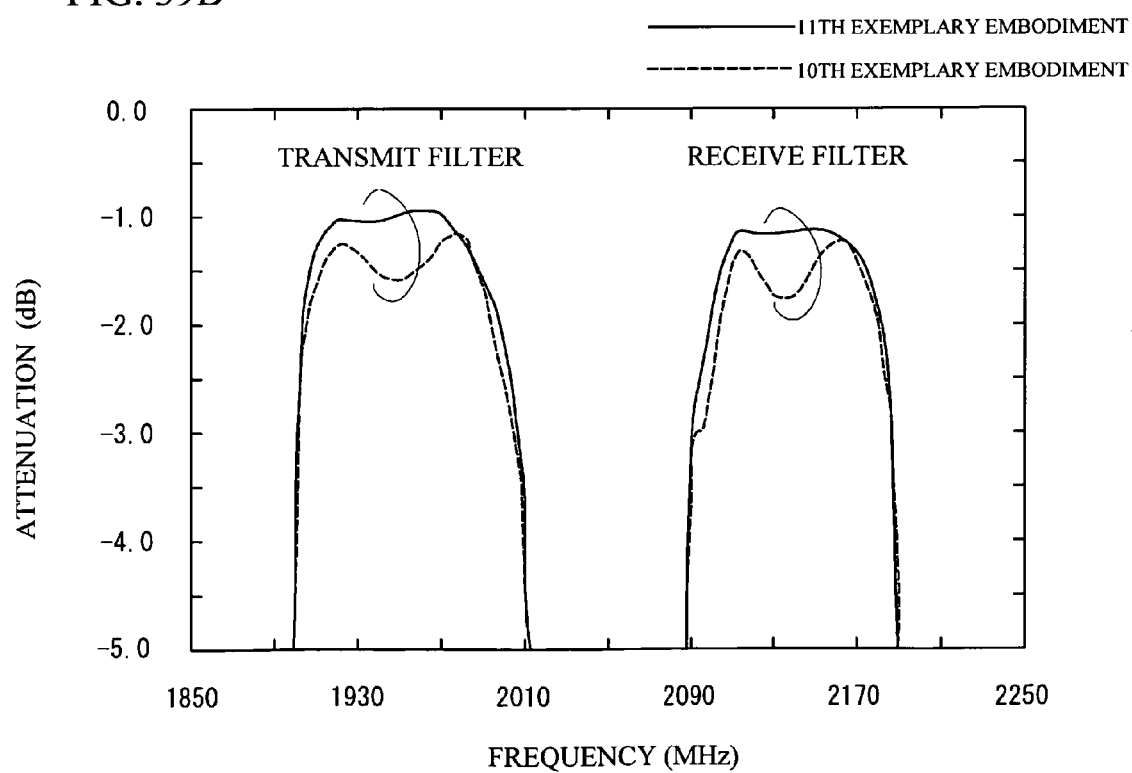
FIG. 39B is an enlarged view of the passbands.

FIG. 38 is a circuit diagram of the duplexer employed in an eleventh exemplary embodiment. A third inductor LA1 of 7 nH serving as a matching circuit 30c is connected between the common terminal Ant and ground. In the eleventh exemplary embodiment, the same components and configurations as those of FIG. 36 used in the tenth exemplary embodiment have the same reference numerals. FIG. 39A is a Smith Chart showing the impedances viewed from the common terminal Ant used in the tenth and eleventh exemplary embodiments. As shown in FIG. 39A, the impedance is shifted to the capacitive side in the tenth exemplary embodiment. However, the impedance is shifted to the inductive side and improved as indicated by an arrow in the eleventh exemplary embodiment, as compared to the impedance of the tenth exemplary embodiment. FIG. 39B is an enlarged view of the passbands of the filters 10 and 20. In the eleventh exemplary embodiment, the impedance of each filter 10 or 20 viewed from the common terminal is improved, thereby improving the insertion loss in the passbands as shown in FIG. 39B.

In addition, the matching circuit 30c is a high-pass filter (HPF). Therefore, this can improve the attenuation, in particular, closer to DC of the filter 10 or 20 on the lower frequency side. For example, the attenuations at 100 MHz of the duplexers employed in the tenth and eleventh exemplary embodiments are approximately 35 dB and 55 dB respectively. In this manner, preferably, the matching circuit 30c that functions as a high-pass filter is provided between the common terminal Ant and at least one of the two filters 10 and 20. This makes it possible to increase the attenuation closer to DC of the filter 10 or 20 in which the matching circuit is added.

Further, the matching circuit 30c can be formed of the third inductor LA1 in the eleventh exemplary embodiment, thereby enabling the low insertion, downsizing, and low cost. Preferably, in a similar manner as the second exemplary embodiment, the capacitance of the series resonator S1 (S1'), with which the first inductor L1 (L1') is connected in parallel, arranged closest to the common terminal Ant is smaller than those of the series resonators S2 and S3 (alternatively S2' through S4'). This easily enables the impedance matching viewed from the common terminal Ant. The matching circuit 30c that functions as a high-pass filter is not limited to that employed in the eleventh exemplary embodiment. For example, the matching circuit in which one or more capacitors are connected in series and one or more inductors are connected in parallel may be employed.

Twelfth Exemplary Embodiment

Figure 40A:
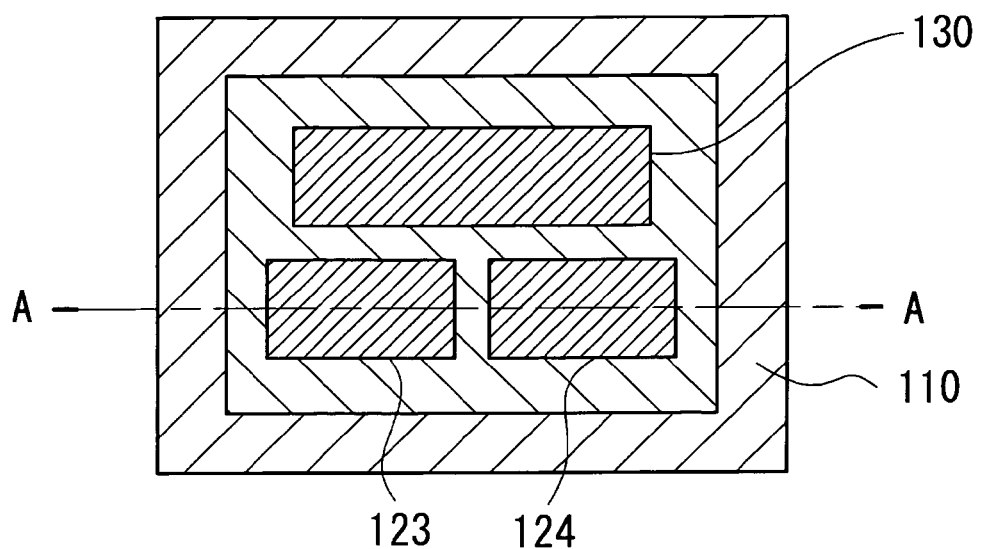
FIG. 40A is a top view of the duplexer in accordance with a twelfth exemplary embodiment (a cap is not shown)
Figure 40B:
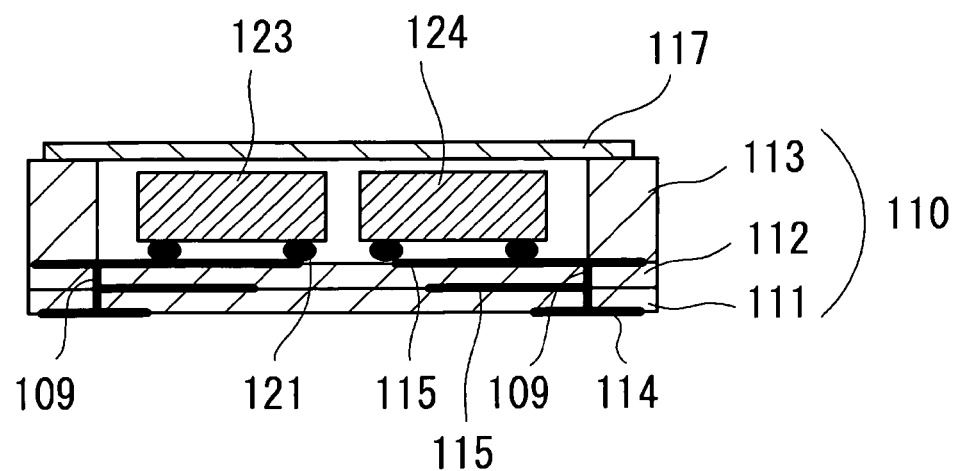
FIG. 40B is a cross-sectional view taken along a line A-A shown in FIG. 40A.

A twelfth exemplary embodiment is an example in which the duplexer employed in the eleventh exemplary embodiment is mounted on a stacked package. FIG. 40A is a top view of the duplexer in accordance with a twelfth exemplary embodiment (the cap is not shown). FIG. 40B is a cross-sectional view taken along a line A-A shown in FIG. 40A. On the surface of the base layer 112 of the stacked package 110, an IPD chip 130, a transmit filter chip 124, and a receive filter chip 123 are face-down mounted. In the twelfth exemplary embodiment, the same components and configurations as those of FIG. 34 have the same reference numerals and a detailed explanation will be omitted.

Figure 41:
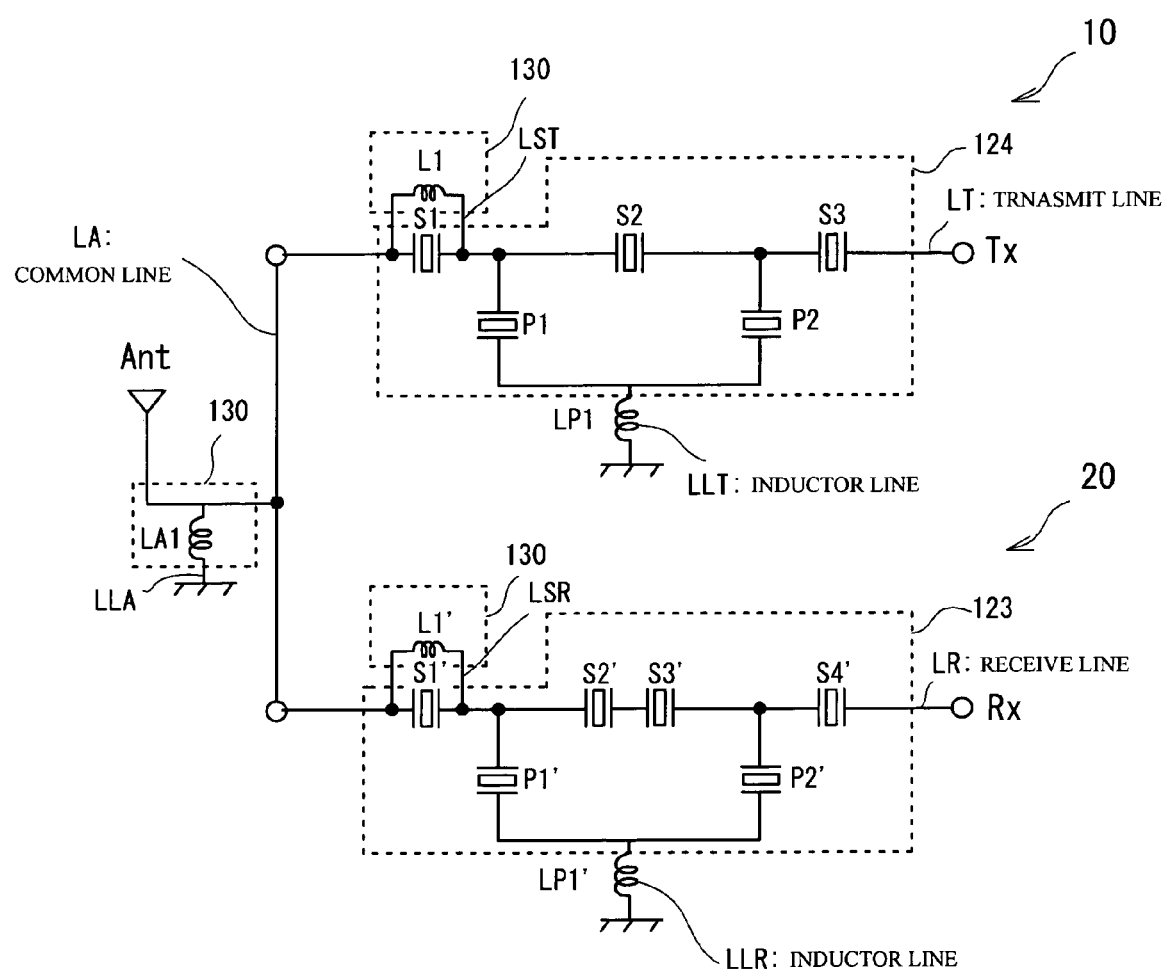
FIG. 41 is a circuit diagram of the duplexer in accordance with a twelfth exemplary embodiment of the present invention.

FIG. 41 is a diagram showing the relationship between the circuit components and the line patterns provided in the stacked package. The series resonators S1 through S3 and the parallel resonators P1 and P2 of the transmit filter 10 are formed in the transmit filter chip 124, and the series resonators S1' through S4' and the parallel resonators P1' and P2' are formed in the receive filter chip 123. In addition, there are provided in the IPD chip 130: the first inductor L1 of the transmit filter 10; and the first inductor L1' and the third inductor LA1 of the receive filter 20. There are also provided a common line LA that connects the common terminal Ant and the transmit filter 10 and the receive filter 20; a transmission line LT that connects the transmit filter 10 and the transmitting terminal Tx; a receive line LR that connects the receive filter 20 and the receiving terminal Rx; inductor lines LLT and LLR respectively composing the second inductors LP1 and LP1'; a matching inductor ground line LLA that connects the third inductor LA1 of the matching circuit 30c and ground; and extracting lines LST and LSR that are respectively extracted from the first inductors L1 and L1'.

A description will now be given of components of the respective layers in the stacked package 110 of a duplexer a employed in the twelfth exemplary embodiment, with reference to FIG. 42A through FIG. 42D. In the drawings, the patterns in black are conductive ones. Referring to FIG. 42A, there is provide an opening in the cavity layer 113 so as to form a cavity, and a conductive cap 117 (not shown) is mounted on the opening. A conductive seal ring 122 is provided on the surface onto which the cap 117 is mounted.

Referring to FIG. 42B, there are provided on the surface (die-attach surface) of the base layer 112: lines patterns formed by a conductive metal material; bump pads BM; and conductive patterns such as vias VIA, and the like. Then, the pads of the chips 123, 124, and 130 are electrically coupled to the bump pads BM provided on the surface of the base layer 112 by the bumps 121. A conductive material such as a metal is embedded in the vias VIA that extend through the base layers 111 and 112. The line pattern is a conductive one to connect the bump pads BM or the vias VIA. The receive filter chip 123, the transmit filter chip 124, and the IPD chip 130 mounted on the surface of the base layer 112 are indicated by dotted lines. Referring to FIG. 42C, the line patterns and the vias VIA are formed on the surface of the base layer 111 in a similar manner as the surface of the base layer 112. FIG. 42D is a perspective view of the backside of the base layer 111 from the surface thereof. Referring to FIG. 42D, on the backside of the base layer 111, there are provided: a common footpad FA of the common terminal Ant composed of a conductive material; a transmitting footpad FT serving as the transmitting terminal Tx; a receiving footpad FR serving as the receiving terminal Rx; and ground footpads FG serving as ground terminals.

Referring to FIG. 42A through FIG. 42D and FIG. 40A and FIG. 40B, the common footpad FA is connected to the common line LA provided on the base layer 112, through the vias VIA formed in the base layers 111 and 112. The common line LA is connected to the first inductor L1 and L1', and one end of the third inductor LA1, one end of the series resonator formed in the transmit filter chip 124, and one end of the series resonator S1' formed in the receive filter chip 123. The other end of the first inductor L1 and the other end of the first inductor L1' are respectively connected through the extracted lines LST and LSR formed in the base layer 112, to the other end of the series resonator S1 formed in the transmit filter chip 124 and to the other end of the series resonator S1' formed in the receive filter chip 123. Accordingly, the first inductors L1 and L1' are respectively connected in parallel with the series resonators S1 and S1'. The other end of the third inductor LA1 is coupled through the matched inductor ground line LLA formed in the base layer 112, and the via VIA formed in the base layers 111 and 112, to the ground footpad FG. Accordingly, the third inductor LA1 is connected between the common terminal Ant and ground.

The series resonator S3 of the transmit filter 10 is connected through the transmission line LT formed in the base layer 112 and the vias VIA formed in the base layers 111 and 112, to a transmitting footpad FT. The ground sides of the parallel resonators P1 and P2 of the transmit filter 10 are commonly connected in the transmit filter chip 124, and is further connected through the inductor line LLT1 and the via VIA formed in the base layer 112 and the inductor line LLT2 and the via VIA formed in the base layer 111, to the ground footpad FG. The inductor lines LLT1 and LLT2 compose the second inductor LP1. Accordingly, the second inductor LP1 is connected between the ground sides of the parallel resonators P1 and P2 and ground.

The series resonator S4' of the receive filter 20 is connected through the receive line LR formed in the base layer 112 and the vias VIA formed in the base layers 111 and 112, to the receiving footpad FR. The ground sides of the parallel resonators P1' and P2' of the receive filter 20 are commonly connected in the receive filter chip 123, and is further connected through the inductor line LLR formed in the base layer 112 and the vias VIA formed in the base layers 111 and 112, to the ground footpad FG. The inductor line LLR composes the second inductor LP1'. Accordingly, the second inductor LP1' is connected between the ground sides of the parallel resonators P1' and P2' and ground.

Figure 43A:
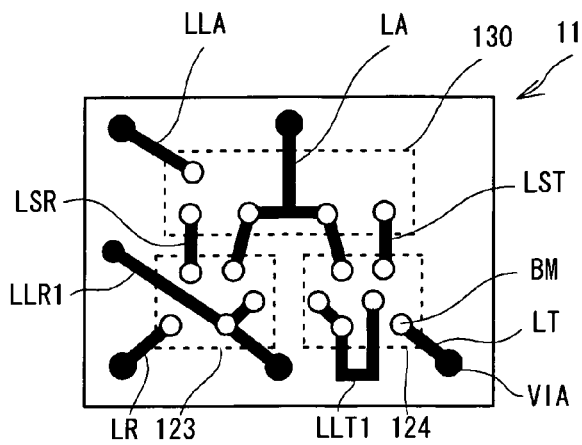
FIG. 43A and FIG. 43B show respective layers in a stacked package of a duplexer b employed in the twelfth exemplary embodiment.
Figure 43B:
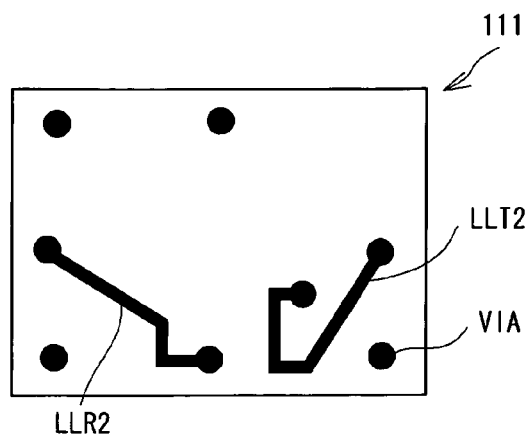

FIG. 43A and FIG. 43B are views showing surfaces of the base layers 111 and 112 of a duplexer b employed in the twelfth exemplary embodiment. As compared to the surfaces of the base layers 111 and 112 of the duplexer a shown in FIG. 42B and FIG. 42C, inductor lines LLR1 and LLR2 that correspond to the receive filter 20 are respectively provided on the base layers 111 and 112 between the common line LA ad the receive line LR. In addition, the inductor lines LLR1 and LLR2 are provided between the receive line LR and the transmission line LT on the base layers 111 and 112. Further, the inductor lines LLR1 and LLR2 are connected to two ground footpads FG formed on the backside of the base layer 111. In the duplexer b, the same components and configurations as those of the duplexer a have the same reference numerals.

Figure 44:
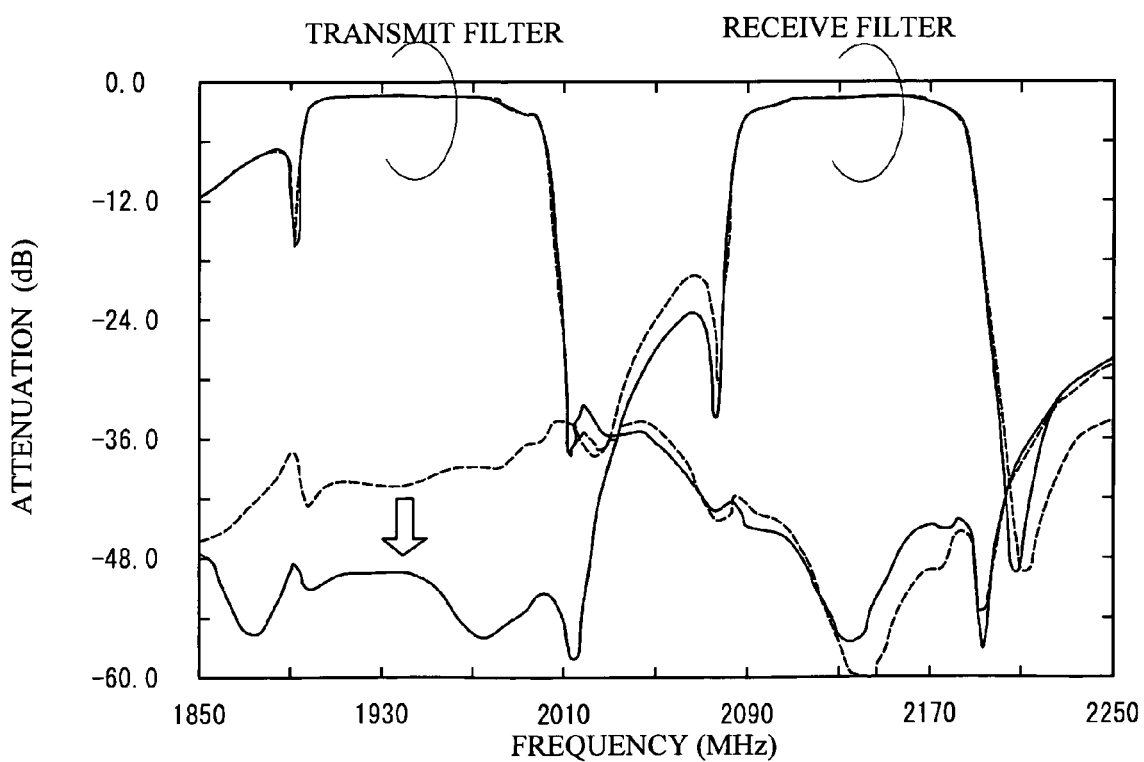
FIG. 44 shows the passband characteristics of the duplexer a and the duplexer b.

In the duplexer b, the electromagnetic coupling component can be reduced in the stacked package 110 more than the duplexer a. The electromagnetic couplings of the inductor line LLR and the transmission line LT in the receive filter 20 are respectively 2.6% and 0.4% in the duplexer a and in the duplexer b. The electromagnetic couplings of the inductor line LLR and the common line LA are respectively 4.5% and 2.9% in the duplexer a and the duplexer b. The bridging capacitances of the receive line LR and the common line LA are respectively 2.7 fF and 0.9 fF in the duplexer a and the duplexer b. FIG. 44 shows the passband characteristics of the duplexer a and the duplexer b. It is possible to greatly improve the attenuation in the transmit bandwidth of the receive filter 20 in the duplexer b.

In the twelfth exemplary embodiment, by providing the inductor line LLR or LLT between one of the receive line LR and the transmission line LT and the common line LA, the electromagnetic coupling of the inductor line LLR and the transmission line LT and the bridging capacitance between the receive line LR and the common line LA can be reduced. Also, the attenuation in the opposite bandwidth of the opposite filter can be increased. The inductor line LLR or LLT may be provided between the receive line LR and the transmission line LT. This can reduce the electromagnetic coupling and the bridging capacitance between the transmission line LT and the receive line LR, thereby increasing the attenuation in the opposite bandwidth of the own filter.

It is preferable that the inductor line LLR or LLT should be provided in multiple layers (base layers 111 and 112) of the stacked package 110. This can further reduce the electromagnetic coupling between the inductor line LLR and the transmission line LT and the common line LA and the bridging capacitance between the receive line LR and the common line LA. It is also preferable that the inductor line LLR or LLT should be formed in the stacked package 110 and connected to multiple ground footpads FG to connect ground. This can further reduce the electromagnetic coupling between the inductor line LLR and the transmission line LT and the common line LA and the bridging capacitance between the receive line LR and the common line LA.

It is preferable to reduce the electromagnetic coupling between the inductor line LLR and the transmission line LT and the common line LA and the bridging capacitance between the receive line LR and the common line LA, in a case where the inductor line LLR is provided between the receive line LR and the common line LA. For example, the electromagnetic coupling between the inductor line LLR and the transmission line LT and the common line LA and the bridging capacitance between the receive line LR and the common line LA can be reduced by providing at least the inductor line LLR in a portion of arbitrary line connecting arbitrary point in the receive line LR and arbitrary point in the common line LA. It is also preferable that the inductor line LLR should be provided in all straight lines connecting arbitrary point in the receive line LR and arbitrary point in the common line LA. This can further reduce the electromagnetic coupling between the inductor line LLR and the transmission line LT and the common line LA and the bridging capacitance between the receive line LR and the common line LA. The same effect is obtainable in a case where the inductor line LLR is provided between the receive line LR and the transmission line LT, and in a case where the inductor line LLT is provided between the transmission line LT and the common line LA.

In the twelfth exemplary embodiment, in addition to the IPD chip 130, a chip inductor may be used for the first inductors L1 and L1' and the third inductor LA1. The chip inductor may be mounted on the surface of the base layer 112 of the stacked package 110, and may be provided outside of the stacked package 110. In the twelfth exemplary embodiment, a description has been given of the stacked package 110 serving as the mounting portion. However, it is only necessary that the mounting portion has a function of mounting the receive filter chip 123 or the transmit filter chip 124, and a substrate such as a stacked substrate may be employed.

Thirteenth Exemplary Embodiment

Figure 45:
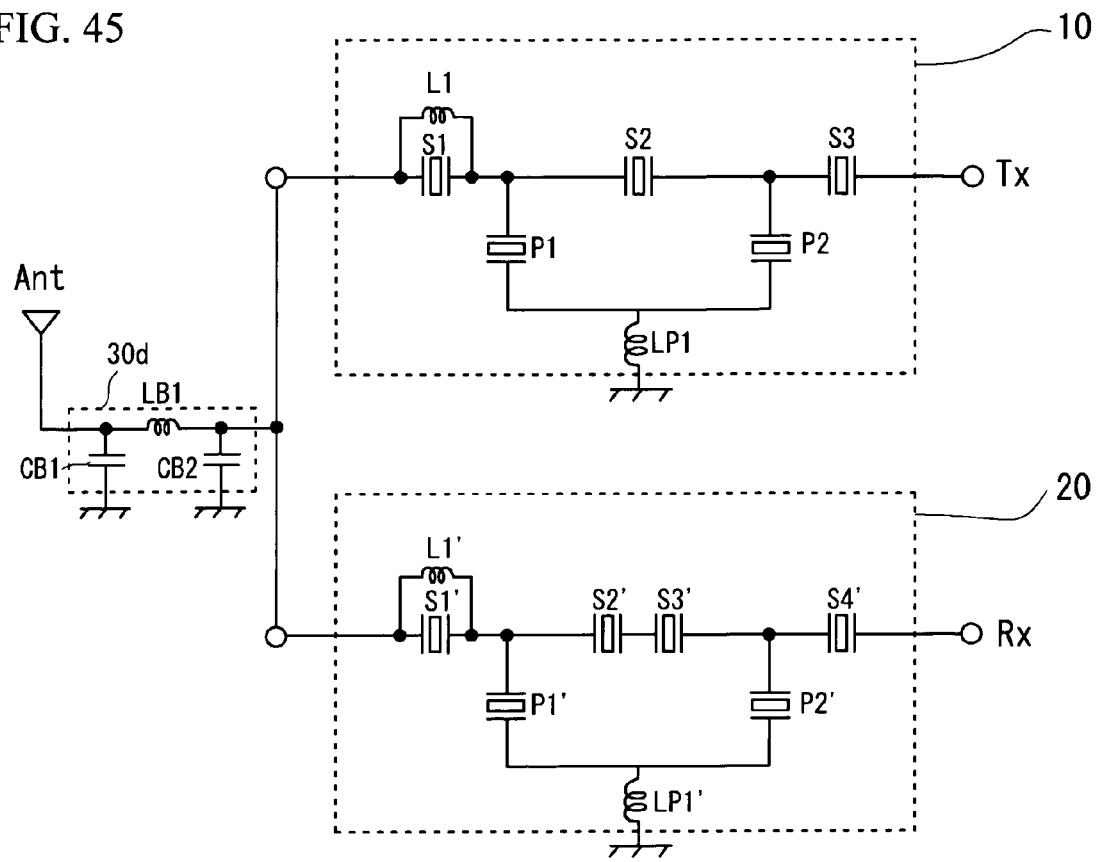
FIG. 45 is a circuit configuration of the duplexer in accordance with a thirteenth exemplary embodiment.
Figure 46:
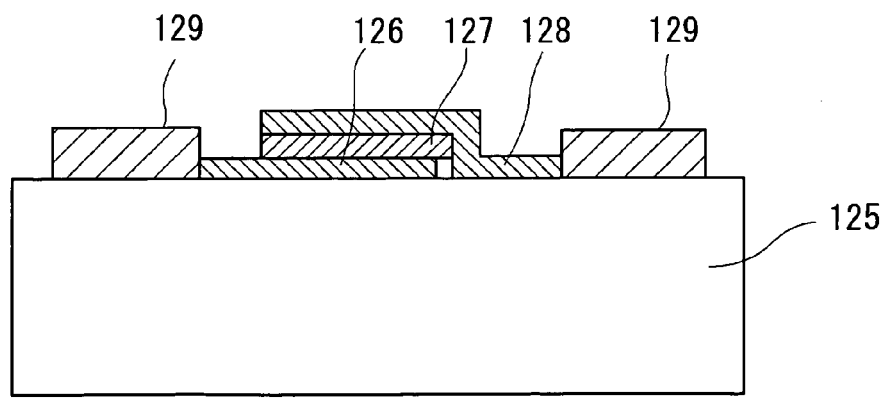
FIG. 46 is a cross-sectional view showing an example of a capacitor formed in the IPD.

A thirteenth exemplary embodiment is an example in which the matching circuit having a function of a low-pass filter. In FIG. 45, a π-type C-L-C circuit serving as a matching circuit 30d is connected to the common terminal Ant. That is, the inductor LB1 of 3.6 nH is connected in series between the common terminal Ant and the transmit filter 10 and the receive filter 20, a capacitor CB1 of 1.1 pF is connected in parallel on the common terminal Ant side of the inductor LB1, and a capacitor CB2 of 0.7 pF is connected in parallel on the side of the transmit filter 10 and the receive filter 20. The inductor LB1 and the capacitors CB1 and CB2 may be formed of the same IPD as the first inductors L1 and L1'. In the thirteenth exemplary embodiment, the same components and configurations as those in FIG. 36 described in the eleventh exemplary embodiment have the same reference numerals. FIG. 46 is a cross-sectional view showing an example of a capacitor formed in the IPD. On a substrate 125 of quartz or the like, there are deposited: a lower electrode 126; a dielectric film 127 of, for example, a silicon oxide or the like; and an upper electrode 128, to form a capacitor. The capacitor is connected to a terminal 129.

Figure 47A:
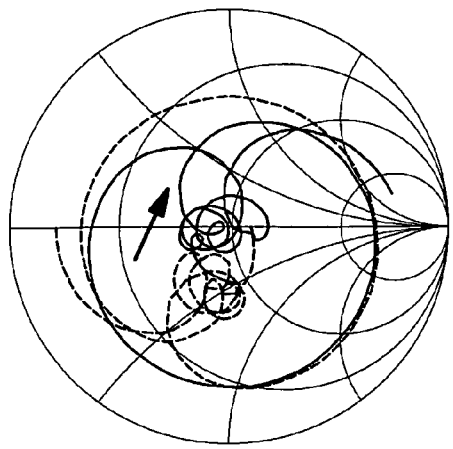
FIG. 47A is a Smith Chart showing impedances of the filter viewed from the common terminals Ant used in the tenth and thirteenth exemplary embodiments.
Figure 47B:
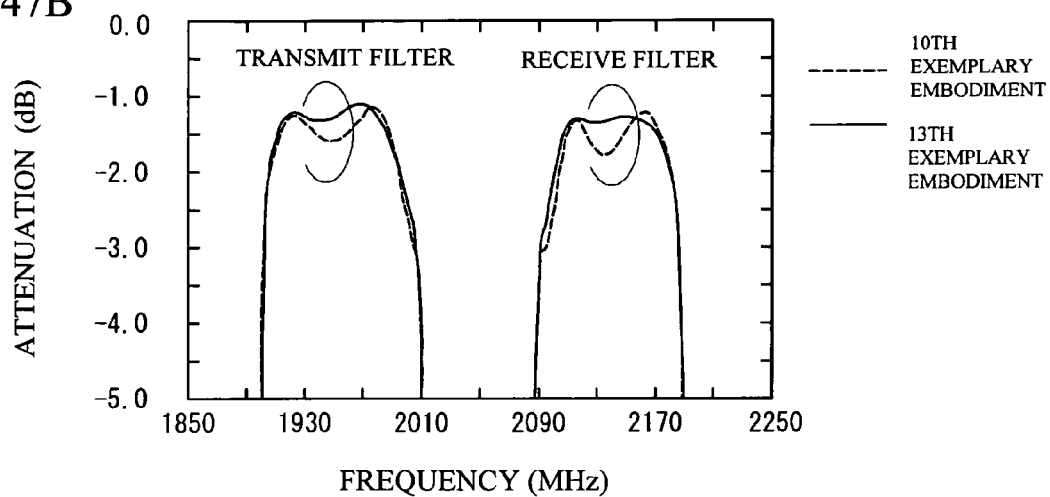
FIG. 47B is an enlarged view of the passbands of the filters.

FIG. 47A is a Smith Chart showing impedances of the filter viewed from the common terminals Ant used in the tenth and thirteenth exemplary embodiments. Referring to FIG. 47A, in the tenth exemplary embodiment, the impedance is shifted to the capacitive side. However, in the thirteenth exemplary embodiment, the impedance is shifted to the inductive side and improved as indicated by an arrow more than that of the tenth exemplary embodiment. FIG. 47B is an enlarged view of the passbands of the filters 10 and 20. In the thirteenth exemplary embodiment, the impedance viewed from each filter 10 or 20 is improved, thereby improving the insertion loss in the passband as shown in FIG. 47B. Here, it is preferable to make the capacitance of the capacitor CB1 arranged on the side of the common terminal Ant greater than that of the capacitor CB2 in the π-type C-L-C circuit, in a similar manner as the thirteenth exemplary embodiment. This makes it possible to easily match the matching circuit 30d. Accordingly, it is possible to further reduce the loss and increase the attenuation of higher harmonic.

Figure 47C:
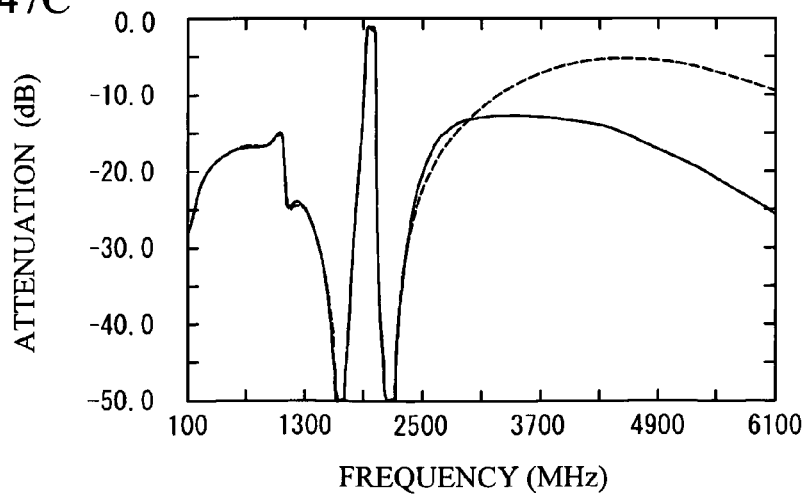
FIG. 47C is a view showing the passband characteristic in a wide band of the transmit filter.

FIG. 47C is a view showing the passband characteristic in a wide band of the transmit filter 10. In the thirteenth exemplary embodiment, the attenuation is greater on the higher frequency side. This is because the matching circuit 30d has a function of low-pass filter (LPF). The attenuation on the higher frequency side can be increased, thereby improving the attenuation of higher harmonic. In this manner, preferably, the matching circuit 30d is provided to function as a low-pass filter between the common terminal Ant and at least one of the two filters 10 and 20. This enables the attenuation of higher harmonic to be suppressed in the filter 10 or 20 in which the matching circuit is added.

The matching circuit 30d serving as a low-pass filter is not limited to the example used in the thirteenth exemplary embodiment. For example, the matching circuit, in which one or more inductors are connected in series and one or more capacitors are connected in parallel, may be used. However, for low insertion loss, downsizing, and low cost, it is desirable that the number of elements should be smaller. Accordingly, in addition to the π-type C-L-C circuit, it is preferable to employ a C-L circuit, namely, a circuit in which an inductor is connected in series between the common terminal Ant and the transmit filter 10 and the receive filter 20, and a capacitor is connected in parallel on the side of the common terminal Ant of the inductor, and a L-C circuit, namely a circuit in which an inductor is connected in series between the common terminal Ant and the transmit filter 10 and the receive filter 20, and a capacitor is connected in parallel on the side of the filter of the inductor.

In the eleventh through thirteenth exemplary embodiments, the IPD can be used for the inductor and capacitor that compose the matching circuit 30c or 30d, in which the third inductor LA1, the inductor LB1, and the capacitors CB1 and CB2, and the like are provided. Accordingly, it is possible to provide the duplexer that enables high performance and downsizing. The afore-described inductor or capacitor may employ the chip element such as a chip inductor or chip capacitor. As stated, it is possible to provide a high-performance and low-cost duplexer by employing the chip element.

Fourteenth Exemplary Embodiment

Figure 48:
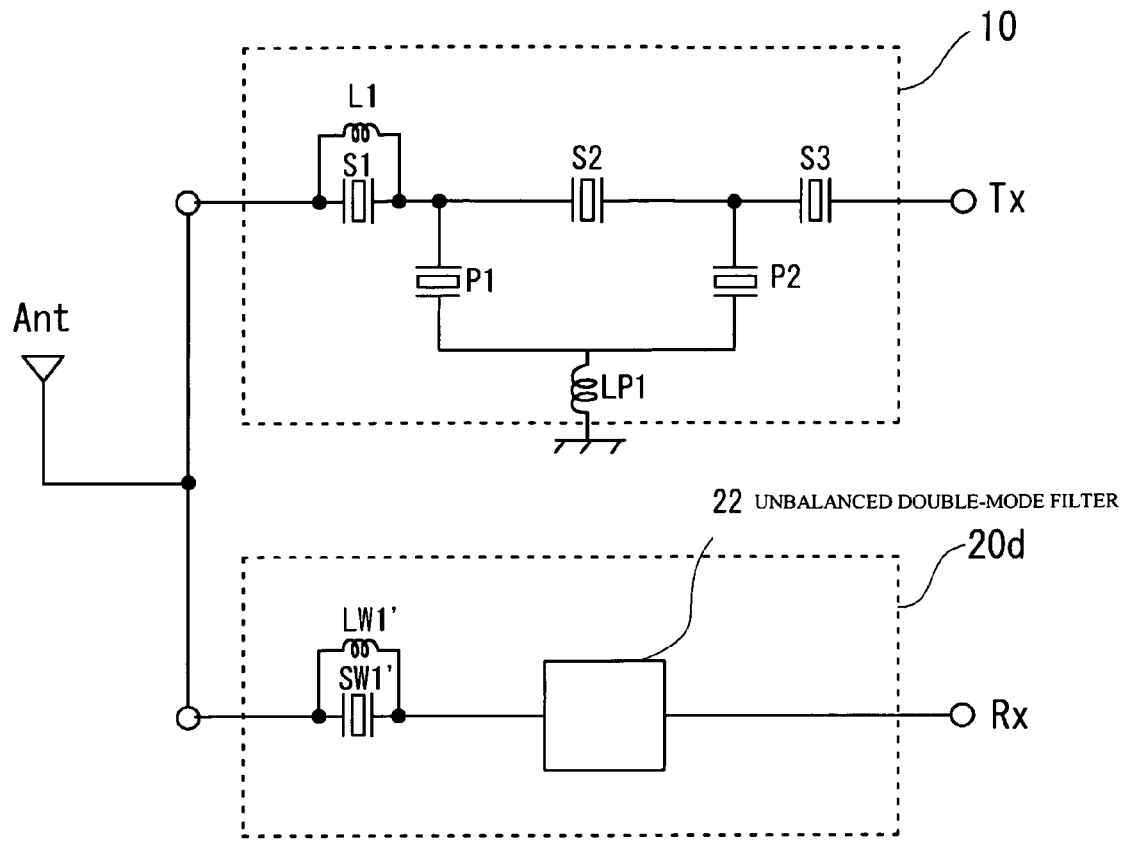
FIG. 48 is a circuit diagram of the duplexer in accordance with a fourteenth exemplary embodiment.

A fourteenth exemplary embodiment is an example in which the receive filter includes an unbalanced double-mode filter. FIG. 48 is a circuit diagram of the duplexer employed in the fourteenth exemplary embodiment. As compared to the configuration of FIG. 36 used in the eleventh exemplary embodiment, there is also provided an unbalanced double-mode filter 22 between a first inductor LW1' connected in parallel with a series resonator SW1' on the side of the common terminal Ant, the series resonator SW1', and the receiving terminal Rx in the receive filter 20d.

Figure 49:
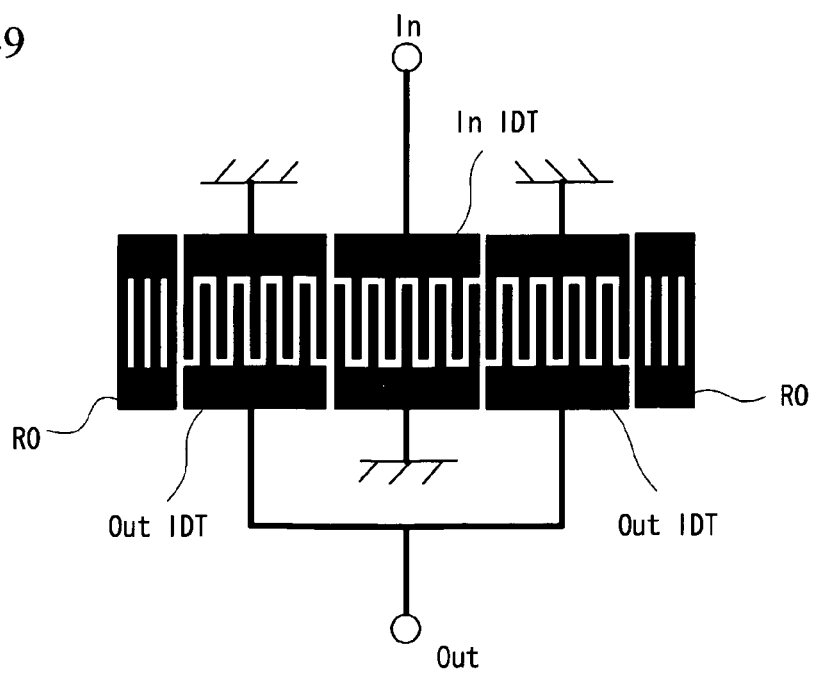
FIG. 49 is a top view of an unbalanced double-mode filter.

FIG. 49 is a top view of the unbalanced double-mode filter 22. The unbalanced double-mode filter 22 is composed of a surface acoustic wave element. Two output IDTs (Out IDT) are provided between the reflectors R0, and one input IDT (In IDT) is provided between the two output IDTs. The two output IDTs (Out IDT) have outputs having an identical phase and being commonly connected and further connected to the output terminal (Out). The input of the input IDT (In IDT) is connected to the input terminal In. In FIG. 48, the input terminal In of the unbalanced double-mode filter 22 is connected to the series resonator SW1', and the output terminal Out is connected to the receiving terminal Rx. The unbalanced double-mode filter 22 is used for the receive filter 20, thereby sufficiently retaining the attenuation in a wide bandwidth.

Fifteenth Exemplary Embodiment

Figure 50:
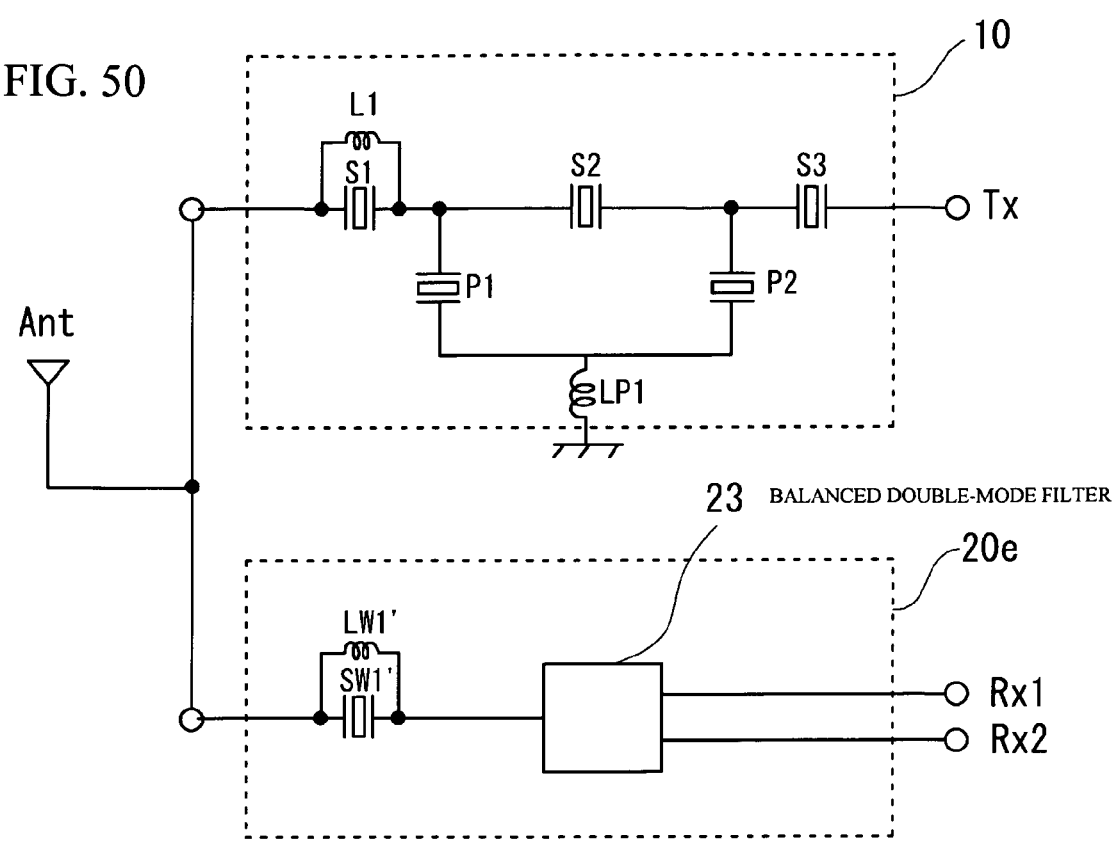
FIG. 50 is a circuit diagram of the duplexer in accordance with a fifteenth exemplary embodiment.

A fifteenth exemplary embodiment is an example in which the receive filter has a balanced double-mode filter. FIG. 50 is a circuit diagram of the duplexer employed in the fifteenth exemplary embodiment. As compared to FIG. 48 used in the fourteenth exemplary embodiment, a balanced double-mode filter 23 is employed instead of the unbalanced double-mode filter 22, and receiving terminals Rx1 and Rx2 are provided. In the fifteenth exemplary embodiment, the same components and configurations as those of FIG. 48 used in the fourteenth exemplary embodiment have the same reference numerals and a detailed explanation will be omitted.

Figure 51:
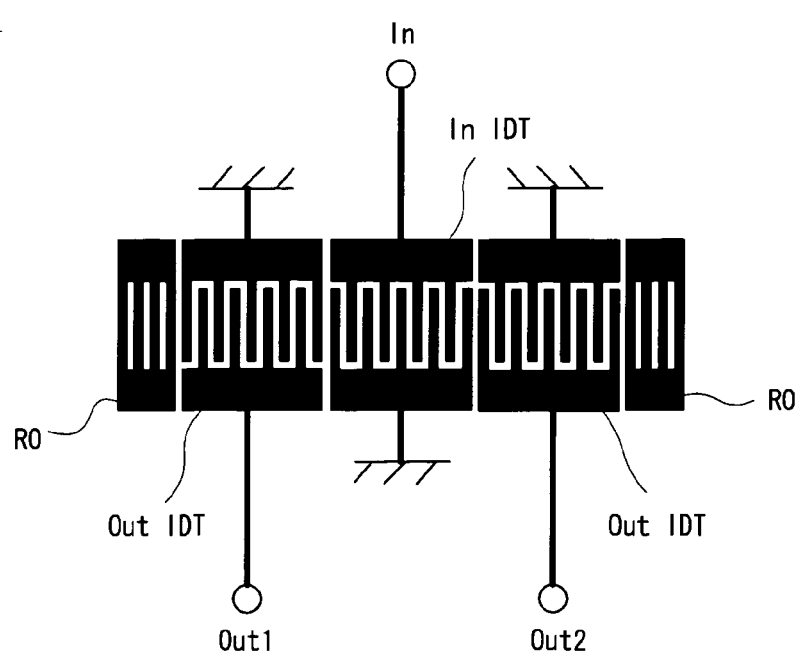
FIG. 51 is a top view of the unbalanced double-mode filter in accordance with the fifteenth exemplary embodiment.

FIG. 51 is a top view of the balanced double-mode filter 23. Unlike the unbalanced double-mode filter 22 of FIG. 49 used in the fourteenth exemplary embodiment, the two output IDTs (Out IDT) output signals having reversed phases each other. The outputs from the two output IDTs (Out IDT) are respectively connected to output terminals Out 1 and Out 2. In FIG. 51, the same components and configurations as those of FIG. 49 used in the fourteenth exemplary embodiment have the same reference numerals and a detailed explanation will be omitted. In FIG. 50, the output terminals Out 1 and Out 2 of the balanced double-mode filter 23 are respectively connected to the receiving terminals Rx1 and Rx2. Accordingly, the signals having reversed phases supplied from the output terminals Out 1 and Out 2 are output to the receiving terminals Rx1 and Rx2.

On today's mobile telephone terminals, differential signals are, in many cases, employed in the receive system, so as to suppress the common-mode noise in a high-frequency circuit. In the afore-mentioned case, a differential (balanced) low-noise amplifier or mixer, which are high-frequency devices in the receive system, is used. For this reason, when an unbalanced duplexer is used, a balun is needed to reverse the phase. In the fifteenth exemplary embodiment, no balun is necessary, because the signals of reversed phases are output from the receiving terminals Rx1 and Rx2 in the duplexer. Therefore, the receive system can be downsized and the costs thereof can be reduced.

The matching circuit 30c having a function of high-pass filter and the matching circuit 30d having a function of low-pass filter employed in the eleventh and thirteenth exemplary embodiments can be added in the duplexers employed in the fourteenth and fifteenth exemplary embodiments. In particular, the low loss, size reduction, and low cost can be realized by configuring the matching circuit with the use of the third inductor LA1 as employed in the eleventh exemplary embodiment. Also, in the fourteenth and fifteenth exemplary embodiments, a description has been given of an example in which the first inductor L1 is connected in parallel with the series resonator S1 in the transmit filter 10. However, arbitrary series resonator to which the first inductor is connected may be selected. In addition, a description has been given of a case where the inductor LW1' connected in parallel with the series resonator SW1' is connected to the double-mode filter 22 or 23 in the receive filter 20. However, arbitrary resonator may be selected to be connected to the double-mode filter 22 or 23.

Finally, various aspects of the present invention are summarized in the following.

According to one aspect of the present invention, there is provided a duplexer including: an antenna terminal; a first filter connected to the antenna terminal; and a second filter connected to the antenna terminal. At least one of the first filter and the second filter is a ladder type filter in which a parallel resonator and multiple series resonators are included, one or more first inductors are respectively connected in parallel with one or more series resonators out of the multiple series resonators, and a first inductor, out of the one or more first inductors, is connected in parallel with a series resonator, out of the multiple series resonators, arranged closest to the antenna terminal.

In the above-described duplexer, the second inductor may be connected in series with the parallel resonator and ground in the ladder type filter. It is possible to increase the attenuation in the opposite bandwidth of the own filter in the ladder type filter.

In the above-described duplexer, the second inductor connected may be series between the parallel resonator and ground may be also connected to the multiple parallel resonators. The mounting area can be reduced and the duplexer can be further downsized.

In the above-described duplexer, the first filter and the second filter may be both ladder type filters. In both first and second filters, the loss in the passband can be reduced and the attenuation in the opposite bandwidth can be increased.

In the above-described duplexer, one of the one or more first inductors may be arranged closest to the antenna terminal and connected in parallel with one of the series resonators, and at least another one of the one or more first inductors may be connected in parallel with another one of the multiple series resonators.

In the above-described duplexer, 0.3<C1/C2<1 is satisfied, where the ladder type filter may be represented by an equivalent circuit of the ladder type filter, C1 denotes a capacitance value of the series resonator arranged closest to the antenna terminal, and C2 denotes an average value of capacitance values of other series resonators in the ladder type filter. The impedances can be increased in the opposite bandwidth in the own filter, which is the ladder type filter, thereby making the degradation of loss from a singular filter small in the duplexer, which also includes an opposite filter.

In the above-described duplexer, the series resonator and the parallel resonator may be any one of a piezoelectric thin film resonator and a surface acoustic wave resonator.

According to another aspect of the present invention, there is provided a ladder type filter including: a parallel resonator; and multiple series resonators. One or more first inductors are respectively connected in parallel with one or more series resonators out of the multiple series resonators; one of the one or more first inductors is connected in parallel with one of the multiple series resonators that is arranged closest to the antenna terminal; and a second inductor is connected in series with the parallel resonator and ground.

According to another aspect of the present invention, there is provided a ladder type filter including: multiple parallel resonators; multiple series resonators; one or more first inductors respectively connected in parallel with one or more series resonators out of the multiple series resonators; and a second inductor connected in series between ground and ground sides of two or more parallel resonators commonly connected, out of the multiple parallel resonators. By providing the first inductors and the second inductor, the attenuation can be increased in the stopband with a low insertion loss.

In the above-described ladder type filter, the multiple parallel resonators may be the two or more parallel resonators. The second inductor is commonly connected to all the parallel resonators, thereby reducing a desired value of the inductor to form the attenuation pole in the stopband and further facilitating downsizing and cost reduction.

In the above-described ladder type filter, a first attenuation pole of an antiresonance point is produced on a lower frequency side of a resonance point of the one or more series resonators due to the one or more first inductors respectively connected in parallel with one or more series resonators, and the first attenuation pole may be substantially matched with a second attenuation pole, which is produced on the lower frequency side of a passband due to the second inductor connected in series between ground and ground sides of two or more parallel resonators commonly connected. The attenuation can be increased in the stopband on the lower side of the passband.

In the above-described ladder type filter, a first attenuation pole of an antiresonance point is shifted to a higher frequency side of a resonance point of the one or more series resonators due to the one or more first inductors respectively connected in parallel with one or more series resonators, and the first attenuation pole may be substantially matched with a second attenuation pole, which is produced on the higher frequency side of a passband due to the second inductor connected in series between ground and ground sides of two or more parallel resonators commonly connected. The attenuation can be increased in the stopband on the lower side of the passband.

In the above-described ladder type filter, there may be two or more series resonators that are not respectively connected in parallel with first inductors, out of the multiple series resonators. It is possible to further suppress the degradation of attenuation in a wide band.

In the above-described ladder type filter, at least one of the multiple parallel resonators and the multiple series resonators may be divided into multiple resonators and connected in series or parallel with each other. It is possible to improve the power durability, inter modulation distortion, and the like.

In the above-described ladder type filter, each of the multiple parallel resonators and the multiple series resonators may be any of a piezoelectric thin film resonator, a surface acoustic wave resonator, or an elastic boundary wave resonator.

It is possible to provide a small-sized and low-cost filter, by employing the resonator having a high Q-value, small size, and low cost.

In the above-described ladder type filter, each of the first inductors may be any of an inductor of an integrated passive device and a chip inductor. It is possible to provide a filter that realizes high performance and downsizing with the use of the integrated passive device or the chip inductor.

The above-described ladder type filter may further include a mounting portion mounting a chip where the multiple parallel resonators and the multiple series resonators are formed, and the second inductor may be a line pattern formed in the mounting portion.

According to another aspect of the present invention, there is provided a duplexer including two filters connected to a common terminal. At least one of the two filters is a ladder type filter that includes: multiple parallel resonators; multiple series resonators; one or more first inductors respectively connected in parallel with one or more series resonators out of the multiple series resonators; and a second inductor connected in series between ground and ground sides of two or more parallel resonators commonly connected, out of the multiple parallel resonators.

In the above-described duplexer, a filter of a higher frequency side, out of the two filters, has a first attenuation pole of an antiresonance point, which is produced on a lower frequency side of a resonance point of the one or more series resonators due to the one or more first inductors respectively connected in parallel with one or more series resonators, and the first attenuation pole may be substantially matched with a second attenuation pole, which is produced on the lower frequency side of a passband due to the second inductor connected in series between ground and ground sides of two or more parallel resonators commonly connected. It is possible to increase the attenuation in the passband in one filter on the lower frequency side of the passband in the other filter on the higher frequency side.

In the above-described duplexer, the filter of the higher frequency side may be a receive filter.

In the above-described duplexer, a filter of a lower frequency side, out of the two filters, has a first attenuation pole of an antiresonance point, which is shifted to a higher frequency side of a resonance point of the one or more series resonators due to the one or more first inductors respectively connected in parallel with one or more series resonators, and the first attenuation pole may be substantially matched with a second attenuation pole, which is produced on the higher frequency side of a passband due to the second inductor connected in series between ground and ground sides of two or more parallel resonators commonly connected. It is possible to increase the attenuation in the passband in one filter on the higher frequency side of the passband in the other filter on the lower frequency side.

In the above-described duplexer, the filter of the lower frequency side may be a transmit filter.

In the above-described duplexer, a series resonator may be arranged closest to the common terminal in the ladder type filter, and a first inductor is connected in parallel with the series resonator. A matching circuit is no longer needed, thereby reducing the size of the duplexer.

In the above-described duplexer, the two filters are both ladder type filters; and a series resonator is arranged closest to the common terminal in each of the two ladder type filters, and a first inductor is connected in parallel with the series resonator. In two filters, the attenuation can be increased in the stopband with a low loss, the degradation of attenuation can be suppressed, and the filter can be downsized and reduced in costs. In addition, a matching circuit is no longer needed, thereby reducing the size of the duplexer.

The above-described duplexer may further include a matching circuit serving as a high-pass filter arranged between the common terminal and at least one of the two filters. It is possible to increase the attenuation in a wide band of the lower frequency side.

In the above-described duplexer, the matching circuit may be a third inductor connected between the common terminal and ground. The matching circuit can be formed with one inductor, thereby enabling a low loss, downsizing, and low cost.

The above-described duplexer may further include a matching circuit serving as a low-pass filter arranged between the common terminal and at least one of the two filters. It is possible to increase the attenuation of higher harmonic.

In the above-described duplexer, the matching circuit may be any of a C-L circuit, an L-C circuit, and a n-type C-L-C circuit. The matching circuit can be composed of a small number of circuit elements, thereby enabling the low loss, downsizing, and cost reduction.

In the above-described duplexer, the matching circuit may be the π-type C-L-C circuit where a capacitance value of a capacitor arranged on the side of the common terminal is greater than that of another capacitor. The matching can be realized with ease, thereby increasing the attenuation of higher harmonic with a low loss.

In the above-described duplexer, the matching circuit may be composed of any of an integrated passive device and a chip element. It is possible to provide a duplexer of high performance and low cost by using an integrated passive device and a chip element.

In the above-described duplexer, a transmit filter, which is one of the two filters, may be the ladder type filter, and a receive filter, which is the other of the two filters, may include a double-mode filter. In the receive filter, the attenuation can be ensured sufficiently in a wide band.

In the above-described duplexer, the double-mode filter may be either an unbalanced double-mode filter or a balanced double-mode filter.

The above-described duplexer may further include a resonator connected in series between the common terminal and the double-mode filter and a fourth inductor connected in parallel with the resonator.

The above-described duplexer may further include a third inductor connected between the common terminal and ground, wherein $0.3<C1/C2<1$ is satisfied, where the ladder type filter is represented by an equivalent circuit of the ladder type filter, $C1$ denotes a capacitance value of the series resonator arranged closest to the antenna terminal, and $C2$ denotes an average value of capacitance values of other series resonators in the ladder type filter. The impedance, viewed from the common terminal, can be matched with ease.

According to another aspect of the present invention, there is provided a duplexer including: a transmit filter and a receive filter connected to a common terminal, and at least one of the transmit filter and the receive filter is a ladder type filter having a series resonator and a parallel resonator; an inductor connected between the parallel resonators and ground in the ladder type filer; a mounting portion mounting a chip where the series resonator and the parallel resonator of the ladder type filter are formed; a receive line provided in the mounting portion to connect the receive filter and a receiving terminal; a transmit line provided in the mounting portion to connect the transmit filter and a transmitting terminal; a common line provided in the mounting portion to connect the common terminal and the receive filter and the transmit filter;

and an inductor line provided in the mounting portion to compose the inductor. The inductor line is provided between either the receive line of the transmit line and the common line. The electrostatic coupling and the bridging capacitance between the receive line of the transmit line can be reduced, thereby increasing the attenuation in the stopband.

In the above-described duplexer, the inductor line may be provided between the receive line and the transmit line. The electrostatic coupling and the bridging capacitance between the transmit line and the receive line can be reduced, and the attenuation can be increased in the opposite bandwidth of the corresponding filter.

In the above-described duplexer, the mounting portion may include multiple layers; and the inductor line may be provided in the multiple layers. The electrostatic coupling and the bridging capacitance between the transmit line and the receive line can be reduced.

In the above-described duplexer, the inductor line may be provided in the mounting portion and connected to multiple ground pads to connect ground.

In the above-described duplexer, multiple series resonators may be provided; and one or more inductors may be connected in parallel with one or more series resonators, out of the multiple series resonators.

The present invention is not limited to the above-mentioned exemplary embodiments, and other embodiments, variations and modifications may be made without departing from the scope of the present invention.

The present invention is based on Japanese Patent Application No. 2005-229165 filed on Aug. 8, 2005 and Japanese Patent Application No. 2006-130662 filed on May 9, 2006, the entire disclosure of which is hereby incorporated by reference.

What is claimed is:

1. A duplexer comprising:
an antenna terminal;
a first filter connected to the antenna terminal; and
a second filter connected to the antenna terminal,
wherein at least one of the first filter and the second filter is a ladder type filter in which multiple parallel resonators and multiple series resonators are included, one or more first inductors are respectively connected in parallel with one or more series resonators out of the multiple series resonators, one or more first inductors are not connected in parallel with the other of the multiple series resonators, and one of the one or more first inductors is connected in parallel with one of the multiple series resonators that is arranged closest to the antenna terminal,
wherein $0.3 < C1/C2 < 1$ is satisfied, where the ladder type filter is represented by an equivalent circuit of the ladder type filter, C1 denotes a capacitance value of the series resonator arranged closest to the antenna terminal, and C2 denotes an average value of capacitance values of other series resonators in the ladder type filter.

2. The duplexer as claimed in claim 1, wherein a second inductor is connected in series with the multiple parallel resonators and ground in the ladder type filter.

3. The duplexer as claimed in claim 2, wherein the second inductor connected in series between multiple parallel resonators and ground is also connected to the multiple parallel resonators.

4. The duplexer as claimed in claim 1, wherein the first filter and the second filter are both ladder type filters.

5. The duplexer as claimed in claim 1, wherein the series resonators and the parallel resonators are any one of a piezoelectric thin film resonator and a surface acoustic wave resonator.

6. A duplexer comprising:
an antenna terminal;
a first filter connected to the antenna terminal; and
a second filter connected to the antenna terminal,
wherein at least one of the first filter and the second filter is a ladder type filter in which multiple parallel resonators and multiple series resonators are included, one or more first inductors are respectively connected in parallel with one or more series resonators out of the multiple series resonators, one or more first inductors are not connected in parallel with the other of the multiple series resonators, and one of the one or more first inductors is connected in parallel with one of the multiple series resonators that is arranged closest to the antenna terminal,
wherein one of the one or more first inductors is arranged closest to the antenna terminal and connected in parallel with one of the series resonators, and at least another one of the one or more first inductors is connected in parallel with another one of the multiple series resonators.

7. A ladder type filter comprising:
multiple parallel resonators;
multiple series resonators;
one or more first inductors respectively connected in parallel with one or more series resonators out of the multiple series resonators;
one or more first inductors are not connected in parallel with the other of the multiple series resonators; and
a second inductor connected in series between ground and ground sides of two or more parallel resonators commonly connected, out of the multiple parallel resonators,
wherein a first attenuation pole of an antiresonance point is produced on a lower frequency side of a resonance point of the one or more series resonators due to the one or more first inductors respectively connected in parallel with one or more series resonators, and the first attenuation pole is substantially matched with a second attenuation pole, which is produced on the lower frequency side of a passband due to the second inductor connected in series between ground and ground sides of two or more parallel resonators commonly connected.

8. The ladder type filter as claimed in claim 7, wherein the multiple parallel resonators are the two or more parallel resonators.

9. The ladder type filter as claimed in claim 7, wherein there are two or more series resonators that are not respectively connected in parallel with first inductors, out of the multiple series resonators.

10. The ladder type filter as claimed in claim 7, wherein at least one of the multiple parallel resonators and the multiple series resonators is divided into multiple resonators and connected in series or parallel with each other.

11. The ladder type filter as claimed in claim 7, wherein each of the multiple parallel resonators and the multiple series resonators is any of a piezoelectric thin film resonator, a surface acoustic wave resonator, or an elastic boundary wave resonator.

12. The ladder type filter as claimed in claim 7, wherein each of the first inductors is any of an inductor of an integrated passive device and a chip inductor.

13. The ladder type filter as claimed in claim 7, further comprising a mounting portion mounting a chip where the multiple parallel resonators and the multiple series resonators are formed,
wherein the second inductor is a line pattern formed in the mounting portion.

14. A ladder type filter comprising:
multiple parallel resonators;

multiple series resonators;
one or more first inductors respectively connected in parallel with one or more series resonators out of the multiple series resonators;
one or more first inductors are not connected in parallel with the other of the multiple series resonators; and
a second inductor connected in series between ground and ground sides of two or more parallel resonators commonly connected, out of the multiple parallel resonators,
wherein a first attenuation pole of an antiresonance point is shifted to a higher frequency side of a resonance point of the one or more series resonators due to the one or more first inductors respectively connected in parallel with one or more series resonators, and the first attenuation pole is substantially matched with a second attenuation pole, which is produced on the higher frequency side of a passband due to the second inductor connected in series between ground and ground sides of two or more parallel resonators commonly connected.

15. A duplexer comprising two filters connected to a common terminal,
wherein at least one of the two filters is a ladder type filter that includes:
multiple parallel resonators;
multiple series resonators;
one or more first inductors respectively connected in parallel with one or more series resonators out of the multiple series resonators;
one or more first inductors are not connected in parallel with the other of the multiple series resonators; and
a second inductor connected in series between ground and ground sides of two or more parallel resonators commonly connected, out of the multiple parallel resonators,
wherein a filter of a higher frequency side, out of the two filters, has a first attenuation pole of an antiresonance point, which is produced on a lower frequency side of a resonance point of the one or more series resonators due to the one or more first inductors respectively connected in parallel with one or more series resonators, and the first attenuation pole is substantially matched with a second attenuation pole, which is produced on the lower frequency side of a passband due to the second inductor connected in series between ground and ground sides of two or more parallel resonators commonly connected.

16. The duplexer as claimed in claim 15, wherein the filter of the higher frequency side is a receive filter.

17. The duplexer as claimed in claim 15, wherein a series resonator is arranged closest to the common terminal in the ladder type filter, and a first inductor is connected in parallel with the series resonator.

18. The duplexer as claimed in claim 15, further comprising a matching circuit serving as a high-pass filter arranged between the common terminal and at least one of the two filters.

19. The duplexer as claimed in claim 18, wherein the matching circuit is a third inductor connected between the common terminal and ground.

20. The duplexer as claimed in claim 18, wherein the matching circuit is composed of any of an integrated passive device and a chip element.

21. The duplexer as claimed in claim 15, further comprising a matching circuit serving as a low-pass filter arranged between the common terminal and at least one of the two filters.

22. The duplexer as claimed in claim 21, wherein the matching circuit is any of a C-L circuit, an L-C circuit, and a TT-type C-L-C circuit.

23. A duplexer comprising two filters connected to a common terminal,
wherein at least one of the two filters is a ladder type filter that includes:
multiple parallel resonators;
multiple series resonators;
one or more first inductors respectively connected in parallel with one or more series resonators out of the multiple series resonators;
one or more first inductors are not connected in parallel with the other of the multiple series resonators; and
a second inductor connected in series between ground and ground sides of two or more parallel resonators commonly connected, out of the multiple parallel resonators,
wherein a filter of a lower frequency side, out of the two filters, has a first attenuation pole of an antiresonance point, which is shifted to a higher frequency side of a resonance point of the one or more series resonators due to the one or more first inductors respectively connected in parallel with one or more series resonators, and the first attenuation pole is substantially matched with a second attenuation pole, which is produced on the higher frequency side of a passband due to the second inductor connected in series between ground and ground sides of two or more parallel resonators commonly connected.

24. The duplexer as claimed in claim 23, wherein the filter of the lower frequency side is a transmit filter.

25. A duplexer comprising two filters connected to a common terminal,
wherein at least one of the two filters is a ladder type filter that includes:
multiple parallel resonators;
multiple series resonators;
one or more first inductors respectively connected in parallel with one or more series resonators out of the multiple series resonators;
one or more first inductors are not connected in parallel with the other of the multiple series resonators; and
a second inductor connected in series between ground and ground sides of two or more parallel resonators commonly connected, out of the multiple parallel resonators,
wherein:
the two filters are both ladder type filters; and
a series resonator is arranged closest to the common terminal in each of the two ladder type filters, and a first inductor is connected in parallel with the series resonator.

26. A duplexer comprising two filters connected to a common terminal,
wherein at least one of the two filters is a ladder type filter that includes:
multiple parallel resonators;
multiple series resonators;
one or more first inductors respectively connected in parallel with one or more series resonators out of the multiple series resonators;
one or more first inductors are not connected in parallel with the other of the multiple series resonators;
a second inductor connected in series between ground and ground sides of two or more parallel resonators commonly connected, out of the multiple parallel resonators; and
a matching circuit serving as a low-pass filter arranged between the common terminal and at least one of the two filters, wherein the matching circuit is the π-type C-L-C circuit where a capacitance value of a capacitor arranged on the side of the common terminal is greater than that of another capacitor.

27. A duplexer comprising two filters connected to a common terminal,
wherein at least one of the two filters is a ladder type filter that includes:
multiple parallel resonators;
multiple series resonators;
one or more first inductors respectively connected in parallel with one or more series resonators out of the multiple series resonators;
one or more first inductors are not connected in parallel with the other of the multiple series resonators; and
a second inductor connected in series between ground and ground sides of two or more parallel resonators commonly connected, out of the multiple parallel resonators,
wherein a transmit filter, which is one of the two filters, is the ladder type filter, and a receive filter, which is the other of the two filters, includes a double-mode filter.

28. The duplexer as claimed in claim 27, wherein the double-mode filter is either an unbalanced double-mode filter or a balanced double-mode filter.

29. The duplexer as claimed in claim 27, further comprising a resonator connected in series between the common terminal and the double-mode filter and a fourth inductor connected in parallel with the resonator.

30. A duplexer comprising two filters connected to a common terminal,
wherein at least one of the two filters is a ladder type filter that includes:
multiple parallel resonators;
multiple series resonators;
one or more first inductors respectively connected in parallel with one or more series resonators out of the multiple series resonators;
one or more first inductors are not connected in parallel with the other of the multiple series resonators;
a second inductor connected in series between ground and ground sides of two or more parallel resonators commonly connected, out of the multiple parallel resonators; and
a third inductor connected between the common terminal and ground,
wherein a series resonator is arranged closest to the common terminal in the ladder type filter, and a first inductor is connected in parallel with the series resonator,
wherein $0.3 < C1/C2 < 1$ is satisfied, where the ladder type filter is represented by an equivalent circuit of the ladder type filter, C1 denotes a capacitance value of the series resonator arranged closest to the antenna terminal, and C2 denotes an average value of capacitance values of other series resonators in the ladder type filter.

31. A duplexer comprising:
a transmit filter and a receive filter connected to a common terminal, and at least one of the transmit filter and the receive filter is a ladder type filter having a series resonator and a parallel resonator;
an inductor connected between the parallel resonator and ground in the ladder type filter;
a mounting portion mounting a chip where the series resonator and the parallel resonator of the ladder type filter are formed;
a receive line provided in the mounting portion to connect the receive filter and a receiving terminal;
a transmit line provided in the mounting portion to connect the transmit filter and a transmitting terminal;
a common line provided in the mounting portion to connect the common terminal and the receive filter and the transmit filter; and
an inductor line provided in the mounting portion to compose the inductor,
wherein the inductor line is provided between either the receive line or the transmit line and the common line; and
the inductor line is provided between the receive line and the transmit line.

32. The duplexer as claimed in claim 31, wherein:
the mounting portion includes multiple layers; and
the inductor line is provided in the multiple layers.

33. The duplexer as claimed in claim 31, wherein the inductor line is provided in the mounting portion and connected to multiple ground pads to connect ground.

34. The duplexer as claimed in claim 31, wherein:
multiple series resonators are provided; and
one or more inductors are connected in parallel with one or more series resonators, out of the multiple series resonators.

* * * * *